(12) United States Patent
Hill et al.

(10) Patent No.: US 6,313,918 B1
(45) Date of Patent: *Nov. 6, 2001

(54) SINGLE-PASS AND MULTI-PASS INTERFEROMETERY SYSTEMS HAVING A DYNAMIC BEAM-STEERING ASSEMBLY FOR MEASURING DISTANCE, ANGLE, AND DISPERSION

(75) Inventors: Henry A. Hill, Tucson, AZ (US); Peter de Groot, Middletown, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/305,876

(22) Filed: May 5, 1999

Related U.S. Application Data

(63) Continuation-in-part of application No. 09/157,131, filed on Sep. 18, 1998.

(51) Int. Cl.[7] .......................................... G01B 9/02
(52) U.S. Cl. ..................... 356/498; 356/487; 356/493
(58) Field of Search ..................... 356/349, 351, 356/358, 363, 4.09, 4.1, 361, 486, 487, 493, 498, 500, 517

(56) References Cited

U.S. PATENT DOCUMENTS

| | | |
|---|---|---|
| 4,711,573 | 12/1987 | Wijntjes et al. . |
| 4,714,339 * | 12/1987 | Lau et al. ........................... 356/358 |
| 4,790,651 | 12/1988 | Brown et al. . |
| 5,408,318 | 4/1995 | Slater . |
| 5,757,160 | 5/1998 | Kreuzer . |
| 5,781,277 | 7/1998 | Iwamoto . |

OTHER PUBLICATIONS

Bennett, S.J., "A Double-passed Michelson Interferometer," *Optics Communications*, 4:428–430, Feb./Mar. 1972.

* cited by examiner

*Primary Examiner*—Samuel A. Turner
(74) *Attorney, Agent, or Firm*—Fish & Richardson P.C.

(57) ABSTRACT

The invention features an interferometry system which includes at least one dynamic beam steering assembly for redirecting one or more beams within the interferometry system in response to changes in the angular orientation or position of the measurement object. A control circuit controls the beam steering assembly based on a signal derived from one or more beams within the interferometry system. The dynamic beam steering assembly can be incorporated into interferometry systems that measure displacement, angle, and/or dispersion. The interferometry systems can be advantageously incorporated into lithography systems used to fabricate integrated circuits and other semiconducting devices and beam writing systems used to fabricate lithography masks.

94 Claims, 41 Drawing Sheets

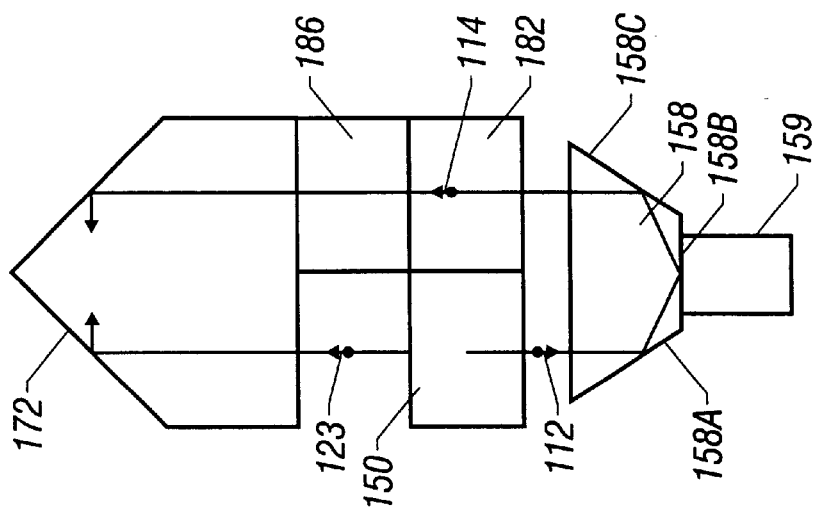
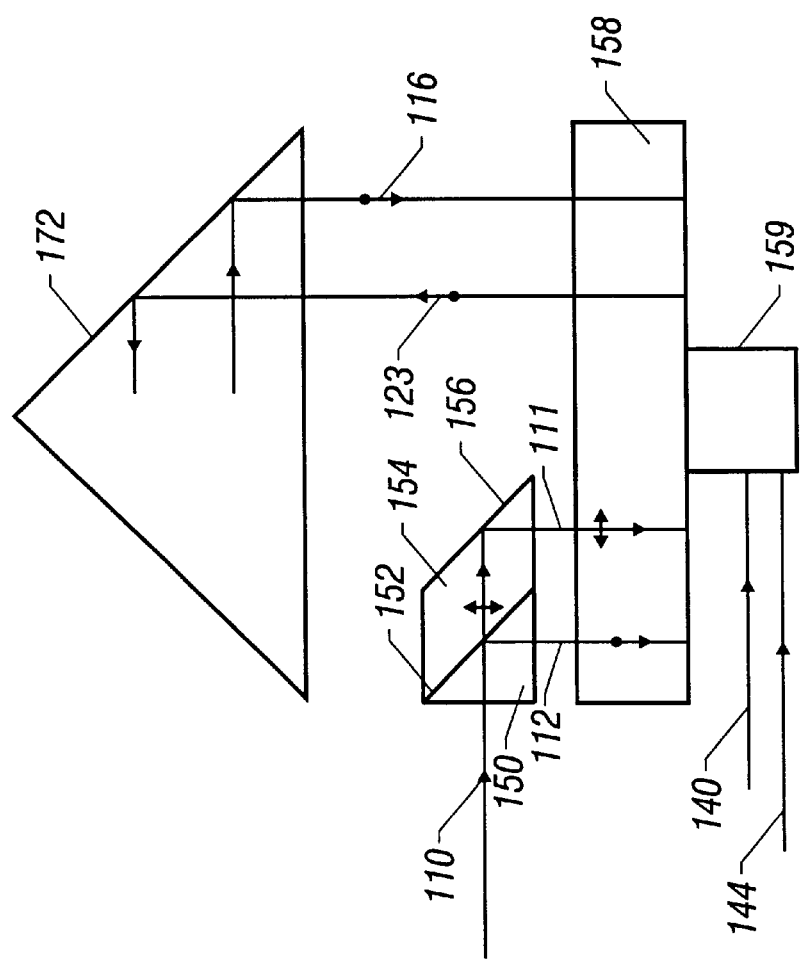

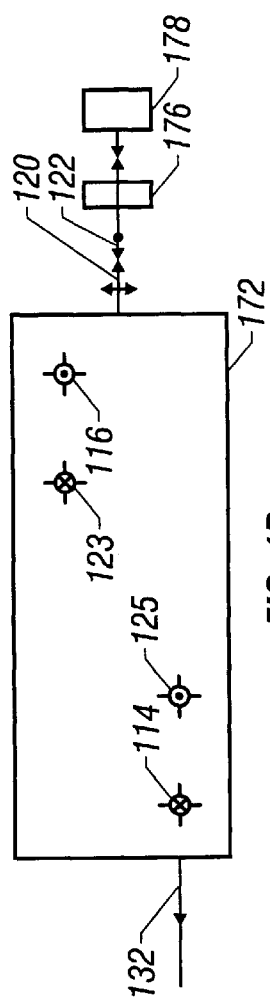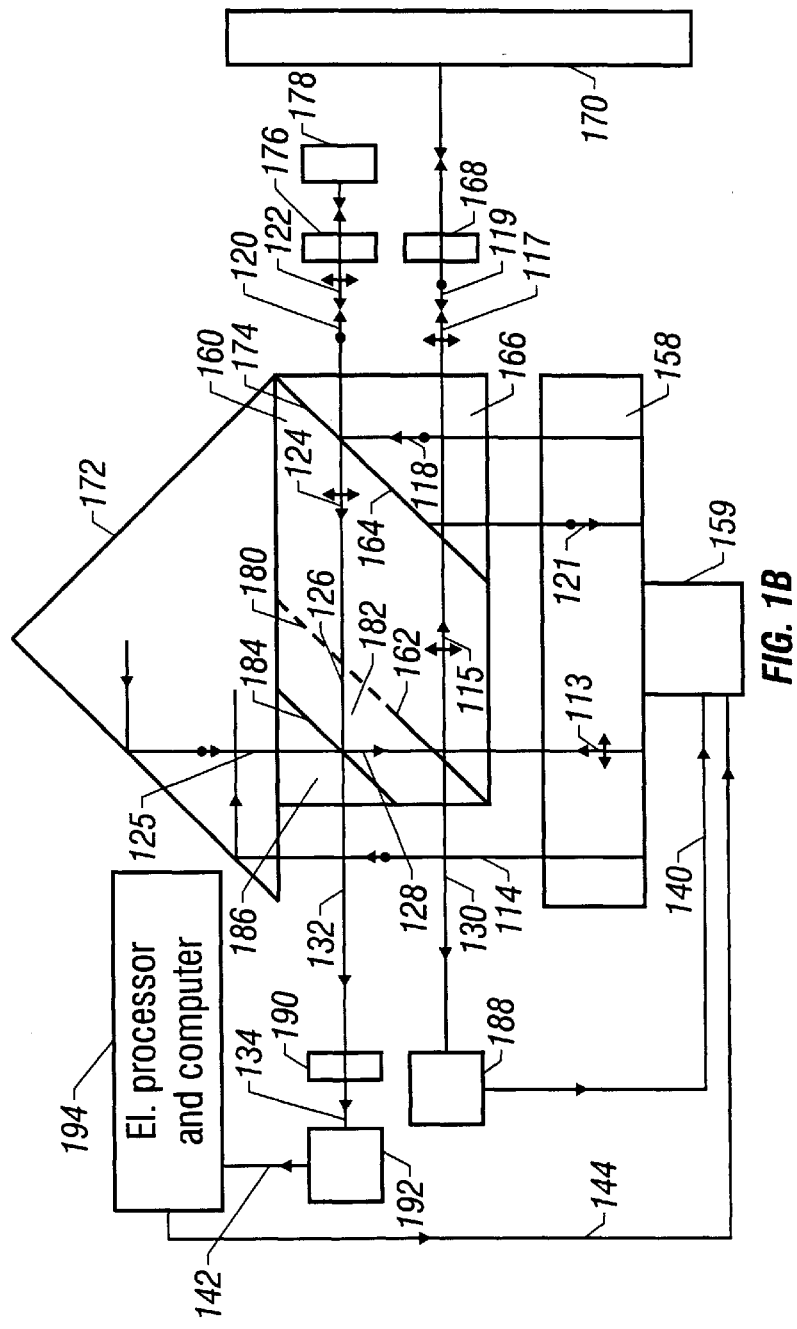

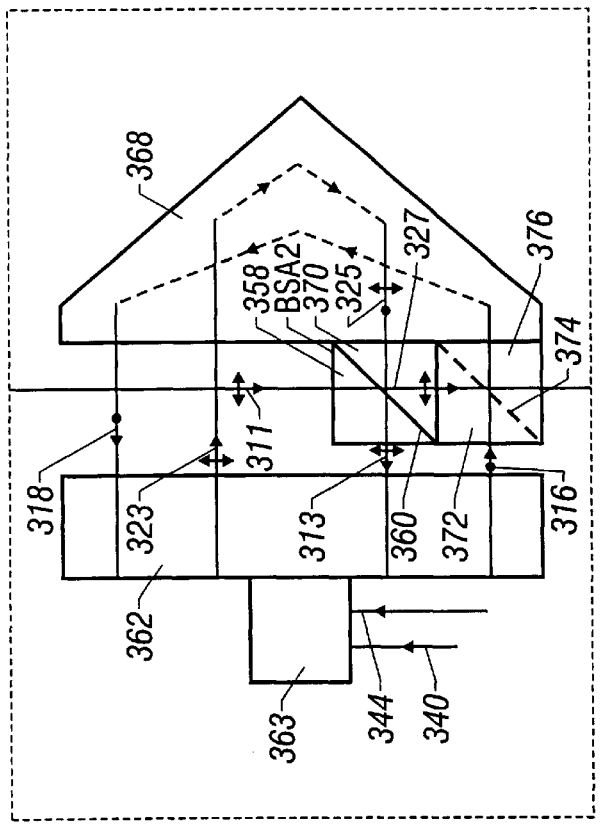
FIG. 3B
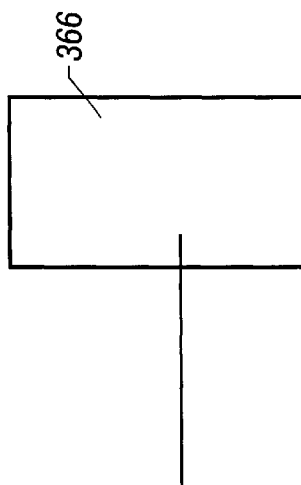
FIG. 3C
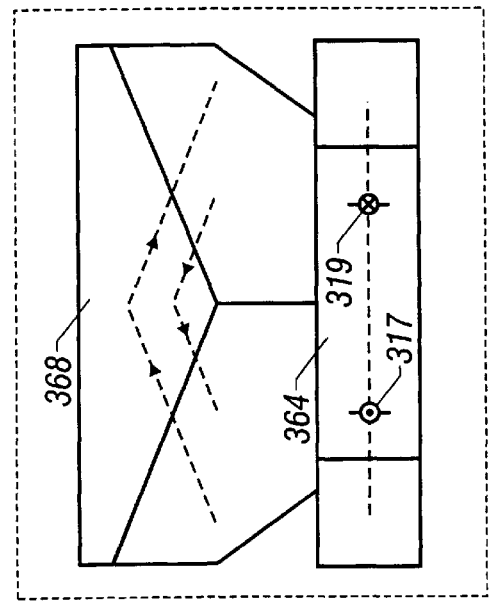
FIG. 3F
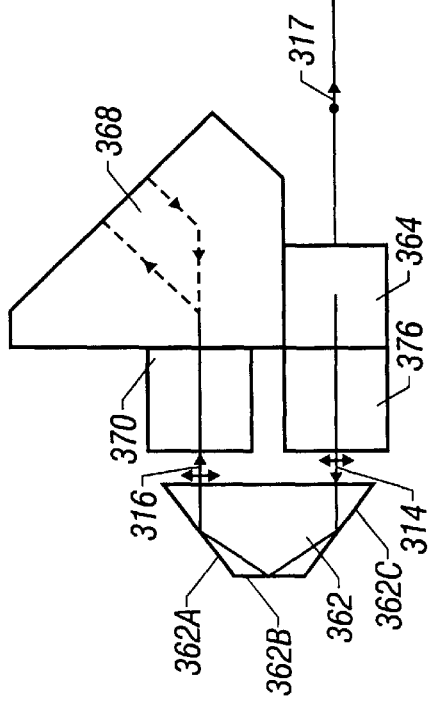

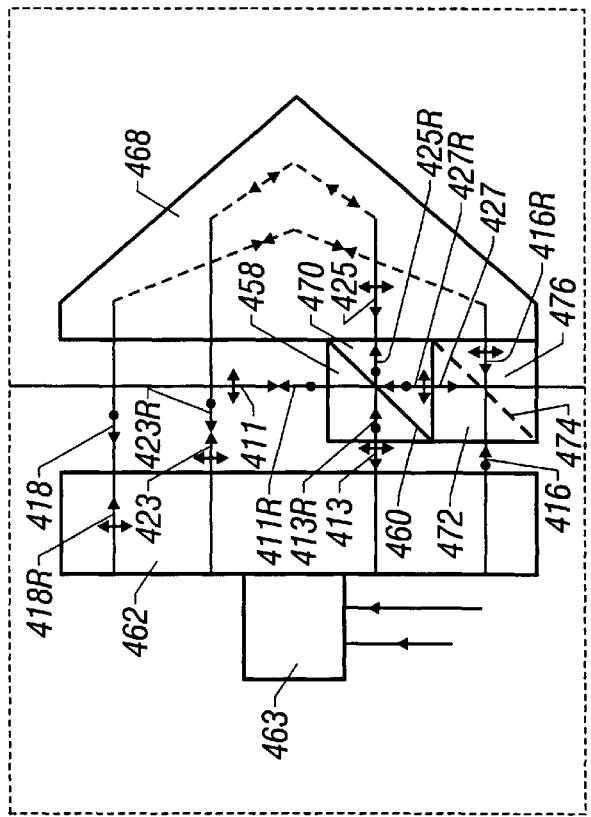
FIG. 4B
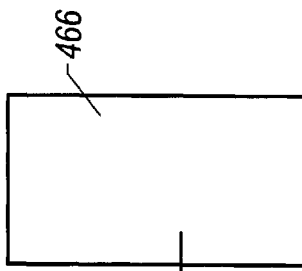
FIG. 4C
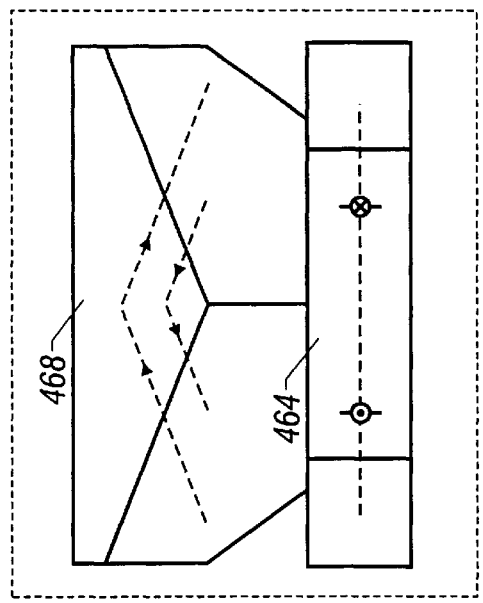
FIG. 4F
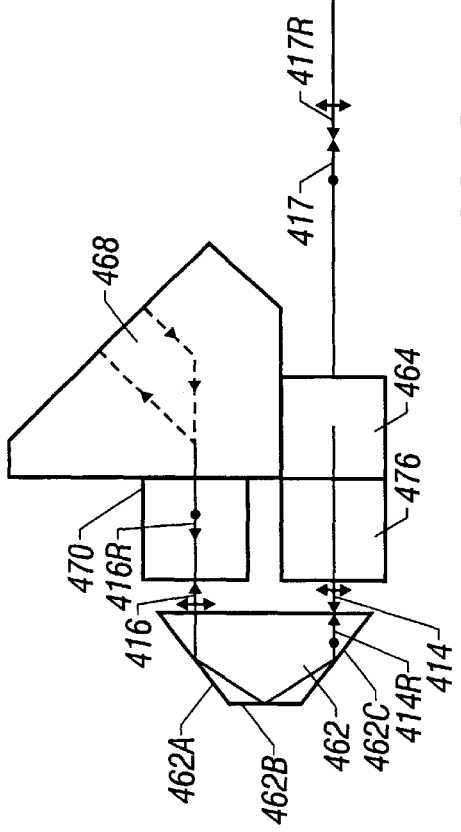

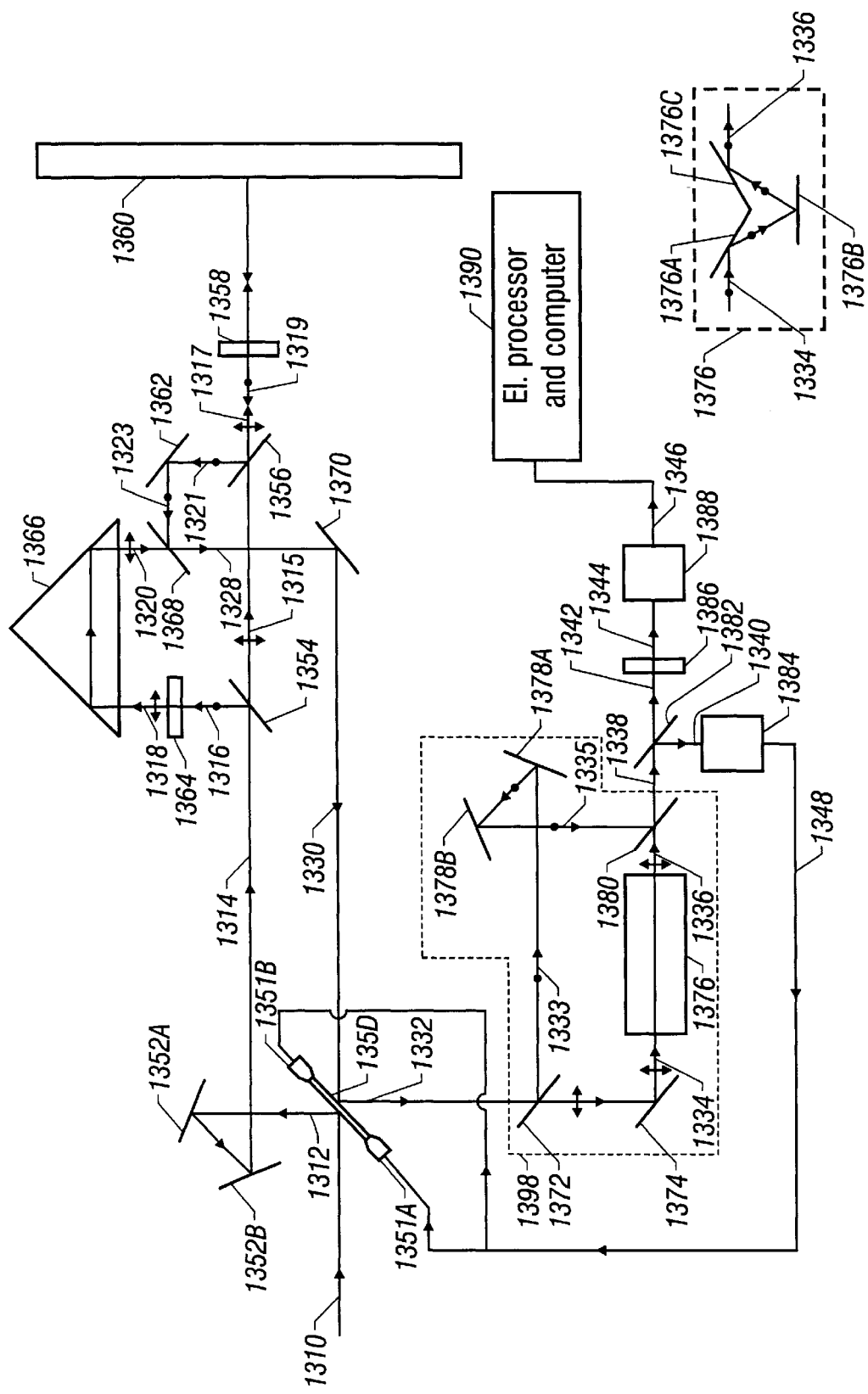

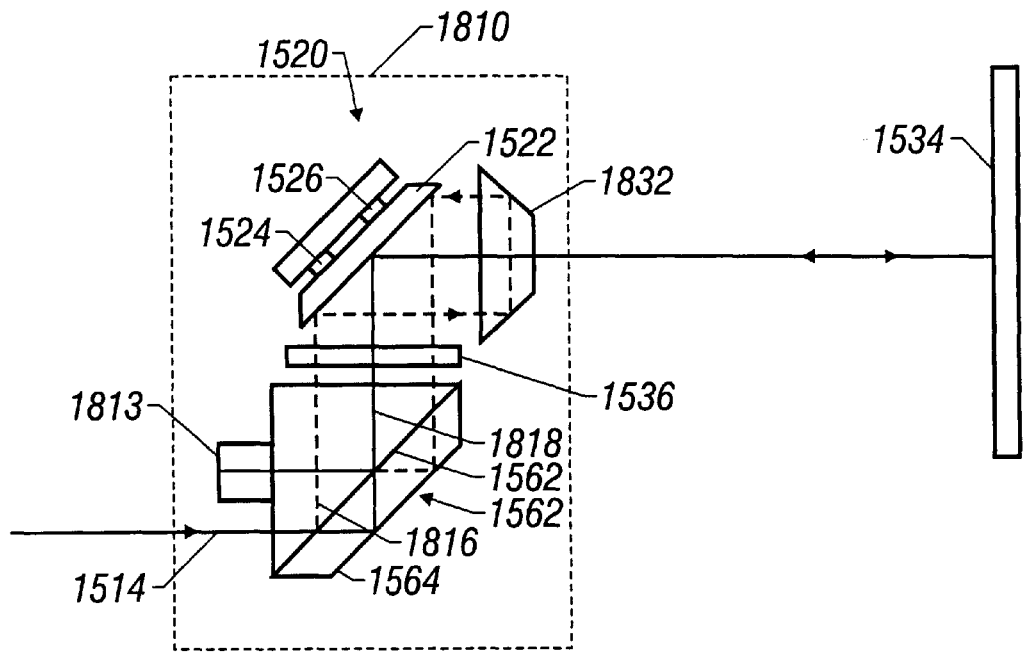
FIG. 18A
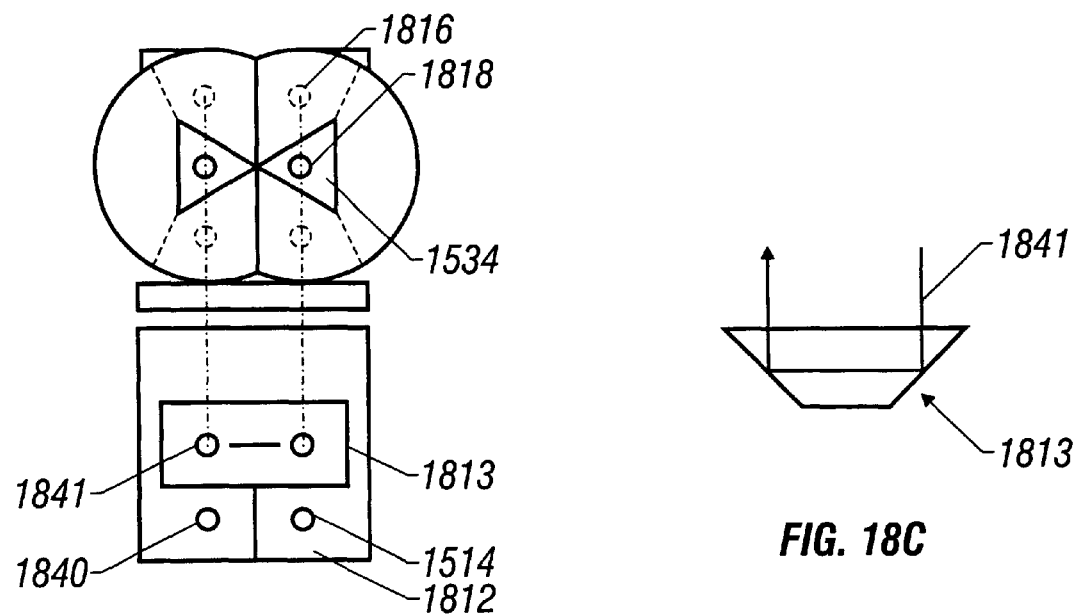
FIG. 18B
FIG. 18C

SINGLE-PASS AND MULTI-PASS INTERFEROMETERY SYSTEMS HAVING A DYNAMIC BEAM-STEERING ASSEMBLY FOR MEASURING DISTANCE, ANGLE, AND DISPERSION

This application is a continuation-in-part application of, and claims priority from, U.S. patent application Ser. No. 09/157,131 filed on Sep. 18, 1998, the contents of which are incorporated herein by reference.

BACKGROUND OF THE INVENTION

This invention relates to interferometers, e.g., displacement, angle, and dispersion measuring interferometers for measuring the position of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and frequencies separated by a heterodyne, split-frequency. The split-frequency can be produced, e.g., by Zeeman splitting, by acousto-optical modulation, or by positioning a birefringent element internal to the laser. A polarizing beam splitter directs the measurement beam along a measurement path contacting a reflective measurement object (e.g., a stage mirror), directs the references beam along a reference path, and thereafter recombines the beams to form overlapping exit measurement and reference beams. The overlapping exit beams form an output beam that passes through a polarizer that mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal at the split frequency. When the measurement object is moving, e.g., by translating a reflective stage, the heterodyne signal is at a frequency equal to the split frequency plus a Doppler shift. The Doppler shift equals $2vp/\lambda$, where v is the relative velocity of the measurement and reference objects, $\lambda$ is the wavelength of the measurement and reference beams, and p is the number of passes to the reference and measurement objects. Changes in the optical path length to the measurement object correspond to changes in the phase of the measured interference signal, with a $2\pi$ phase change substantially equal to an optical path length change nL of $\lambda/p$, where n is the average refractive index of the medium through which the light beams travel, e.g., air or vacuum, and where L is a round-trip distance change, e.g., the change in distance to and from a stage that includes the measurement object. Similarly, multiple interferometers can be used to measure changes in distance to multiple points on the measurement object, from which changes in the angular orientation of the measurement object can be determined.

For high performance applications such as IC manufacturing the quantity of interest is the geometrical length L and not the optical path length nL, which is what is measured by the displacement measuring interferometer. In particular, changes in nL can be caused by changes in the refractive index n rather than by geometric changes in the relative position of the measurement object. Techniques based on dispersion interferometry have been used to compensate displacement measurements for air turbulence. In particular, interferometric displacement measurements are made at multiple optical wavelengths to determine the dispersion of the gas in the measurement path. The dispersion measurement can be used to convert an optical path length measured by a distance measuring interferometer into a geometric length.

Such distance, angle, and dispersion interferometers are crucial components of scanner systems and stepper systems used in lithography to produce integrated circuits on semiconductor wafers. The lithography systems typically include: at least one movable stage to support, orient, and fix the wafer; focusing optics used to direct a radiation beam onto the wafer; a scanner or stepper system for translating the stage relative to the exposure beam; and one or more interferometers to accurately measure changes in the position of the stage relative to the radiation beam. The interferometers enable the lithography system to precisely control which regions of the wafer are exposed to the radiation beam.

SUMMARY OF THE INVENTION

The invention features an interferometry system which includes at least one dynamic beam steering assembly for redirecting one or more beams within the interferometry system in response to changes in the angular orientation or position of the measurement object. The dynamic beam steering assembly can be incorporated into interferometry systems that measure distances, angle, and/or dispersion. The dynamic beam steering assembly improves the performance of the interferometry system by minimizing negative consequences of changes in the angular orientation or position of the measurement object.

In general, in one aspect, the invention features an interferometry system including: an interferometer which during operation directs a measurement beam along a measurement path contacting a measurement object and combines at least a portion of the measurement beam with another beam to form an overlapping pair of exit beams, the interferometer including a beam steering assembly having a beam steering element and a positioning system to orient the beam steering element, the beam steering element positioned to direct the measurement beam, the measurement beam contacting the beam steering element; and a control circuit which during operation causes the positioning system to reorient the beam steering element in response to a change in at least one of angular orientation and position of the measurement object. The interferometer can direct the measurement beam to contact the measurement object a single time (single-pass), two times (double pass), or an even or odd numbers of times.

During operation the control circuit can cause the positioning system to reorient the beam steering element in response to a change in angular orientation of the measurement object. In one such embodiment, the interferometry system can further include a signal processor. During operation the interferometer directs a second measurement beam along a second measurement path contacting the measurement object and combines at least a portion of the second measurement beam with an additional beam to form a second overlapping pair of exit beams. The measurement beams contact the measurement object at separate locations, and during operation the signal processor determines the change in angular orientation of the measurement object based on signals derived from the overlapping pairs of exit beams. In the latter embodiment, the beam steering element can be positioned to direct both of the measurement beams, both of the measurement beams contacting the beam steering element.

In general, in another aspect, the invention features an interferometry system including: an interferometer which during operation receives an input beam, splits the input beam into a measurement beam and at least one other beam, directs the measurement beam along a measurement path contacting a measurement object, and combines at least a portion of the measurement beam with the other beam to form an overlapping pair of exit beams; a beam steering assembly having a beam steering element and a positioning system to orient the beam steering element, the beam steering element positioned to direct the input beam and the overlapping pair of exit beams, the input beam and the overlapping pair of exit beams contacting the beam steering element; a control circuit which during operation causes the positioning system to reorient the beam steering element in response to a change in at least one of angular orientation and position of the measurement object. The interferometer can direct the measurement beam to contact the measurement object a single time (single-pass), two times (double pass), or an even or odd numbers of times.

During operation the control circuit can cause the positioning system to reorient the beam steering element in response to a change in angular orientation of the measurement object. In one such embodiment, the interferometry system can further include a signal processor. During operation the interferometer directs a second measurement beam along a second measurement path contacting the measurement object and combines at least a portion of the second measurement beam with an additional beam to form a second overlapping pair of exit beams. The measurement beams contact the measurement object at separate locations, and during operation the signal processor determines the change in angular orientation of the measurement object based on signals derived from the overlapping pairs of exit beams. In the latter embodiment, the beam steering element can be positioned to direct the input beam and both of the overlapping pairs of exit beams, all of which contact the beam steering element.

In either of the interferometry systems described above, the system can further include a signal processor and the measurement beam can include components at two wavelengths. In one such embodiment, the interferometer produces the first mentioned overlapping pair of exit beams and a second overlapping pair of exit beams. The first pair of exit beams is indicative of changes in optical path length to the measurement object at a first of the two wavelengths, and the second pair of exit beams is indicative of changes in optical path length to the measurement object at a second of the two wavelengths. During operation the signal processor processes signals derived from the overlapping pairs of exit beams. For example, the signal processor can calculate dispersion along the measurement path based on the signals, and/or the signal processor can calculate changes in geometric distance to the measurement object based on the signals. The two wavelengths are sufficiently separated to permit such calculations, e.g., they are harmonically related or are separated by at least one 1 nm.

In another such embodiment, the interferometry system further includes the signal processor, and the measurement beam, the other beam, and the overlapping pair of exit beams each include components at the two wavelengths. The overlapping pair of exit beams is indicative of changes in optical path length to the measurement object at each of the two wavelengths, and during operation the signal processor processes signals derived from the overlapping pair of exit beams. For example, the signal processor can calculate dispersion along the measurement path based on the signals, and/or the signal processor can calculate changes in geometric distance to the measurement object based on the signals. Again, the two wavelengths are sufficiently separated to permit such calculations, e.g., they are harmonically related or are separated by at least one 1 nm.

In general, in another aspect, the invention features an interferometry method including: directing a measurement beam along a measurement path contacting a measurement object; combining at least a portion of the measurement beam with another beam to form an overlapping pair of exit beams; and using an electronic control system to redirect the measurement beam in response to a change in at least one of the angular orientation and position of the measurement object. The measurement path can contact the measurement object one time, two times, or more generally, an even or odd number of times. The method can further include: directing a second measurement beam along a second measurement path contacting the measurement object; combining at least a portion of the second measurement beam with an additional beam to form a second overlapping pair of exit beams, the first and second pairs of exit beams indicative of changes in optical path length to two separate locations on the measurement object; and calculating the change in angular orientation of the measurement object based on signals derived from the overlapping pairs of exit beams.

In general, in another aspect, the invention features an interferometry method including: directing a measurement beam having components at two wavelengths along a measurement path contacting a measurement object; calculating changes in geometric distance to the measurement object based on interferometric signals derived from the measurement beam; and using an electronic control system to redirect the measurement beam in response to a change in at least one of the angular orientation and position of the measurement object. Alternatively, in another aspect, the invention features an interferometry method including: directing a measurement beam having components at two wavelengths along a measurement path contacting a measurement object; calculating dispersion along the measurement path based on interferometric signals derived from the measurement beam; and using an electronic control system to redirect the measurement beam in response to a change in at least one of the angular orientation and position of the measurement object. The electronic control system in either of these aspects can redirect the measurement beam in response to a change in the angular orientation of the measurement object, and in particular, can redirect the measurement beam to contact the measurement object at substantially normal incidence over a range of angular orientations of the measurement object. Also, in either of these aspects, the two wavelengths are sufficiently separated to permit the geometric length or dispersion calculation, e.g., they are harmonically related or are separated by at least one 1 nm.

The invention also features a lithography system for fabricating integrated circuits including first and second components, which are movable relative to one another. One of interferometry systems described above is secured to the second component and the measurement object is a mirror rigidly secured to the first component. During operation the interferometry system measures the position of the first component relative to the second component. In some embodiments, the second component is a movable stage used to support a wafer and during operation the beam steering element causes the measurement beam to contact the mirror at substantially normal incidence over a range of angular orientations of the measurement object.

The interferometry systems and methods described above can further include one or more features of any of the following additional aspects of the invention.

In general, in another aspect, the invention features an interferometry system for measuring changes in distance to a measurement object. The system includes an interferometer which during operation directs a reference beam along a reference path and a measurement beam along a measurement path contacting the measurement object and combines the reference and measurement beams to produce overlapping exit reference and measurement beams. The overlapping exit reference and measurement beams are indicative of changes in a relative optical path length between the reference and measurement paths. The interferometer includes a beam steering assembly having a beam steering element and a positioning system to orient the beam steering element. The beam steering element is positioned to direct at least one of the reference and measurement beams and the at least one of the reference and measurement beams contact the beam steering element. The system also includes a control circuit which during operation causes the positioning system to reorient the beam steering element in response to changes in at least one of angular orientation and position of the measurement object.

The system can include any of the following features.

The interferometer can separate an input beam into a pair of spatially separated beams to define the reference and measurement beams. Alternatively, during operation the interferometer receives a pair of spatially separated input beams to define the reference and measurement beams.

The interferometer can be a single-pass interferometer in which the measurement beam contacts the measurement object only a single time. Also, in some embodiments, the interferometer can include the measurement object, and in other embodiments, the measurement object can be separate from the interferometer. During operation the control circuit can cause the positioning system to reorient the beam steering element based on a signal generated from the exit measurement beam.

Also, during operation, the control circuit can cause the positioning system to reorient the beam steering element to do any of the following: 1) maintain the exit reference and measurement beams substantially parallel to one another over a range of angular orientations of the measurement object; 2) reduce changes in direction of the exit measurement beam caused by changes in the angular orientation of the measurement object; 3) reduce a transverse displacement between the exit reference and measurement beams caused by changes in the angular orientation of the measurement object or a translation of the measurement object; 4) reduce a transverse displacement of the measurement beam caused by changes in the angular orientation of the measurement object or a translation of the measurement object; and 5) insure that the measurement beam contacts the measurement object at substantially normal incidence over a range of angular orientations of the measurement object.

In embodiments in which the measurement object is a plane mirror and during operation the measurement beam contacts the measurement object at non-normal incidence, the control circuit can cause the positioning system to reorient the beam steering element to reduce transverse displacements between the exit reference and measurement beams caused by by translations of the measurement object.

In some embodiments, the beam steering element can include a polarizing beam splitter that separates the input beam into the reference and measurement beams, and the positioning system can include at least one transducer mounted to the polarizing beam splitter and operative to adjust an orientation of the polarizing beam splitter in response to a control signal from the control circuit. Alternatively, the beam steering element can include a polarizing beam splitter that directs the reference beam along the reference path and the measurement beam along the measurement path, and the positioning system can include at least one transducer mounted to the polarizing beam splitter and operative to adjust an orientation of the polarizing beam splitter in response to a control signal from the control circuit.

In other embodiments, the interferometer can further include a polarizing beam splitter that separates the input beam into the reference and measurement beams, and wherein the beam steering element includes a beam steering mirror and the positioning system includes at least one transducer mounted to the beam steering mirror and operative to adjust an orientation of the beam steering mirror in response to a control signal from the control circuit. Alternatively, the interferometer can further include a polarizing beam splitter that directs the reference beam along the reference path and the measurement beam along the measurement path, and wherein the beam steering element includes a beam steering mirror and the positioning system includes at least one transducer mounted to the beam steering mirror and operative to adjust an orientation of the beam steering mirror in response to a control signal from the control circuit.

The system can further include a polarizer which during operation receives the exit reference and measurement beams and mixes polarizations of the exit reference and measurement beams to produce a mixed beam having a phase indicative of the changes in the optical path length difference between the reference and measurement paths. The control circuit can include a detector having spatially resolved detector elements operative to measure directions and/or positions of the exit reference and measurement beams and generate a measurement signal indicative of the directions and/or positions. The control circuit can further include a controller operative to receive the measurement signal from the detector and send a control signal based on the measurement signal to the positioning system, the control signal causing the positioning system to reorient the beam steering element.

In addition to a polarizing beam splitter, beam steering mirror, and transducers mounted to the beam steering mirror, the interferometer can further include a measurement retroreflector, a reference retroreflector, and a reflective reference object. During operation, the polarizing beam splitter directs the reference beam to the reference object and the measurement beam to the measurement retroreflector, receives the reference beam from the reference object and the measurement beam from the measurement retroreflector, and then directs the reference and measurement beams to the beam steering mirror. The beam steering mirror directs the reference beam to the reference retroreflector and the measurement beam to the measurement object, receives the reference beam from the reference retroreflector and the measurement beam from the measurement object, and then directs the reference and measurement beams back to the polarizing beam splitter. The polarizing beam splitter combines the reference and measurement beams to produce the overlapping exit reference and measurement beams. The measurement retroreflector can have an aperture through which the reference beam travels to and from the reference object and the reference retroreflector can have an aperture through which the measurement beam travels to and from the measurement object. The interferometer can further include a reference quarter wave plate through which the reference beam travels to and from the reference object and a measurement quarter wave plate through which the measurement beam travels to and from the measurement object.

The beam steering mirror can have front and back faces. During operation the front face of the beam steering mirror can direct the measurement beam to the measurement object and the back face of the beam steering mirror can receive the measurement beam from the measurement object. The interferometer can further include a second polarizing beam splitter which during operation receives the reference beam from the reference path and the measurement beam from the back face of the beam steering mirror and produces the exit reference and measurement beams.

The interferometer can further include at least one additional beam steering assembly including an additional beam steering element and an additional positioning system to orient the additional beam steering element. During operation the additional beam steering element directs the measurement beam. The measurement beam contacts the additional beam steering element and during operation the control circuit causes the positioning systems to reorient the beam steering elements to optimize the overlap of the exit reference and measurement beams and maintain the exit reference and measurement beams substantially parallel over a range of angular orientations and positions of the measurement object. The control circuit can include two detectors having spatially resolved detector elements operative to measure a position and direction of the exit measurement beam and generate measurement signals indicative of the position and direction. The control circuit can further include a controller operative to receive the measurement signals from the detectors and send control signals to the positioning systems based on the signals from the detectors, the control signals causing the positioning systems to reorient the beam steering elements.

In general, in another aspect, the invention features an interferometry system for measuring changes in distance to a measurement object. The system includes an interferometer which during operation receives one or more input beams to define a reference beam and a measurement beam, directs the reference beam along a reference path and the measurement beam along a measurement path contacting the measurement object, and combines the reference and measurement beams to produce an output beam including overlapping exit reference and measurement beams. The output beam is indicative of changes in a relative optical path length between the reference and measurement paths. The system further includes a beam steering assembly including a beam steering element and a positioning system to orient the beam steering element. During operation the beam steering element directs the input and output beams, the input and output beams contacting the beam steering element. The system further includes a control circuit which during operation causes the positioning system to reorient the beam steering element in response to changes in at least one of angular orientation and position of the measurement object.

The system can include any of the following features.

The interferometer can receive a single input beam and separate the single input beam into a pair of spatially separated beams to define the reference and measurement beams. Alternatively, the interferometer can receive a pair of spatially separated input beams to define the reference and measurement beams.

The beam steering element can include a beam steering mirror, and the positioning system can include at least one transducer mounted to the beam steering mirror and operative to adjust an orientation of the beam steering mirror in response to a control signal from the control circuit. The beam steering mirror can include front and back faces, and wherein during operation the input beam contacts the front face of the beam steering mirror and the output beam contacts the back face of the beam steering mirror. The interferometer can be a single-pass interferometer in which the measurement beam contacts the measurement object only a single time.

The control circuit can cause the positioning system to reorient the beam steering element to do any of the following: 1) maintain the exit reference and measurement beams substantially parallel to one another over a range of angular orientations of the measurement object; 2) reduce changes in direction of the exit measurement beam caused by changes in the angular orientation of the measurement object; 3) to reduce a transverse displacement between the exit reference and measurement beams caused by changes in angular orientation of the measurement object or a translation of the measurement object; 4) reduce a transverse displacement of the measurement beam caused by changes in angular orientation of the measurement object or a translation of the measurement object; 5) to insure that the measurement beam contacts the measurement object at substantially normal incidence over a range of angular orientations of the measurement object.

In general, in a further aspect, the invention features an interferometry system including an interferometer which during operation directs a reference beam along a reference path and a measurement beam along a measurement path contacting a measurement object at non-normal incidence, and combines the reference and measurement beams to form overlapping exit reference and measurement beams. The overlapping exit measurement and reference beams are indicative of changes in a relative optical path length between the reference and measurement paths. The interferometer includes a beam steering assembly positioned to direct the measurement beam. The system includes a control circuit which during operation causes the beam steering assembly to redirect the measurement beam to reduce transverse displacements between the exit reference and measurement beams caused by translations of the measurement object.

In general, in another aspect, the invention features an interferometry system including an interferometer which during operation directs a reference beam along a reference path and a measurement beam along a measurement path contacting a measurement object, and combines the reference and measurement beams to form overlapping exit reference and measurement beams. The overlapping exit measurement and reference beams are indicative of changes in a relative optical path length between the reference and measurement paths. The interferometer includes a beam steering assembly positioned to direct at least one of the reference and measurement beams.

The system further includes a control circuit which during operation causes the beam steering assembly to redirect one of the reference and measurement beams to do at least one of the following: 1) maintain the exit reference and measurement beams substantially parallel to one another over a range of angular orientations of the measurement object; 2) reduce changes in direction of the exit measurement beam caused by changes in the angular orientation of the measurement object; 3) reduce a transverse displacement between the exit reference and measurement beams caused by changes in angular orientation of the measurement object; 4) reduce a transverse displacement between the exit reference and measurement beams caused by translations of the measurement object; 5) to insure that the measurement beam contacts the measurement object at substantially normal incidence over a range of angular orientations of the measurement object; 6) to reduce a transverse displacement of the measurement beam caused by translations of the measurement object; and 7) to reduce a transverse displacement of the measurement beam caused by changes in angular orientation of the measurement object.

In general, in another aspect, the invention features an interferometry system including an interferometer which during operation directs a reference beam along a reference path and a measurement beam along a measurement path contacting a measurement object, and combines the reference and measurement beams to form overlapping exit reference and measurement beams. The overlapping exit measurement and reference beams are indicative of changes in a relative optical path length between the reference and measurement paths. The interferometer includes a beam steering assembly positioned to direct at least one of the reference and measurement beams. The system further includes a control circuit which during operation causes the beam steering assembly to redirect the at least one of the reference and measurement beams in response to changes in angular orientation of the measurement object based on a signal generated from the exit measurement beam.

In general, in another aspect, the invention features a single-pass interferometry system including an interferometer which during operation directs a reference beam along a reference path and a measurement beam along a measurement path contacting a measurement object, and combines the reference and measurement beams to form overlapping exit reference and measurement beams. The overlapping exit measurement and reference beams are indicative of changes in a relative optical path length between the reference and measurement paths. The measurement path contacts the measurement object only a single time. The interferometer includes a beam steering assembly positioned direct at least one of the reference and measurement beams. The system further includes a control circuit which during operation causes the beam steering assembly to redirect the at least one of the reference and measurement beams in response to changes in angular orientation of the measurement object.

In another aspect, the invention also features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and at least one of any of the interferometry systems described above. The interferometry system(s) measures the position of the wafer relative to the imaged radiation.

In another aspect, the invention features a lithography system for use in fabricating integrated circuits on a wafer. The lithography system includes a stage for supporting the wafer and an illumination system. The illumination system includes a radiation source, a mask, a positioning system, a lens assembly, and at least one of any of the interferometry systems described above. During operation the source directs radiation through the mask to produce spatially patterned radiation. The positioning system adjusts the position of the mask relative to the radiation from the source. The lens assembly images the spatially patterned radiation onto the wafer. The interferometry system(s) measures the position of the mask relative to the radiation from the source.

In another aspect, the invention features a lithography system for fabricating integrated circuits. The lithography system includes first and second components, the first and second components being movable relative to each other. The lithography system also includes at least one of any of the interferometry systems described above, wherein the first component includes the measurement object and the interferometry system(s) monitors the position of the first component relative to the second component.

In another aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and at least one of any of the inteferometry systems described above for measuring the position of the stage relative to the beam directing assembly.

In general, in another aspect, the invention features a method for interferometry. The interferometry method includes: directing a reference beam along a reference path and a measurement beam along a measurement path contacting a measurement object; combining the reference and measurement beams to form overlapping exit reference and measurement beams, the overlapping exit measurement and reference beams indicative of changes in a relative optical path length between the reference and measurement paths; and using an electronic control system to redirect the measurement beam in response to changes in at least one of angular orientation and position of the measurement object.

In general, in another aspect, the invention features a method for interferometry. The interferometry method includes: receiving one or more input beams to define a reference beam and a measurement beam; directing the reference beam along a reference path and the measurement beam along a measurement path contacting a measurement object; combining the reference and measurement beams to form an output beam including overlapping exit reference and measurement beams, the overlapping exit measurement and reference beams indicative of changes in a relative optical path length between the reference and measurement paths; and using an electronic control system to redirect the input and output beams in response to changes in at least one of angular orientation and position of the measurement object.

In another aspect, the invention features a lithography method for use in fabricating integrated circuits. The lithography method includes: imaging spatially patterned radiation onto a wafer; positioning the wafer relative to the imaged radiation; and measuring the position of the wafer relative to the imaged radiation using at least one of the interferometry methods described above.

In another aspect, the invention features a lithography method for use in the fabrication of integrated circuits. The lithography method includes: directing input radiation through a mask to produce spatially patterned radiation; positioning the mask relative to the input radiation; measuring the position of the mask relative to the input radiation using at least one of the interferometry methods described above; and imaging the spatially patterned radiation onto a wafer.

In another aspect, the invention features a lithography method for use in fabricating integrated chips. The lithography method includes: positioning a first component of a lithography system relative to a second component of a lithography system to expose a wafer to spatially patterned radiation; and measuring the position of the first component relative to the second component using any of the interferometry methods described above.

In another aspect, the invention features a beam writing method for use in fabricating a lithography mask. The method includes: directing a write beam to a substrate to pattern the susbtrate; positioning the substrate relative to the write beam; and measuring the position of the substrate relative to the write beam using any of the interferometry methods described above.

Finally, in general, in another aspect, the invention features an interferometry system for measuring changes in distance to a measurement object. The interferometry system includes an interferometer, a beam steering assembly for redirecting at least one beam within the interferometer, and a control circuit for reorienting the beam steering assembly in response to changes in the angular orientation or position of the measurement object.

Embodiments of the interferometry systems and methods described above include many advantages.

For example, the system can maintain the exit reference and measurement beams substantially parallel to one another over a range of orientations of the measurement object, and can do so with only a single pass of the measurement beam to the measurement object. The single-pass system reduces the bandwidth of electronics needed to process electrical interference signals having Doppler shifts, relative to those of a double-pass interferometer. Furthermore, the single-pass system reduces the likelihood of depolarization, scattering, and undesired spurious reflections from transmissive optics within the interferometer, relative to those for a double-pass interferometer. Such effects can introduce errors, e.g., cyclic errors, in the measured phase of the electrical interference signal. Nonetheless, embodiments can also include multi-pass, e.g., double-pass, configurations.

In both single-pass and multi-pass configurations, the system can minimize the transverse displacement of the exit reference and measurement beams or the transverse displacement of components of the reference and measurement beams within the interferometer caused by changes in the angular orientation or position of the measurement object. As a result, the average amplitude of the electrical interference signal produced from the mixed exit reference and measurement beams can be substantially independent of changes in the angular orientation and position of the measurement object. In addition, the system reduces changes of the paths of the measurement and reference beams through transmissive optics of the interferometer, e.g., polarizing beam splitters and quarter wave plates, caused by changes in the angular orientation or position of the measurement object. Such transmissive optics can have imperfections in their surface figures and local variations in refractive index. Thus, changes in the paths of the beams through such optics can change the optical path length measured by the interferometer even though the distance between the measurement object and the interferometer has not changed. Such negative effects can be compounded if the transmissive optic has dispersive properties, such as those produced by a wedge.

Furthermore, in some embodiments, the system includes one or more polarizing beam splitters as the only transmissive optics, with all other optics being reflective. In particular, quarter wave plates are not required. Minimizing the number of transmissive optics in the system optics reduces depolarization, scattering, and undesired spurious reflections of the reference and measurement beams, which can introduce errors, e.g., cyclic errors, in the measured phase of the electrical interference signal.

The interferometry systems can also include multiple interferometers and at least one beam steering assembly to measure angular orientation, in addition to displacement, of the measurement object. Such angle-measuring embodiments can enjoy many of the advantages described above.

Furthermore, the interferometer systems can involve beam components at multiple wavelengths to measure dispersion along the measurements path(s). Such dispersion measurements can be used to convert optical path length changes into geometric path length changes. Again such dispersion-measuring embodiments can enjoy many of the advantages described above.

Similar features are also described in commonly owned, copending U.S. patent application Ser. No. 09/157,131 entitled "Interferometer Having a Dynamic Beam Steering Assembly" by Henry A. Hill and Peter de Groot filed Sep. 18, 1998, the contents of which are incorporated herein by reference.

Other features, aspects, and advantages will be apparent from the following detailed description and from the claims.

BRIEF DESCRIPTION OF THE DRAWINGS

FIGS. 1a–1f are schematic drawings of a first embodiment of the interferometry system. FIGS. 1a and 1b depict beam propagation in lower and upper planes, respectively. FIG. 1c depicts beam propagation from the left end of the system shown in FIGS. 1a and 1b, the plane of FIG. 1c being orthogonal to the planes of FIGS. 1a and 1b. FIG. 1d is a cross-sectional view of beams entering and exiting a component of the system. FIG. 1e is a schematic drawing of a detector system and FIG. 1f is a diagram used to discuss path length variations.

FIGS. 2a and 2d depict beam propagation in upper and lower planes, respectively. FIG. 2c depicts beam propagation as seen from the left end of the system shown in FIGS. 2a and 2d, the plane of FIG. 2c being orthogonal to the planes of FIGS. 2 and 2d. FIG. 2b is an inset for FIG. 2a. FIG. 2e depicts beam propagation as seen from a bottom view of portions of system shown in FIGS. 2a and 2d. FIG. 2f is a cross-sectional view of beams entering and exiting a component of the system.

FIGS. 3a–3f are schematic drawings of a third embodiment of the interferometry system. FIGS. 3a and 3e are insets for FIG. 3d. FIGS. 3b and 3d depict beam propagation in upper and lower planes, respectively. FIG. 3c depicts beam propagation orthogonal to the planes of FIGS. 3b and 3d. FIG. 3f is a cross-sectional view of the beams as seen from the right end of the system shown in FIGS. 3b and 3d in a plane orthogonal to the planes of FIGS. 3b and 3d and also orthogonal to the plane of FIG. 3c.

FIGS. 4a–4f are schematic drawings of a fourth embodiment of the interferometry system. FIGS. 4a and 4e are insets for FIG. 4d. FIGS. 4b and 4d depict beam propagation in upper and lower planes, respectively. FIG. 4c depicts beam propagation orthogonal to the planes of FIGS. 4b and 4d. FIG. 4f is a cross-sectional view of beams as seen from the right side of FIG. 4b in a plane orthogonal to the planes of FIGS. 4b and 4d and also orthogonal to the plane of FIG. 4c.

FIGS. 6a and 6b depict beam propagation in orthogonal planes.

FIGS. 7a and 7b depict beam propagation in orthogonal planes.

FIGS. 8b and 8c depict beam propagation in planes that are orthogonal to the plane of FIG. 8a.

FIGS. 9b and 9c depict beam propagation in planes that are orthogonal to the plane of FIG. 9a.

FIGS. 10b and 10c depict beam propagation in planes that are orthogonal to the plane of FIG. 10a.

FIGS. 11b and 11c depict beam propagation in planes that are orthogonal to the plane of FIG. 11a. FIG. 11d is an extension of FIG. 11a. FIGS. 11e and 11f are insets of FIG. 11d.

FIGS. 12b depicts beam propagation in a plane that is orthogonal to the plane of FIG. 12a. FIG. 12c is an extension of FIG. 12a. FIGS. 12d and 12e are insets of FIG. 12c.

FIGS. 13a–13b are schematic drawings of a thirteenth embodiment of the interferometry system. FIGS. 13b depicts beam propagation in a plane that is orthogonal to the plane of FIG. 13a.

FIG. 14a is a schematic drawing of a lithography exposure system employing the interferometry system. FIGS. 14b and 14c are flow charts describing steps in manufacturing integrated circuits.

FIGS. 17a and 17c are cross-sectional views in perpendicular planes, and FIG. 17b is a plan view looking into a plane perpendicular to that of FIG. 17a.

FIGS. 18a–18f are schematic drawings of multi-pass embodiments of the interferometry system. FIGS. 18a–18d relate to a first such embodiment, with FIGS. 18a and 18d being cross-sectional views in a first plane, FIG. 18c being a cross-sectional view in a perpendicular plane, and FIG. 18b being a plan view looking into a plane perpendicular to that of FIG. 18a. FIGS. 18e–f are schematic drawings of a second such embodiment, with both FIGS. 18e–f being cross-sectional views in a common plane.

FIG. 19a is schematic drawing of the optical arrangement for the embodiment, FIG. 19b is a schematic drawing of a signal processor used in the embodiment, and FIG. 19c is a variation of the interferometer unit used in the optical arrangement.

DETAILED DESCRIPTION

The invention features an interferometry system including an interferometer and at least one beam steering assembly controlled by a control circuit. In some embodiments, the beam steering assembly is a component of the interferometer, directing at least one of the reference and measurement beams within the interferometer. In other embodiments, the beam steering assembly is separate from the interferometer, directing an input beam to, and an output beam from, the interferometer. The beam steering assembly redirects one or more of the input, output, reference, and measurement beams to minimize undesired consequences of changes in the angular orientation or position of the measurement object.

Four embodiments of the invention will be first described wherein these embodiments involve relatively few components and beam propagation in only one plane.

Nonetheless, these embodiments demonstrate important features of the invention that will be expanded upon in additional embodiments described subsequently.

Figure 15A:
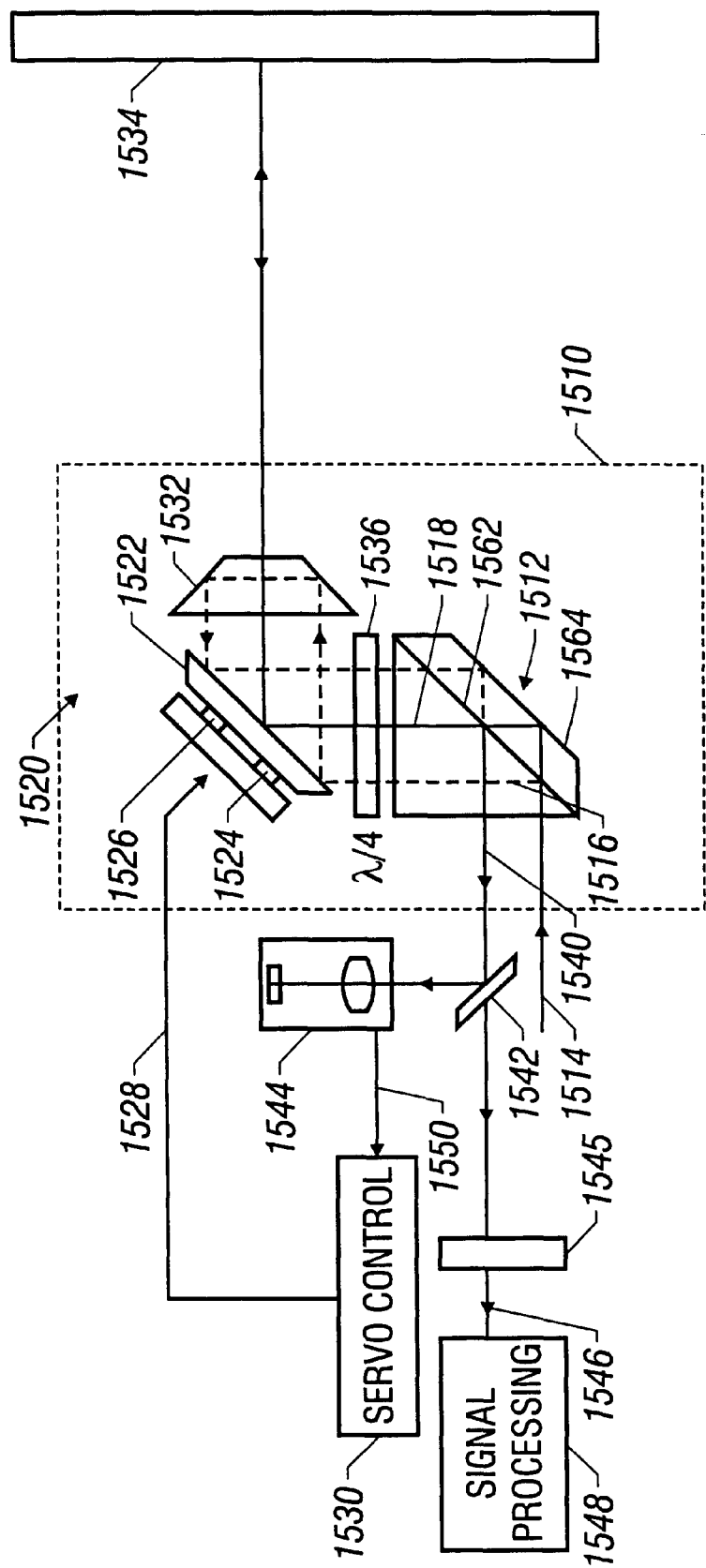
FIGS. 15a–15d are schematic drawings of additional embodiments of the interferometry system.

A schematic of an embodiment of the invention is shown in FIG. 15a. A polarizing beam splitter 1512 in an interferometer 1510 receives an input beam 1514 from a laser source (not shown) and separates input beam 1514 into reference beam 1516 (dotted line) and measurement beam 1518 (solid line), which are linearly polarized orthogonal to one another. The polarizing beam splitter 1512 includes a polarizing interface 1562 for reflecting beams having a polarization orthogonal to the plane of FIG. 15a and a back reflective surface 1564 for reflecting beams transmitted through polarizing interface 1562.

In the described embodiment, the orthogonally polarized reference and measurement beams are frequency-shifted with respect one another, e.g., by Zeeman splitting, acousto-optic modulation, or by use of birefringent elements internal to the laser, prior to entering interferometer 1510 as components of input beam 1514. The different frequencies enable the interferometry system to generate a heterodyne interference signal. Although the described embodiment is a heterodyne system, the instant invention is readily adapted for use in a homodyne system in which the reference and measurement beams have the same frequencies.

Polarizing beam splitter 1512 directs the measurement beam 1518 to a beam steering assembly 1520, which includes a beam steering mirror 1522 and a pair of piezoelectric transducers 1524 and 1526. The transducers are coupled to the beam steering mirror 1522 by flexures to orient the beam steering mirror in response to a signal 1528 from a servo controller 1530. The beam steering assembly may include capacitance gauges to measure changes in orientation and/or position of the beam steering mirror 1522. The capacitance gauges may also be used to measure and/or monitor the properties of the piezoelectric transducers 1524 and 1526.

Beam steering assembly 1520 directs the measurement beam through reference retroreflector 1532, reference retroreflector 1532 being truncated so that a beam passing centrally through retroreflector 1532 is not retroreflected, to contact a stage mirror 1534, i.e., the measurement object, at substantially normal incidence. Stage mirror 1534 then reflects the measurement beam back to retrace its path to beam steering assembly 1520 and polarizing beam splitter 1512. The measurement beam double passes a quarter wave plate 1536, which is positioned between the beam steering assembly 1520 and polarizing beam splitter 1512 and which rotates the linear polarization of the measurement beam by 90°.

Polarizing beam splitter 1512 directs the reference beam 1516 to the beam steering assembly 1520, which in turn directs the reference beam to reference retroreflector 1532. The reference retroreflector then directs the reference beam back to beam steering assembly 1520 and onto polarizing beam splitter 1512. The reference beam also double passes quarter wave plate 1536, which rotates the linear polarization of the reference beam by 90°.

Polarizing beam splitter 1512 then recombines the polarization-rotated reference and measurement beams to form overlapping exit reference and measurement beams, which together form an output beam 1540. A beam splitter 1542 sends a portion of output beam 1540 to a detector system 1544, which measures the difference in directions of propagation of the exit reference and measurement beams. The detector system sends an error signal 1550 indicative of any such difference to servo controller 1530, which sends signal 1528 to beam steering assembly 1520 in response to the error signal. The beam steering assembly 1520 changes, in response to signal 1528, the orientation of beam steering mirror 1522 preferably about a nodal point of reference retroreflector 1532, changes in orientation of beam steering mirror 1522 about a nodal point of reference retroreflector 1532 producing substantially reduced lateral shear effects experienced by the reference beam.

Alternatively when the direction of the input beam 1514 is constant, detector system 1544 can measure the difference in position of the exit measurement beam from a reference position in the detector system and generate error signal 1550 indicative of that difference in position, a difference in position of the exit measurement beam being the consequence of a change in direction of propagation of the exit measurement beam component of output beam 1540. For example, the reference position can be the position of the exit measurement beam in the detector system corresponding to the measurement beam retroreflecting from stage mirror 1534, i.e., contacting the stage mirror at normal incidence, and the stage mirror 1534 being at a nominal null orientation. In other embodiments, the detector system can include multiple detectors for determining the direction and position of the exit reference and measurement beams and can generate an error signal based on such information.

Changes in the angular orientation of stage mirror 1534 change the direction of the measurement beam and the direction of subsequent exit measurement beam. This causes detector system 1544 to generate error signal 1550. Servo-controller 1530 responds to the error signal by directing beam steering assembly 1520 to reorient beam steering mirror 1522 so as to minimize the error signal, e.g., by directing the measurement beam to the stage mirror at normal incidence. As a result, the exit reference and measurement beams remain substantially parallel to one another and the position of the exit measurement beam remains substantially constant over a range of angular orientations of the stage mirror. Furthermore, since beam steering assembly 1520 redirects each of the reference and measurement beams twice, there is no change in the relative optical path length between the reference and measurement beams to first order in a translation of beam steering mirror 1522 in a direction normal to the reflecting surface of beam steering mirror 1522. In addition, when the measurement beam is directed to the stage mirror at normal incidence and the paths of the measurement and reference beams have substantially the same centroids, there is no change in the relative optical path length between the reference and measurement beams to first order in any angular orientation change of the stage mirror (about the center of a measurement beam spot on the stage mirror) and any corresponding change in the beam steering element.

The remainder of output beam 1540, after beam splitter 1542 passes through a polarizer 1545, which mixes polarizations of the exit reference and measurement beams to form a mixed beam 1546. A signal processing system 1548 measures the intensity of the mixed beam, e.g., by photo-electric detection, to produce an electrical interference signal or electrical heterodyne signal, extracts the phase of the electrical heterodyne signal, and determines from that phase the difference in optical path length between the paths of the reference and measurement beams.

In other embodiments, detector system 1544 could be part of a separate angle sensing system (not shown), comprised of an additional light beam (not shown) directed towards stage mirror 1534. The separate angle sensing system would measure the absolute or relative angular orientation of stage mirror 1534 using the additional light beam and would send a measurement signal to servo-controller 1530 indicative of that orientation. As in the embodiment of FIG. 15*a*, servo-controller 1530 would control beam steering assembly 1520 based on the signal from the detector system. In addition, in embodiments in which several interferometry systems each direct a measurement beam to a measurement object, a single angle sensing system can be used to guide control of the beam steering assembly in each of the interferometry systems.

Figure 15B:
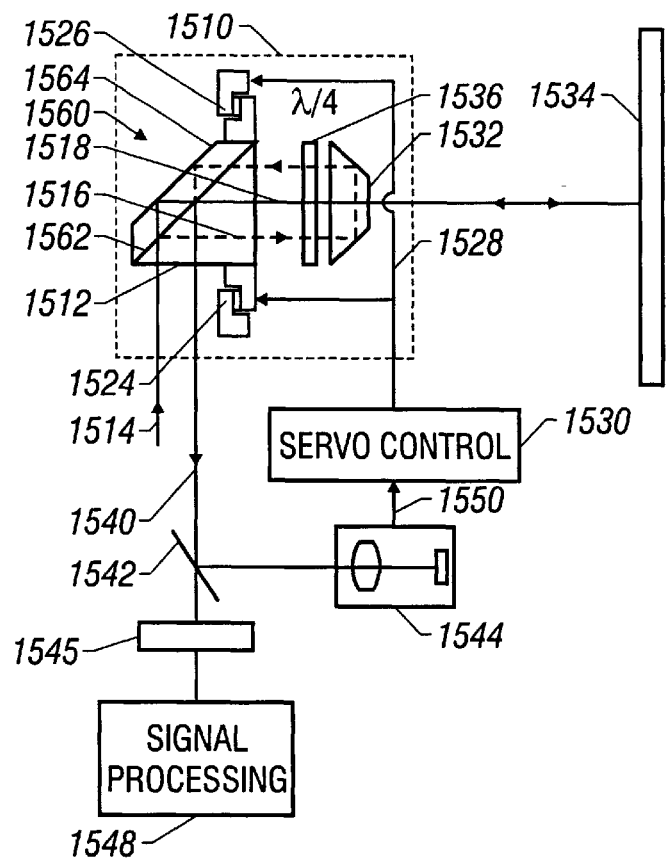

In another embodiment similar to that of FIG. 15*a*, a polarizing beam splitter 1512 and the beam steering assembly 1520 are combined into a single unit, as shown by polarizing beam splitter and beam steering assembly 1560 in FIG. 15*b*. In this variation, transducers 1524 and 1526 are coupled through flexures directly to polarizing beam splitter 1512. As a result, servo controller 1530 orients the polarizing interface 1562 and reflective back surface 1564 of polarizing beam splitter 1512 via transducers 1524 and 1526 to direct the reference and measurement beams to reference retroreflector 1532 and stage mirror 1534, respectively. Quarter wave plate 1536 is positioned between reference retroreflector 1532 and beam steering assembly 1560. Other features of this embodiment are the same as those of the embodiment in FIG. 15*a* and are numbered the same.

Figure 15C:
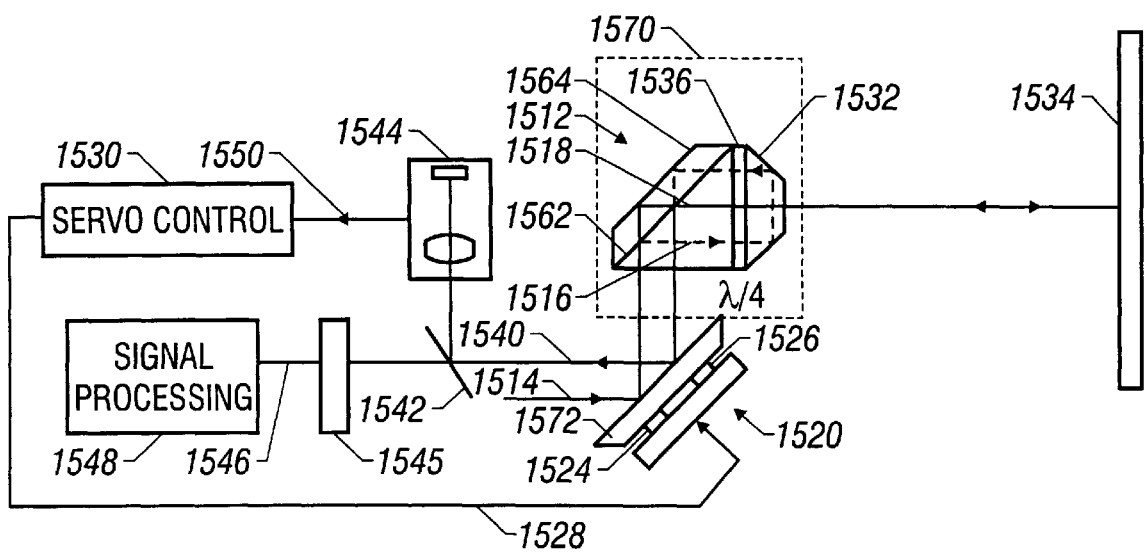

In a further embodiment, similar to that of FIG. 15*a* and shown in FIG. 15*c*, input beam 1514 first contacts beam steering assembly 1520, which then directs the input beam into the interferometer 1570. In this embodiment, the interferometer includes polarizing beam splitter 1512, quarter wave plate 1536, and reference retroreflector 1532, but does not include beam steering assembly 1520, which is outside the interferometer. As in the embodiment of FIG. 15*b*, the polarizing beam splitter 1512 directs the reference and measurement beams to reference retroreflector 1532 and stage mirror 1534, respectively, and recombines the reflected reference and measurement beams to form the overlapping exit reference and measurement beams, which are the components of output beam 1540. Beam steering assembly 1520 then receives output beam 1540 and directs it to detection system 1544 and signal processing system 1548, as in the embodiment of FIG. 15*a*.

As in the embodiment of FIG. 15*a*, servo controller 1530 in FIG. 15*c* orients beam steering mirror 1522 of assembly

1520 to minimize the error signal generated by detection system 1544. To do so, servo controller 1530 orients beam steering mirror 1522 of assembly 1520 to direct the input beam into interferometer 1570 such that the measurement beam contacts stage mirror 1534 at normal incidence over a range of angular orientations of the stage mirror. The beam steering assembly 1520 changes, in response to signal 1528, the orientation of beam steering mirror 1522 preferably about a nodal point of reference retroreflector 1532, changes in orientation of beam steering mirror 1522 about a nodal point of reference retroreflector 1532 producing substantially reduced lateral shear effects (tranverse displacement) on the reference beam. As a result, the exit reference and measurement beams, which form the output beam, emerge from the interferometer substantially parallel. Changes in the direction of the output beam emerging from the interferometer caused by the beam steering assembly redirecting the input beam are compensated when the output beam contacts the beam steering assembly, which directs the output beam to detection system 1544 and signal processing system 1548.

Figure 15D:
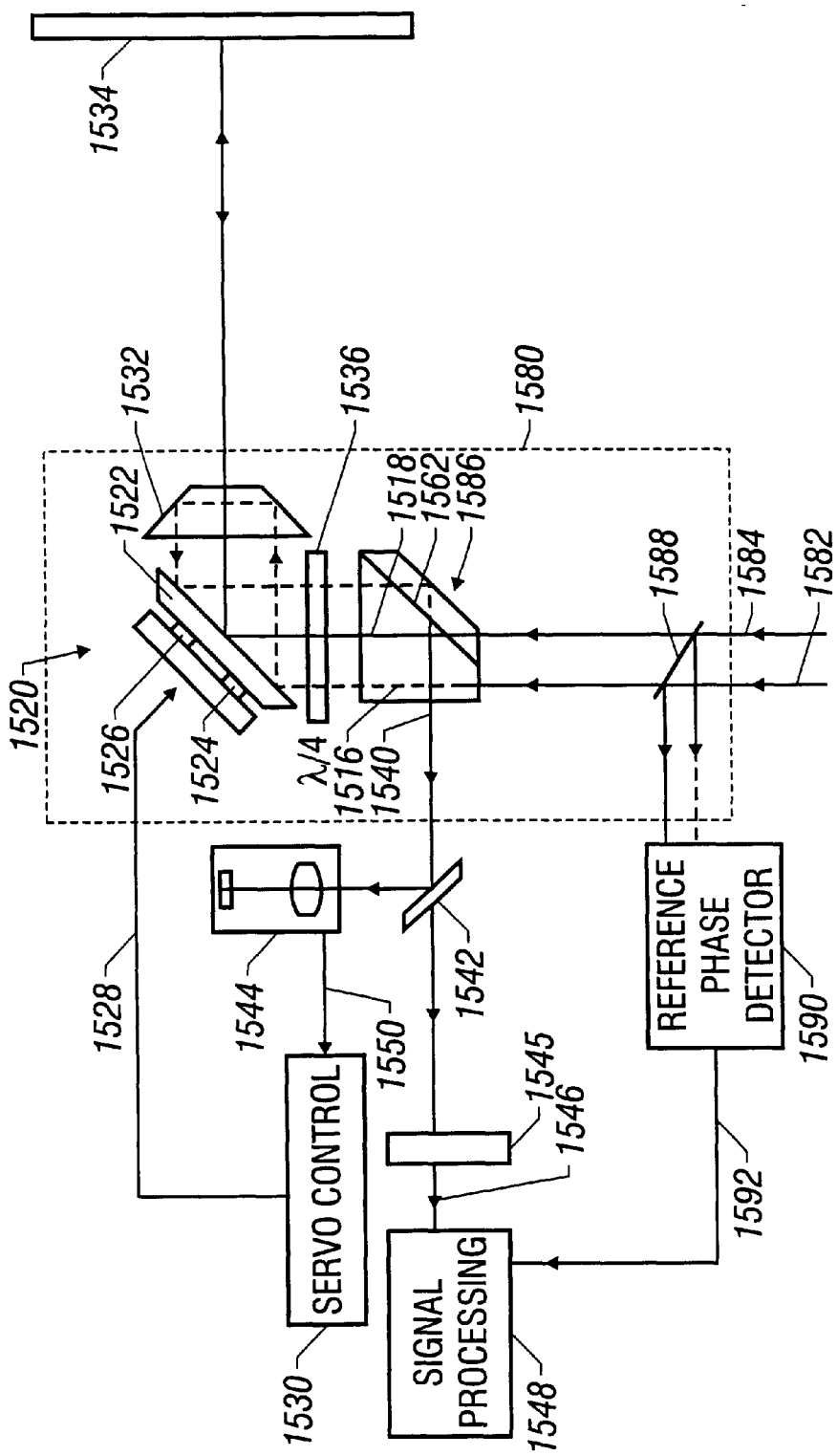

In another embodiment similar to FIG. 15*a* and shown in FIG. 15*d*, the interferometry system receives a pair of spatially separated input beams to define the reference and measurement beams rather than separating a single input beam into the reference and measurement beams. In this embodiment, an interferometer 1580 receives spatially separated input beams 1582 and 1584 polarized orthogonal to one another and a polarizing beam splitter 1586 directs the received input beams along different paths to define reference beam 1516 and measurement beam 1518. Prior to entering polarizing beam splitter 1586, a portion of the input beams is split off by a non-polarizing beam splitter 1588 and directed to a reference phase detector 1590. The reference phase detector includes optics to optically mix the input beams and electronics to measure the relative optical phase of the mixed beams. Reference phase detector 1590 sends a reference phase signal 1592 indicative of the relative phase difference between input beams 1582 and 1584 upon entering interferometer 1580 to signal processing system 1548, which uses signal 1592 to determine the difference in optical path length between the paths of the reference and measurement beams.

The remaining description for the embodiment of FIG. 15*d* is identical to that for FIG. 15*a* with polarizing beam splitter 1586 recombining reference beam 1516 and measurement beam 1518 to form output beam 1540. The embodiment of FIG. 15*d* and other such embodiments in which the interferometer receives spatially separated input beams to define the reference and measurement beams reduces paths within optics of the interferometer in which the reference and measurement beams overlap one another. Such a reduction reduces polarization mixing between the reference and measurement beams that can cause cyclic errors in the heterodyne signal measured by system 1548. For a reference describing such cyclic errors, see, e.g., N. Bobroff, *Appl. Opt.*, 26:2676–2681, 1986. Also, in other embodiments such as that of FIG. 15*c* in which the beam steering assembly is outside the interferometer, the beam steering mirror can direct spatially separated input beams into the interferometer to define the reference and measurement beams.

The concepts inherent in the systems described above and shown in FIGS. 15*a*–15*d* can be extended to other applications. For example, other embodiments can address changes in the angular orientation and position of the measurement object along multiple dimensions. Also, other embodiments can insure that the transverse spatial profile of the exit reference beam is not inverted relative to that of the exit measurement beam when these beams are mixed to produce the interference signal. Also, other embodiments can include additional beam steering assemblies. Such alternative embodiments are described further below.

In general, these embodiments relate to apparatus and methods for measuring and monitoring a linear displacement of an object substantially independent of the orientation of the object and substantially independent of a lateral displacement of the object, wherein the lateral displacement is orthogonal to the linear displacement. An example of an important application is in using an interferometry system to measure and monitor along a given dimension the location of one or more stages in a lithographic tool that is stepping and/or scanning in either one, two, or three orthogonal dimensions.

The embodiments described below comprise an interferometer and at least one beam steering assembly, which can be a component of, or separate from, the interferometer. The embodiments generally fall into one of three classes. In the first class, the beam steering assembly is positioned to direct components of both a measurement beam and a reference beam. In the second class, the beam steering assembly is positioned to direct components of the measurement but not the reference beam. And, in the third class, the beam steering assembly is positioned to direct an input beam to and an output beam from, the interferometer.

Within each class, the interferometry systems can function in one or both of two different modes of operation. The first mode of operation compensates for changes in the direction of the measurement beam or exit measurement beam caused by changes in the angular orientation of the measurement object. The changes in angular orientation can be along one or more directions, e.g., changes in pitch and yaw. The second mode of operation compensates for changes in the transverse position of the measurement beam or exit measurement beam caused by changes in the position of the measurement object. The changes in position can be along any of two transverse directions, i.e., directions orthogonal to the displacement being measured, and a longitudinal direction, i.e., a direction along the displacement being measured.

The modes of operation for a particular interferometry system depend on the reflective properties of the measurement object. For example, if the measurement beam reflects from a plane mirror, changes in the angular orientation of the plane mirror about two orthogonal axes in the plane of the mirror causes changes the direction of the reflected measurement beam relative to the two axes. However, translations of the plane mirror along either of these two axes do not affect the direction or transverse position of the reflected measurement beam. Therefore, for applications in which the measurement beam reflects from a plane mirror of the measurement object, the system typically operates in the first mode.

In a different example, if the measurement beam reflects from a retroreflector, the direction of the reflected measurement beam is independent of changes in the angular orientation or position of the measurement object. However, translations of the retroreflector along directions orthogonal to an incoming measurement beam cause changes in the transverse position of the reflected measurement beam. Therefore, for an application in which the measurement beam retroreflects from a measurement object in a given plane, the system typically operates in the second mode for translations of the measurement object in that plane and orthogonal to the incoming measurement beam.

As would be clear to those skilled in the art, applications in which the measurement object includes a roof prism to reflect the measurement beam combine features of the previous two examples. In such an application, the system operates in both the first and second modes.

The system can also operate in both first and second modes for applications in which the measurement object includes a plane mirror to reflect the measurement beam, and the measurement beam contacts the plane mirror at non-normal incidence. In such applications longitudinal translations of the measurement object change the transverse position of the reflected measurement beam and changes in the angular orientation of the measurement object change the direction of the reflected measurement beam.

Embodiments of the interferometry system can also include single and multiple passes of the measurement beam to the measurement object. In single-pass systems, changes in the angular orientation or position of the measurement object cause changes in the direction or transverse position of the exit measurement beam. The changes to the exit measurement beam as detected by a detector system provide the basis for an error signal used to control the beam steering assembly. In some multiple pass arrangements, changes in the angular orientation or position of the measurement object do not change the direction and/or transverse position of the exit measurement beam but do change the direction and/or transverse position of the measurement beam within the interferometer. To compensate for changes in the direction and/or transverse position of the measurement beam within the interferometer, some embodiments of the interferometry system split off an intermediate beam from the measurement beam after the measurement beam has contacted the measurement object an odd number of times. The direction and/or position of the intermediate beam as detected by a detector system provide the basis for an error signal used to control the beam steering assembly.

For each of the embodiments of the present invention, the interferometer and at least one beam steering assembly are configured such that a displacement of certain optical elements of the at least one beam steering assembly as a unit does not effect in at least first order the difference between the optical path length of the measurement and reference beams. For the first mode of operation, the interferometer and at least one beam steering assembly are configured such that changes in the orientations of the measurement object and/or of certain optical elements of a beam steering assembly as a unit substantially do not effect in at least first order the difference between the optical path length of the measurement and reference beams. For the second mode of operation, the interferometer and at least one beam steering assembly are configured such that a displacement in the location of the measurement object orthogonal to the linear displacement substantially does not effect in at least first order the difference between the optical path length of the measurement and reference beams.

FIGS. 1a–1f depict, in schematic form, a first embodiment of the present invention for measuring a linear displacement of a measurement object substantially independent of the orientation of the measurement object and substantially independent of a lateral displacement of the measurement object, the lateral displacement being orthogonal to the linear displacement. The first embodiment is from the first class of embodiments and variants thereof of the present invention, which operate in the first mode of operation for changes in orientation of the measurement object about two orthogonal axes.

The first embodiment comprises light beam 110, a beam steering assembly, a first and second beam splitting assemblies, retroreflector 172, measurement object mirror 170 comprised of a single reflecting surface, and reference beam mirror 178 comprised of a single reflecting surface. Prism 150 and rhomboidal prism 154 comprise the first beam splitting assembly depicted in FIG. 1a wherein interface 152 is a polarizing beam splitting interface and surface 156 is a reflector. Rhomboidal prism 160, prisms 166 and 186, and dove prism 182 comprise the second beam splitting assembly depicted in FIG. 1b wherein interface 162 is a reflector, interfaces surfaces 164 and 174 are polarizing beam splitting interfaces, interface surface 184 in a nonpolarizing beam splitting interface, and interface surface 180 shown as a dotted line in FIG. 1b is antireflection coated.

The first embodiment is adapted for use as a heterodyne interferometer system. A source (not shown in FIGS. 1a–1f) provides for the first embodiment an entrance beam 110 comprised of two orthogonally polarized components of differing frequencies.

The light source such as a laser can be any of a variety of frequency modulation apparatus and/or lasers. For example, the laser can be a gas laser, e.g. a HeNe, stabilized in any of a variety of conventional techniques known to those skilled in the art, see for example, T. Baer et al., "Frequency Stabilization of a 0.633 $\mu$m He-Ne-longitudinal Zeeman Laser," *Applied Optics*, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," *Electronic Letters*, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics*, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (August. 1968); Bagley et al., U.S. Pat. No. 3,656,853, issued Apr. 18, 1972; and H. Matsumoto, "Recent interferometric measurements using stabilized lasers," *Precision Engineering*, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," *Applied Optics*, 18(2), 219–224 (1979); N. Massie et al., "Measuring Laser Flow Fields With a 64-Channel Heterodyne Interferometer," *Applied Optics*, 22(14), 2141–2151 (1983); Y. Ohtsuka and M. Tsubokawa, "Dynamic Two-frequency Interferometry for Small Displacement Measurements," *Optics and Laser Technology*, 16, 25–29 (1984); H. Matsumoto, op. cit.; P. Dirksen, et al., U.S. Pat. No. 5,485,272, issued Jan. 16, 1996; N. A. Riza and M. M. K. Howlader, "Acousto-optic system for the generation and control of tunable low-frequency signals," *Opt. Eng.*, 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, et al., op. cit.;

(4) use of two longitudinal modes of a randomly polarized HeNe laser, see for example, J. B. Ferguson and R. H. Morris, "Single Mode Collapse in 6328 A HeNe Lasers," *Applied Optics*, 17(18), 2924–2929 (1978); or (5) use of birefringent elements or the like internal to the laser, see for example, V. Evtuhov and A. E. Siegman, "A "Twisted-Mode" Technique for Obtaining Axially Uniform Energy Density in a Laser Cavity," *Applied Optics*, 4(1), 142–143 (1965).

The specific device used for the source of beam 110 will determine the diameter and divergence of beam 110. For some sources, e.g. a diode laser, it will likely be necessary to use conventional beam shaping optics, e.g. a conventional microscope objective, to provide beam 110 with a suitable diameter and divergence for the elements that follow. When the source is a HeNe laser, for example, beam shaping optics may not be required.

Beam 110 impinges on the first beam splitting assembly, as illustrated in FIG. 1a, with a portion of beam 110 transmitted by interface 152 and reflected by surface 156 as measurement beam 111. Beam 111 is polarized in the plane of FIG. 1a. A second portion of beam 110 is reflected by interface 152 as reference beam 112 orthogonally polarized to the plane of FIG. 1a.

Beam 111 enters beam steering element 158 (cf. FIG. 1a) and exits beam steering element 158 as beam 113 (cf. FIG. 1b) displaced laterally from beam 111 and propagating in a direction nominally opposite to the direction of propagation of beam 111. The projections of beam 113 and beam 111 in the plane of FIG. 1b are superimposed. In beam steering element 158, beam 111 is reflected in sequential order, e.g., by total internal reflection, by each of the surfaces 158A, 158B, and 158C (cf. FIG. 1c which presents an end view of the interferometer depicted in FIG. 1a and which shows the path of reference beam 112 in beam steering element 158). A beam steering assembly that redirects measurement beam 113 comprises beam steering element 158 and orientation/translation transducer 159. Orientation/translation transducer 159 preferably alters the orientation of beam steering element 158 about a nodal point of retroreflector 172 for a change in orientation in the plane of FIG. 1c, and/or alters the location of steering element 158 in the nominal direction of propagation of beam 111, wherein changes in orientation of beam steering element 158 about a nodal point of retroreflector 172 substantially reduce lateral shear effects experienced by the reference beam. The orientation of beam steering element 158 is controlled by electronic signal 140 and the location of beam steering element 158 is controlled by electronic processor and computer 194 through electronic signal 144.

Beam 113 enters the second beam splitting assembly, depicted in FIG. 1b, wherein it is reflected at interface 162 as beam 115 and then transmitted by polarizing beam splitting interface 164 as beam 117. Beam 117, polarized in the plane of FIG. 1b, is transmitted by quarter wave phase retardation plate 168 as a circularly polarized beam, reflected by measurement object mirror 170 as a beam with opposite-handed circular polarization, and subsequently transmitted by phase retardation plate 168 as beam 119 linearly polarized orthogonal to the plane of FIG. 1b. Beam 119 enters the second beam splitting assembly and is reflected by polarizing beam splitting interface 164 as beam 121.

Beam 121 exits the second beam splitting assembly, enters beam steering element 158 (cf. FIG. 1b), and exits beam steering element 158 as beam 123 (cf. FIG. 1a) propagating in a direction nominally opposite to the direction of propagation of beam 121. Beam 123 enters retroreflector 172 (cf. FIG. 1a) and is retroreflected as beam 125 (cf. FIG. 1b). Beams 123 and 125 are shown in FIG. 1d as entering and exiting beams, respectively, to and from retroreflector 172, respectively.

Reference beam 112 enters beam steering element 158 (cf. FIG. 1a) and exits beam steering element 158 as beam 114 (cf. FIGS. 1b and 1c) propagating in a direction nominally opposite to the direction of propagation of beam 112. The projections of beams 114 and beam 112 are superimposed in the plane of FIG. 1a. The projections of the paths of beams 111 and 112 through beam steering element 158 are superimposed in the plane of FIG. 1c. Beam 114 enters retroreflector 172 (cf. FIG. 1b) and is retroreflected as beam 116 (cf. FIG. 1a). In FIG. 1d, beams 114 and 116 are shown as entering and exiting beams, respectively, to and from retroreflector 172, respectively. Beam 116 enters beam steering element 158 (cf. FIG. 1a) and exits beam steering element 158 as beam 118 (cf. FIG. 1b) propagating in a direction nominally opposite to the direction of propagation of beam 116.

Beam 118 enters the second beam splitting assembly and a portion of beam 118 is reflected by polarizing beam splitting interface 174 as beam 120 (cf. FIG. 1b). Beam 120, orthogonally polarized to the plane of FIG. 1b, is transmitted by quarter wave phase retardation plate 176 as a circularly polarized beam, reflected by reference mirror 178 as a beam with opposite-handed circular polarization, and subsequently transmitted by quarter wave phase retardation plate 176 as beam 122 linearly polarized in the plane of FIG. 1b. Beam 122 enters the second beam splitting assembly and 122 is transmitted by polarizing beam splitting interface 174 as beam 124. Beam 124 is transmitted by antireflection coated interface 180 as beam 126.

Measurement beam 125 enters, as shown in FIG. 1b, the second beam splitting assembly and a first portion of beam 125 is transmitted by nonpolarizing beam splitting interface 184 as one component of a first output beam 128. A first portion of beam 126 is reflected by nonpolarizing beam splitter interface 184 as a second component of the first output beam 128. First output beam 128 is reflected by reflecting interface 162 as output beam 130. Output beam 130 impinges on detector 188 to produce an electrical signal 140 with two components related to any difference in the directions of propagation of measurement and reference beam components in output beam 130 in two orthogonal planes, respectively.

A second portion of beam 125 is reflected by nonpolarizing beam splitting interface 184 as one component of a second output beam 132. A second portion of beam 126 is transmitted by nonpolarizing beam splitting interface 184 as a second component of the second output beam 132. Beam 132 is transmitted by a polarizer 190 orientated to produce a mixed optical beam 134. Beam 134 impinges on detector 192 to generate electrical signal 142 related to the difference in phase of the measurement and reference beam components of mixed beam 134. Electrical signal 142 is transmitted to electronic processor and computer 194 for subsequent processing to obtain information about the difference in phase of the measurement and reference beam components of mixed beam 134. The detection of mixed beam is typically by photoelectric detection to produce a heterodyne signal, the phase of which is related to the difference in optical path lengths of the measurement and reference beams. The phase of the heterodyne signal may be determined by electronic processor and computer 194 for example from a Fourier transform or Hilbert transform of the heterodyne signal.

Figure 1E:
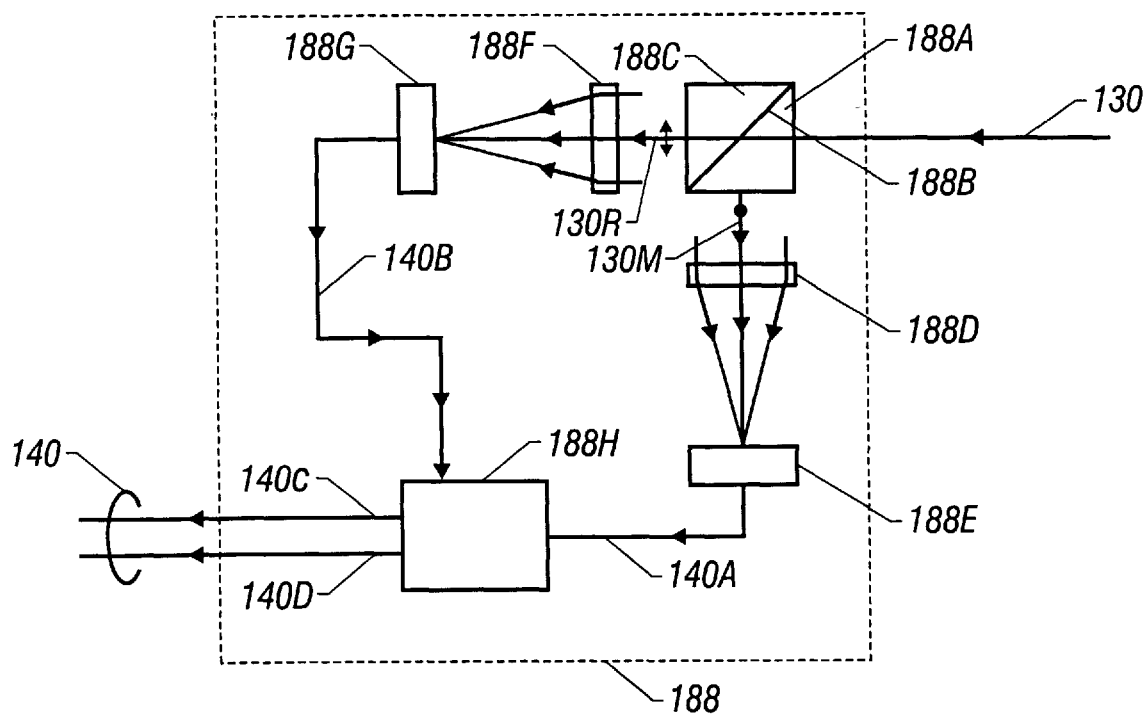

The elements of detector 188 are depicted, in schematic form, in FIG. 1e. Beam 130 enters a polarizing beam splitter comprising prisms 188A and 188C with polarizing interface 188B. The measurement beam component of beam 130, being polarized orthogonal to the plane of FIG. 1e is reflected by polarizing interface 188B as beam 130M. Beam 130M is focused by lens 188D to a spot on detector 188E such as a quad cell detector, a two-dimensional high speed CCD camera, or a lateral effect photodiode. Two-dimensional data arrays are transmitted as electronic signal 140A to electronic processor 188H for subsequent processing. The location of the spot on detector 188E is not effected by a lateral shear of beam 130M but a change in the direction of propagation beam 130M does shift the location of the spot on detector 188E. Thus the electronic signal contains information about the direction of propagation of beam 130M.

The reference beam component of beam 130, being polarized in the plane of FIG. 1e is transmitted by polarizing interface 188B as beam 130R. Beam 130R is focused by lens 188F to a second spot on a second detector 188G such as a quad cell detector, a two-dimensional high speed CCD camera, or a lateral effect photodiode. Two-dimensional data arrays are transmitted as electronic signal 140B to electronic processor 188H for subsequent processing. The location of the second spot on detector 188G is not effected by a lateral shear of beam 130R but a change in the direction of beam 130R does shift the location of the second spot on detector 188G. Thus the electronic signal 130R contains information about the direction of propagation of beam 130R.

Electronic processor 188H processes the electronic signals 140A and 140B to generate two electronic signals 140C and 140D where the two electronic signals 140C and 140D are proportional to the difference in the directions of propagation of the measurement and reference beam components of beam 130 in two orthogonal planes. Electronic signals 140C and 140D comprise electronic signal 140.

Electrical signal 140 is transmitted to orientation/translation transducer 159. Information contained in signal 140 is used as the error signal in a servo system to alter the orientation of beam steering mirror 158 by orientation/translation transducer 159 so as to maintain in two dimensions the direction of propagation of measurement beam 123 substantially constant independent of changes of orientation of measurement object mirror 170 about two orthogonal axes. Under the condition that the physical path length of the measurement beam from the location of the first redirection of the measurement beam by the beam steering element 158 to measurement object mirror 170 is equal to the physical path length of the measurement beam from measurement object mirror 170 to the location of the second redirection of the measurement beam by the beam steering mirror 158, there will be no lateral shear of beam 123 at beam steering element 158 when changes in orientation of measurement object mirror 170 are compensated by changes in orientation of beam steering element 158. This condition with respect to physical path lengths will be referenced as the first embodiment condition.

Compliance with the first embodiment condition eliminates the lateral shear of measurement beam 123 at beam steering element 158 when changes in orientation of measurement object mirror 170 are compensated by changes in orientation of beam steering element 158. However, there will be introduced lateral shear of reference beam 126 when changes in orientation of measurement object mirror 170 are compensated by changes in orientation of beam steering element 158. Although a lateral shear will be introduced in reference beam 126, the magnitude of the lateral shear is significantly reduced in relation to the lateral shear introduced in measurement beam components of prior art plane mirror interferometers due to changes in orientation of the measurement object mirror, the reduction factor being proportional to the ratio of the physical length of the reference leg to the physical length of the measurement leg of an interferometer.

For certain end use applications, it may be desirable to introduce a translation of beam steering element 158 in a direction nominally parallel to the direction of propagation of 123. A translation of this type for beam steering element 158 is controlled by the signal processor and computer 194 through electrical signal 144 transmitted to orientation/translation transducer 159.

The inventive use of an active servo control of an adjustable element makes it possible to perform accurate displacement measurements to measurement object mirror 170 using a single pass of a measurement beam to measurement object mirror 170. For applications where the first embodiment condition is satisfied to a certain relative precision, the inventive technique reduces (to the certain relative precision) measurement object mirror 170 orientation-dependent errors in the phase of the measurement beam relative to the phase of reference beam caused by lateral beam shear and uncompensated dispersive properties of the elements of the interferometer.

The interferometer and beam steering assembly of the first embodiment are configured such that a displacement of beam steering element 158 does not effect in at least in second order the optical path length of the measurement beam relative to the optical path length of the reference beam; both the reference and measurement beams have their directions of propagation redirected twice by beam steering element 158 with substantially the same angles of incidence in each instance of redirection, the centroids of the paths of the reference and measurement beams entering beam steering element 158 are substantially coextensive, and the centroids of the paths of the reference and measurement beams exiting beam steering element 158 are substantially coextensive. An example from the set of lowest order effects of a displacement of beam steering element 158 on the optical path length of the measurement beam relative to the optical path length of the reference beam will be first order in the magnitude of the displacement of beam steering element 158, first order in the magnitude of a change of orientation of the measurement object mirror 170, and first order in some uncompensated errors in the figure of one or more surfaces of elements of the interferometer.

The interferometer and the beam steering assembly are configured such that changes in the orientations of the object mirror (about the center of a measurement beam spot on the object mirror) and/or of beam steering element 158 do not effect in first order the optical path length of the measurement beam relative to the optical path length of the reference beam; the residual second order effect is proportional the difference in the path lengths of the measurement and reference beams and proportional to a factor which is second order in the angular change in orientation of the object mirror about an orientation corresponding to the measurement beam spot. The magnitude of the second order effect is reduced by the single-pass of the measurement beam to the measurement object relative to multiple-pass arrangements.

Figure 1F:
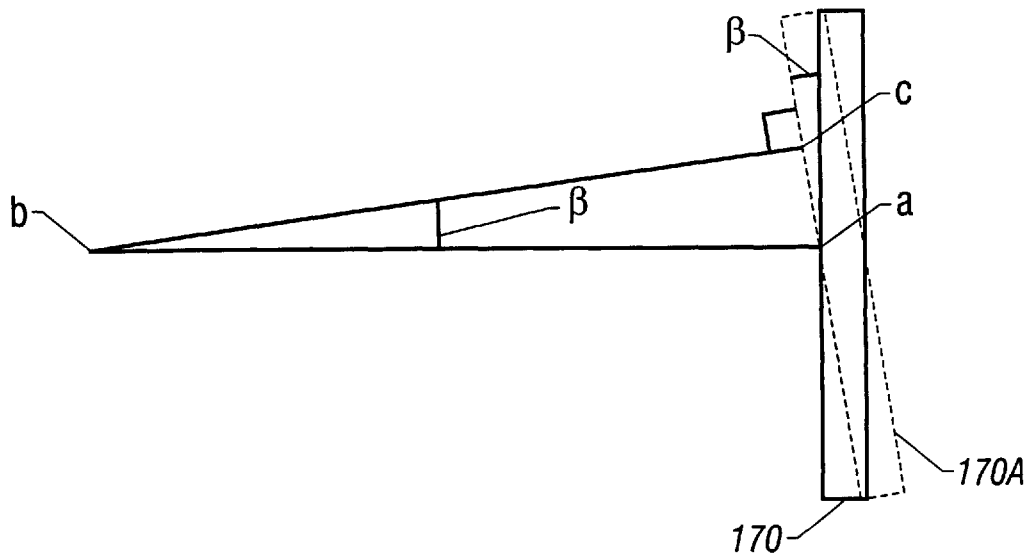

The second order effect cited in the preceding paragraph is described with the aid of FIG. 1f. FIG. 1f depicts in schematic form the equivalent path of the measurement beams for a first case of object mirror at initial angular orientation and for a second case of measurement object mirror 170 with a change in orientation in the plane of FIG. 1*f*. Measurement object mirror 170 for the second case is shown as measurement object mirror 170A rotated about point a by an angle β. The distance measured by the interferometer for case one is twice the distance between the points a and b, the distance between the points a and b being denoted by ab. The line from point b to point c is orthogonal to the surface of measurement object mirror 170A as a consequence of the action of the beam steering element 158 controlled of the servo system. Therefore the distance measured by the interferometer for case two is twice the distance between the points b and c, the distance between the points b and c being denoted by bc. The distance 2bc is related to the distance 2ab as $$2bc = 2ab\cos\beta \tag{1}$$

The cosine factor in equation (1) differs from the value of one by a term that is second order β, i.e. $\beta^2/2$.

Another feature of the first embodiment is that there will be no lateral shear of either the measurement or reference beams and beam components in at least first order produced by a translation of beam steering element 158 in the nominal direction of propagation of beams exiting beam steering element 158; the directions of propagation of the reference and measurement beams entering and exiting beam steering element 158 are substantially parallel.

A notable feature of the first embodiment is that the interferometer and the beam steering assembly is of the noninverting type, i.e. corresponding points in the wavefront amplitudes of the reference and measurement beam components of input beam 110 map to substantially superimposed points in the wavefront amplitudes of the reference and measurement beam components of output beam 130 and of the reference and measurement beam components of output beam 132. Associated with this latter feature is a concomitant feature that the angle between the reference and measurement beam components of beam 130 and the angle between the reference and measurement beam components of beam 132 are not effected in first and higher orders by changes in the direction of propagation of input beam 110.

It will be apparent to those skilled in the art that as a consequence of the concomitant feature cited in the last paragraph, detector 188 can perform its function in the servo system by detecting changes in a lateral position in one or two orthogonal directions of the measurement beam component of the first output beam 130 if the direction of propagation of the input beam 110 is fixed without departing from either the spirit or the scope of the present invention. To change the properties of detector 188 from the detection of a change in direction of propagation of a particular beam in one plane to the detection of a lateral shear in the one plane, a portion of the particular beam is split off by a nonpolarizing beam splitter and transmitted without passing through a focusing lens directly to a detector such as a dual cell detector, the dual cell detector being orientated to detect the lateral shear. The dual cell detector is sensitive to a lateral shear of the particular beam but not sensitive to a change at the dual cell detector in the direction of propagation of the particular beam. To change the properties of detector 188 from the detection of changes in direction of propagation in two orthogonal planes of a particular beam to the detection of a lateral shear in two orthogonal directions, the particular beam is transmitted without passing through a focusing lens directly to a detector such as a quad cell detector. The quad cell detector is sensitive to a lateral shear of the particular beam but not sensitive to a change at the quad cell detector in the direction of propagation of the particular beam.

It will further be evident to those skilled in the art that in an application of the first embodiment to a lithographic stepper/scanner, the measurement object mirror can be attached to a wafer stage and the reference mirror can be attached to a lens assembly, the lens assembly used to focus an exposure radiation beam onto a wafer, to form a column reference without departing from the scope or spirit of the invention.

There are several additional advantages of the first embodiment. One additional advantage is that the paths for the measurement beam and reference beam are highly symmetric, meaning generally that for each segment of the measurement beam path there is a substantially parallel corresponding segment of the reference beam path except for the variable air path defined by the location of the measurement object mirror 170 and quarter wave phase retardation plate 168. Further, the measurement beam and the reference beam can be made to pass through the same amount of glass and air, exclusive only of the variable air path defined by the location of measurement object mirror 170 and quarter wave phase retardation plate 168, by replacing with glass a section of the path of reference beam 114 that is in air (cf. FIG. 1*b*). This symmetry leads to high thermal and mechanical stability.

Another additional advantage is that the measurement beam and reference beam each reflect from the same flat surfaces, including the surfaces of the retroreflector 172, an equal number of times except for surfaces 152 and 156 of rhomboidal prism 154 of the first beam splitting assembly, surfaces 162 and 184 of dove prism 182 of the second beam splitting assembly, and measurement object mirror 170 and reference mirror 178. This greatly reduces the requirements for parallelism of the various reflecting surfaces of the first embodiment.

Another additional advantage is that the first embodiment is comprised of easily fabricated optical components. Retroreflector 172 may be of the common type, either solid or hollow. The first and second beam splitting assemblies may be fabricated from ordinary right angle prisms, dove prisms, and rhomboidal prisms. The beam steering element 158 being a trapezoidal shape prism which may be easily fabricated, either solid or hollow. The trapezoidal shape prism may be fabricated in particular by truncating an equilateral prism.

Another additional advantage is that there are very few opportunities for ghost reflections, that is spurious reflections, particularly with regard to spurious multiple passing of beams to measurement object mirror 170. This characteristic reduces the possibility for generation of cyclic errors in the relative phase of the measurement and reference beams measured by the inventive apparatus, cyclic errors that are common to prior-art plane-mirror interferometers.

Another feature of the first embodiment is that beam steering element 158 effects changes in the ellipticity of reflected beams that is of the order of or less than the changes in orientation of beam steering element 158. The effect on the cyclic errors in the measured relative phase difference between the measurement and reference beams is typically a third order effect; an example of one effect is an effect first order in the size of the initial value of the cyclic error and second order in the change in orientation of beam steering element 158 about a preselected orientation.

Another feature of the first embodiment is a simple alignment procedure. The existence of a relative angle detector in detector 188 simplifies alignment of the apparatus as follows. By blocking the measurement beam between quarter wave phase retardation plate 168 and measurement object mirror 170, electrical error signal 188 becomes indicative of the alignment of entrance beam 110, assuming that all other alignments are correct. Viewing this signal through additional display means (not shown) provides information on how best to align entrance beam 110.

As a further improvement upon the alignment procedure, the first and second beam splitting assemblies may be provided with additional servo control and additional orientation/translation transducers (not shown) to automatically align the apparatus of the first embodiment by adjustment of the angular orientation and/or position of the first and second beam splitting assemblies. As an alternative to the further improvement upon the alignment procedure, reference mirror 178 may be provided with additional servo control and additional orientation transducers (not shown) to automatically align the apparatus of the first embodiment by adjustment of the angular orientation of reference mirror 178.

All surfaces of elements of the first embodiment through which beams are transmitted are antireflection coated to maintain a high transmission efficiency for the interferometer.

It will be evident to those skilled in the art that depending upon the end use application, the first embodiment may be implemented to compensate for changes in orientation of the measurement object mirror about only one axis of rotation instead of two orthogonal axes of rotation without departing either from the scope or spirit of the present invention.

FIGS. 2a–2f depict, in schematic form, the second embodiment of the present invention for measuring a linear displacement of an object substantially independent of the orientation of the object and substantially independent of a lateral displacement of the object, the lateral displacement being orthogonal to the linear displacement. The second embodiment is from the first class of embodiments and variants thereof operating in the first mode of operation for changes in orientation of the object about two orthogonal axes. The second embodiment uses beam polarization encoding for beam identification and control of beam paths in certain steps relating to a steering element where the first embodiment uses spatial separation of beams for keeping tract of the identity of reference and measurement beams in other certain steps relating to the steering element.

The second embodiment comprises light beam 210, a light beam steering assembly comprising beam steering element 270 and orientation/translation transducer 271, a first, second, third, and fourth beam splitting assemblies BAS1, BAS2, BAS3, and BAS4, respectively, retroreflector 293, measurement object mirror 284 comprised of a single reflecting surface, and reference beam mirror 265 comprised of a single reflecting surface. Prisms 250, 254, 258, 262, 267, 269, 272, and 296, half-wave phase retardation plates 260 and 294, and quarter wave phase retardation plate 268 comprise the first beam splitting assembly BAS1 wherein interface surfaces 252, 256, 266, and 298 are polarizing beam splitting interfaces, and surfaces 264 and 274 are reflecting surfaces (cf. FIG. 2b). Prisms 276 and 277 comprise the second beam splitting assembly BAS2 wherein interface 280 is a polarizing beam splitting interface and surface 278 is a reflecting surface (cf. FIG. 2e). Prisms 286 and 292 comprise the third beam splitting assembly BAS3 wherein interface 288 is a polarizing beam splitting interface (cf. FIG. 2d). Prisms 251 and 255 comprise the fourth beam splitting assembly BAS4 wherein interface 253 is a nonpolarizing beam splitting interface (cf. FIG. 2a).

The second embodiment is adapted for use as a heterodyne interferometer system. The descriptions of light beam 210 and the source of beam 210 are the same as the corresponding descriptions given for light beam 110 and the source of beam 110 of the first embodiment.

Figure 2A:
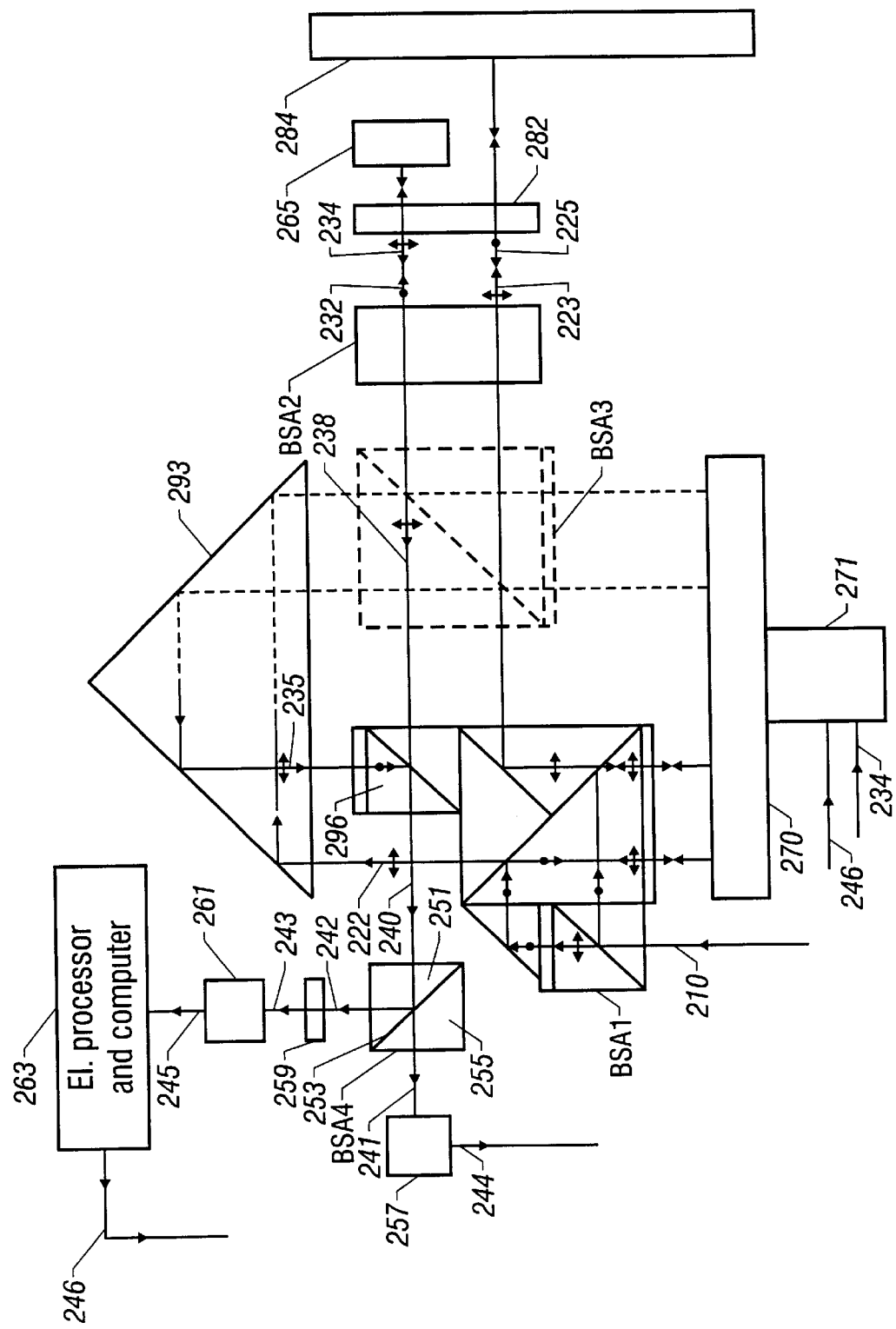
FIGS. 2a–2f are schematic drawings of a second embodiment of the interferometry system.
Figure 2B:
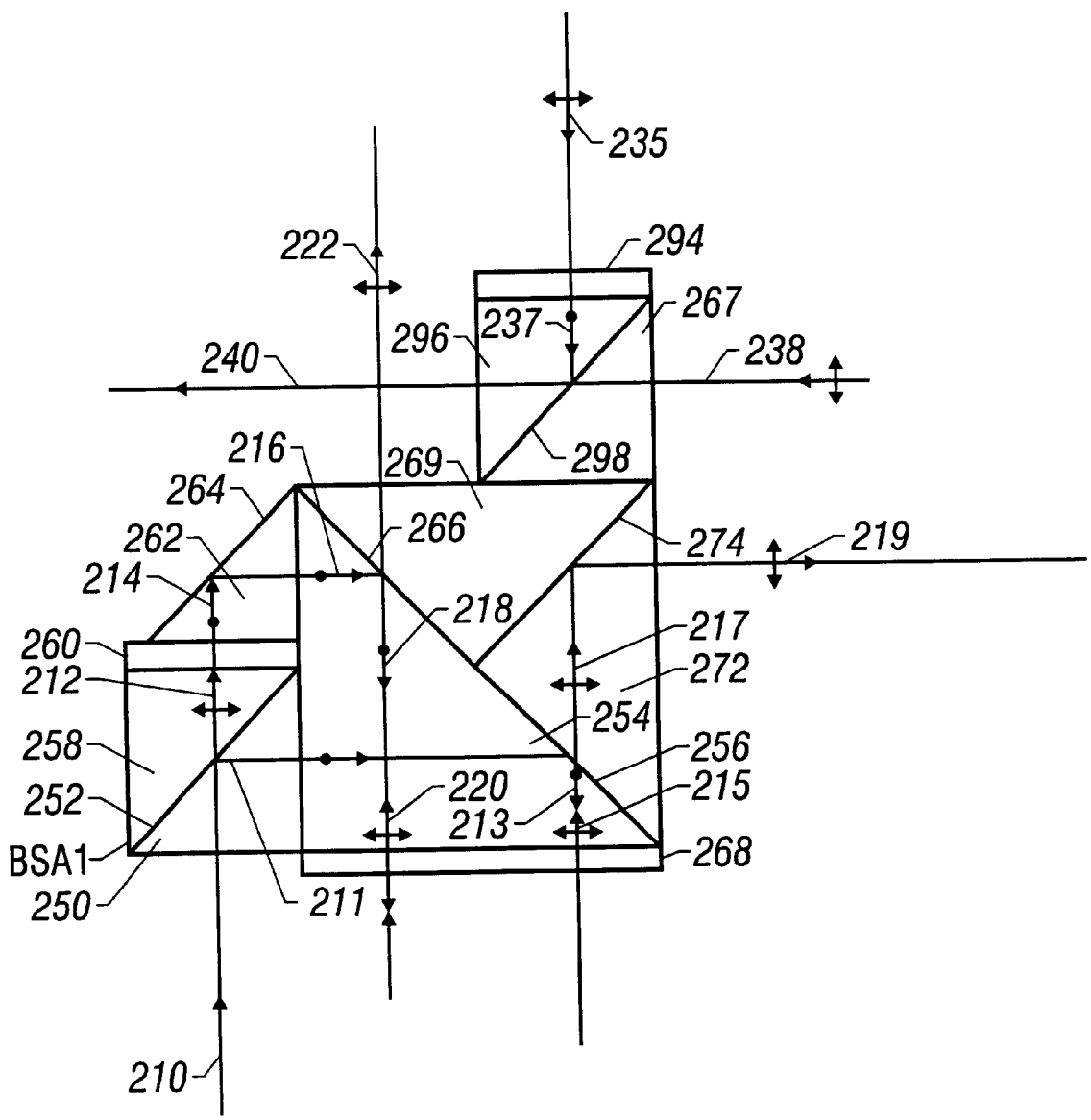
Figure 2C:
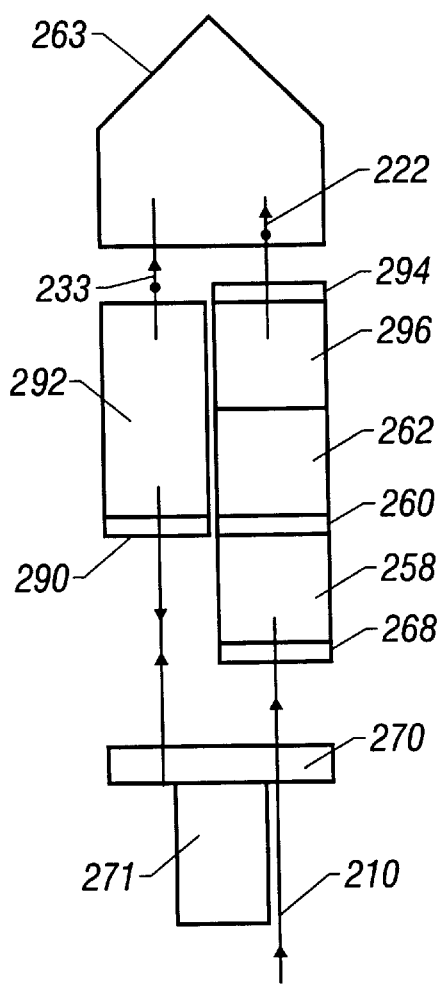

Beam 210 as illustrated in FIG. 2b, impinges on BAS1 with a portion of beam 210 reflected by interface 252 as beam 211 and beam 211 is reflected by interface 256 as measurement beam 213. Beam 213 is polarized orthogonal to the plane of FIG. 2b. A second portion of beam 210 is transmitted by interface 252 as reference beam 212 polarized in the plane of FIG. 2b.

Beam 213 is transmitted by quarter wave phase retardation plate 268 as a circularly polarized beam, reflected by beam steering element 270 as a beam with opposite-handed circular polarization, and subsequently transmitted by quarter wave phase retardation plate 268 as beam 215 linearly polarized in the plane of FIG. 2a (cf. FIG. 2b). Beam steering element 270 is comprised of a single reflecting surface. Beam 215 is transmitted by polarizing interface 256 as beam 217 of BAS1. Beam 217 is reflected by reflecting interface 274 and exits BAS1 as beam 219.

Beam 219 enters BAS2 (cf. FIG. 2e) and is reflected by reflecting surface 278 as beam 221 and beam 221 is reflected by polarizing beam splitting interface 280 as beam 223.

Figure 2E:
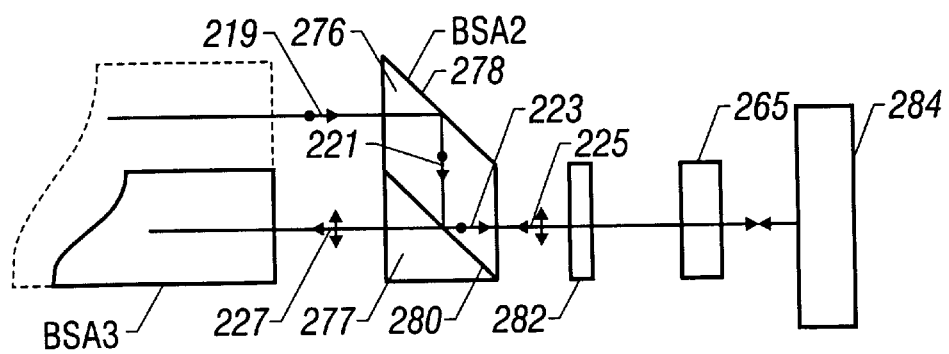

Beam 223, being polarized orthogonal to the plane of FIG. 2e, is transmitted by quarter wave phase retardation plate 282 as a circularly polarized beam, reflected by measurement object mirror 284 as a beam with opposite-handed circular polarization, and subsequently transmitted by quarter wave phase retardation plate 282 as beam 225 linearly polarized in the plane of FIG. 2e and orthogonal to the plane of FIG. 2a.

Figure 2F:
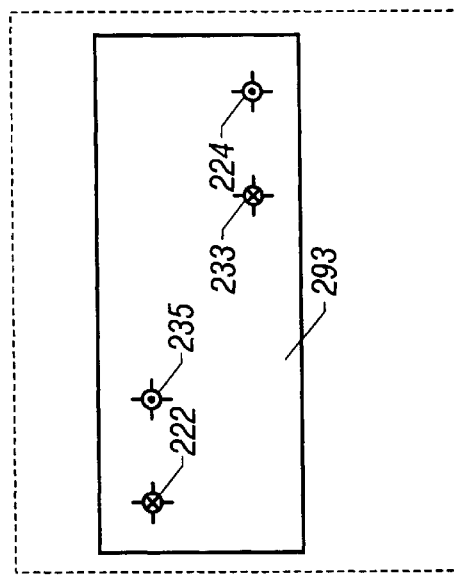
Figure 2D:
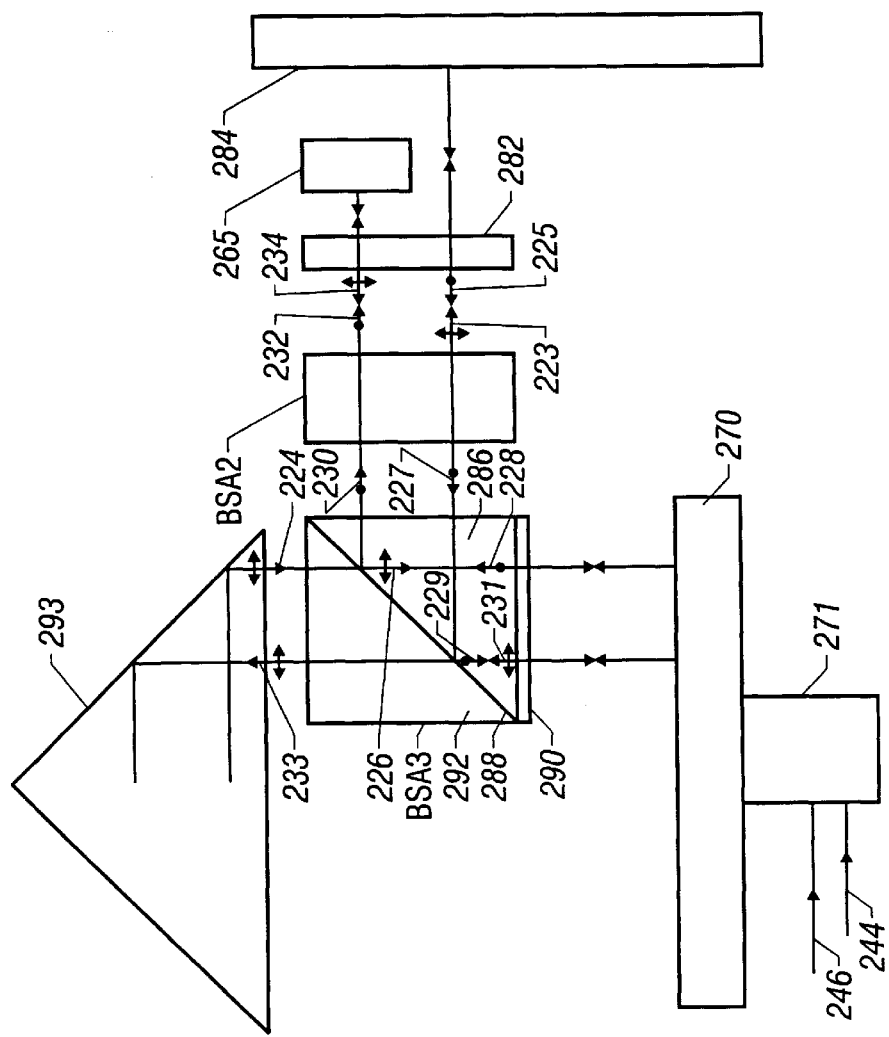

Beam 225 enters BAS2 and is transmitted by polarizing beam splitting interface 280 as beam 227. Beam 227 exits BAS2, enters BAS3 (cf. FIG. 2d), and is reflected by the polarizing beam splitting interface 288 as beam 229. Beam 229, being polarized orthogonal to the plane of FIG. 2d, is transmitted by quarter wave phase retardation plate 290 as a circularly polarized beam, reflected by steering mirror 270 as a beam with opposite-handed circular polarization, and subsequently transmitted by quarter wave phase retardation plate 290 as beam 231 linearly polarized in the plane of FIG. 2d. Beam 231 is transmitted by polarizing beam splitting interface 288 as beam 233.

Beam 233 enters retroreflector 293 (cf. FIG. 2d) and is retroreflected as beam 235 (cf. FIG. 2a). Beams 233 and 235 are shown in FIG. 2f as beams entering and exiting, respectively, retroreflector 293.

Reference beam 212, polarized in the plane of FIG. 2b, is transmitted by half-wave phase retardation plate 260 as beam 214, half-wave phase retardation plate 260 being orientated so the beam 214 is polarized orthogonal to the plane of FIG. 2b. Beam 214 is reflected by reflecting surface 264 as beam 216 and beam 216 is reflected by polarizing beam splitting interface 266 as beam 218. Beam 218, being polarized orthogonal to the plane of FIG. 2b, is transmitted by quarter wave phase retardation plate 268 as a circularly polarized beam, reflected by steering mirror 270 as a beam with opposite-handed circular polarization, and subsequently transmitted by quarter wave phase retardation plate 268 as beam 220 linearly polarized in the plane of FIG. 2b. Beam 220 is transmitted by polarizing beam splitting interface 266 as beam 222.

Beam 222 enters retroreflector 293 (cf. FIG. 2a) and is retroreflected as beam 224 (cf. FIG. 2d). In FIG. 2f, beams 222 and 224 are shown as beams entering and exiting, respectively, retroreflector 293. Beam 224 enters BAS3 and is transmitted by polarizing beam splitting interface 288 as beam 226 (cf. FIG. 2d). Beam 226, being polarized in the plane of FIG. 2d, is transmitted by quarter wave phase retardation plate 290 as a circularly polarized beam, reflected by beam steering mirror 270 as a beam with opposite-handed circular polarization, and subsequently transmitted by quarter wave phase retardation plate 290 as beam 228 linearly polarized orthogonal to the plane of FIG. 2d. Beam 228 is reflected by polarizing beam splitting interface 288 as beam 230.

Beam 230 enters BAS2 (cf. FIG. 2d) and is transmitted by polarizing beam splitting interface 280 as beam 232. The projections of beam 223 and 232 are superimposed in the plane of FIG. 2e. Beam 232, being polarized orthogonal to the plane of FIG. 2d, is transmitted by quarter wave phase retardation plate 282 as a circularly polarized beam, reflected by reference mirror 265 as a beam with opposite-handed circular polarization, and subsequently transmitted by quarter wave phase retardation plate 282 as beam 234 linearly polarized in the plane of FIG. 2d.

Beam 234 enters BAS2, reflected by polarizing beam splitting interface 280, and subsequently reflected by reflecting surface 278 as beam 238 (cf. FIG. 2a).

Beam 235 enters BAS1 and, being polarized in the plane of FIG. 2b, is transmitted by half-wave phase retardation plate 294 as beam 237. Half-wave phase retardation plate 294 is orientated so that beam 237 is polarized orthogonal to the plane of FIG. 2b. Beam 237 is reflected by polarizing beam splitting interface 298 as one component of output beam 240. Beam 238 is transmitted by polarizing beam splitter interface 298 as a second component of output beam 240.

As shown in FIG. 2a, beam 240 enters BAS4 and a first portion of output beam 240 is transmitted by nonpolarizing beam splitting interface 253 as the first output beam 241. First output beam 241 impinges on detector 257 to produce an electrical signal 244 related to any difference in the directions of propagation of measurement and reference beam components in first output beam 241 in two orthogonal planes.

A second portion of beam 240 is reflected by nonpolarizing beam splitting interface 253 as the second output beam 242. Beam 242 is transmitted by a polarizer 259 orientated to produce a mixed optical beam 243. Beam 243 impinges on detector 261 to generate electrical signal 245 related to the difference in phase of the measurement and reference beam components of mixed beam 243. Electrical signal 245 is transmitted to electronic processor and computer 263 for subsequent processing for information about the difference in phase of the measurement and reference beam components of mixed beam 243.

Electrical signal 244 is transmitted to orientation/translation transducer 271. Information contained in signal 244 is used as the error signal in a servo system to alter the orientation of beam steering mirror 270 by orientation/translation transducer 271 so as to maintain the direction of propagation of measurement beam 237 substantially constant independent of changes of orientation of object mirror 284.

The remaining description of the second embodiment is the same as corresponding portions of the description of the first embodiment except with regard to generation of cyclic errors. The additional phase retardation plates in the second embodiment in relation to the first embodiment increase the number of possibilities for the generation of cyclic errors in the relative phase measured between the reference and measurement beam components of the output beam. However, the cyclic errors generated in the second embodiment as a result of the additional phase retardation plates are generally substantially less than corresponding cyclic errors present in prior art plane mirror interferometers, a consequence principally because there is only one pass to the measurement object mirror 284 by the measurement beam in the second embodiment in comparison to the double pass to a measurement object mirror by the measurement beam in many prior art plane mirror interferometers.

FIGS. 3a–3f depict, in schematic form, the third embodiment of the present invention for measuring a linear displacement of an object substantially independent of the orientation of the object and substantially independent of a lateral displacement of the object, the lateral displacement being orthogonal to the linear displacement. The third embodiment is from the first class of embodiments and variants thereof operating in the first mode of operation for changes in orientation of the object about a first axis and in the second mode of operation for changes in orientation of the object about a second axis orthogonal to the first axis and/or a lateral displacement of the object, the lateral displacement being orthogonal to both the second axis and the linear displacement.

The interferometer system of the first and third embodiments are generically similar except with respect to the reflecting properties of the object: the reflecting properties of the object for the first embodiment are those of a plane mirror and the reflecting properties of the object for the third embodiment are those of a roof prism.

The third embodiment comprises light beam 310, a light beam steering assembly comprising beam steering element 362 and orientation/translation transducer 363, a first, second, third, and fourth beam splitting assemblies BAS1, BAS2, BAS3, and BAS4, respectively, retroreflector 368, measurement object roof prism 366, and reference beam prism 364. Rhomboidal prism 350 and prism 354 comprise the first beam splitting assembly BAS1 wherein interface 352 is a polarizing beam splitting interface and surface 356 is a reflecting surface (cf. FIG. 3b). Prisms 358 and 370 comprise the second beam splitting assembly BAS2 wherein interface 360 is a reflecting interface (cf. FIG. 3a). Prisms 372 and 376 comprise the third beam splitting assembly BAS3 wherein interface 374 is a reflecting interface (cf. FIG. 3d). Rhomboidal prisms 378 and 384 comprise the fourth beam splitting assembly BAS4 wherein interface 380 is a nonpolarizing beam splitting interface and surfaces 382 and 386 are reflecting surfaces (cf. FIG. 3e).

The third embodiment is adapted for use as a heterodyne interferometer system. The descriptions of light beam 310 and the source of beam 310 are the same as the corresponding descriptions given for the light beam 110 and the source of beam 110 of the first embodiment.

Figure 3A:
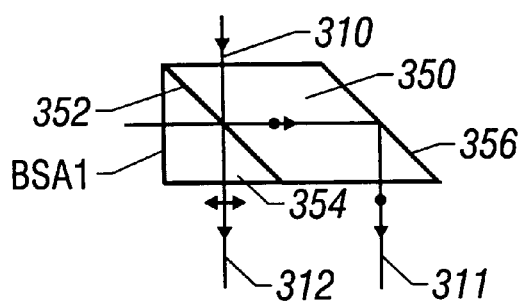
Figure 3E:
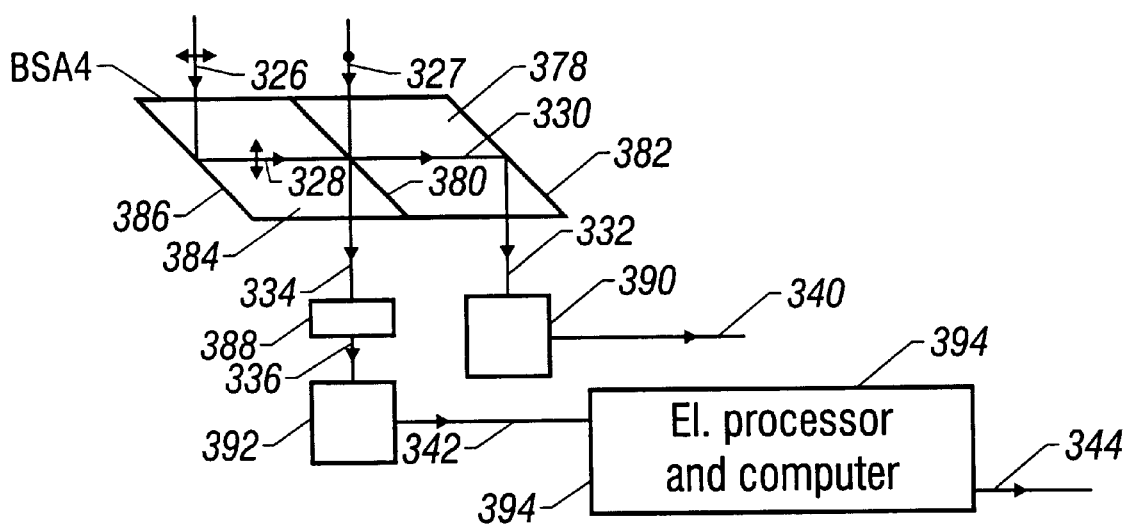

Beam 310, as illustrated in FIG. 3a, impinges BAS1 with a portion of beam 310 reflected by interface 352 and reflected by surface 356 as measurement beam 311. Beam 311 is polarized orthogonal to the plane of FIG. 3a. A second portion of beam 310 is transmitted by interface 352 as reference beam 312 polarized in the plane of FIG. 3a.

Beam 311, as illustrated in FIG. 3b, impinges on BAS2 and is reflected by interface 360 as measurement beam 313. Beam 313 is polarized in the plane of FIG. 3b.

Beam 313 enters beam steering element 362 (cf. FIG. 3b) and exits beam steering element 362 as beam 315 (cf. FIG. 3d) displaced laterally from beam 313 and propagating in a direction nominally opposite to the direction of propagation of beam 313. The projections of beam 313 and of beam 315 on the plane of FIG. 3b are superimposed. In beam steering element 362, beam 313 is reflected in a sequence, e.g., by total internal reflection, by each of the surfaces 362A, 362B, and 362C (cf. FIG. 3c which presents an side view of the interferometer depicted in FIGS. 3b and 3d). Beam steering element 362 and orientation/translation transducer 363 comprise the beam steering assembly that redirects measurement beam 313. Orientation/translation transducer 363 preferably alters the orientation of beam steering element 362 about a nodal point of retroreflector 368 for a change in orientation in the plane of FIG. 3c, changes in orientation of beam steering element 362 about a nodal point of retroreflector 368 producing substantially reduced lateral shear effects experienced by the reference beam, and/or the location beam steering element 362 in the nominal direction of propagation of beam 313. The orientation of beam steering element 362 is controlled by electronic signal 340. The location of beam steering element 362 is controlled by electronic processor and computer 394 through electronic signal 344.

Figure 3D:
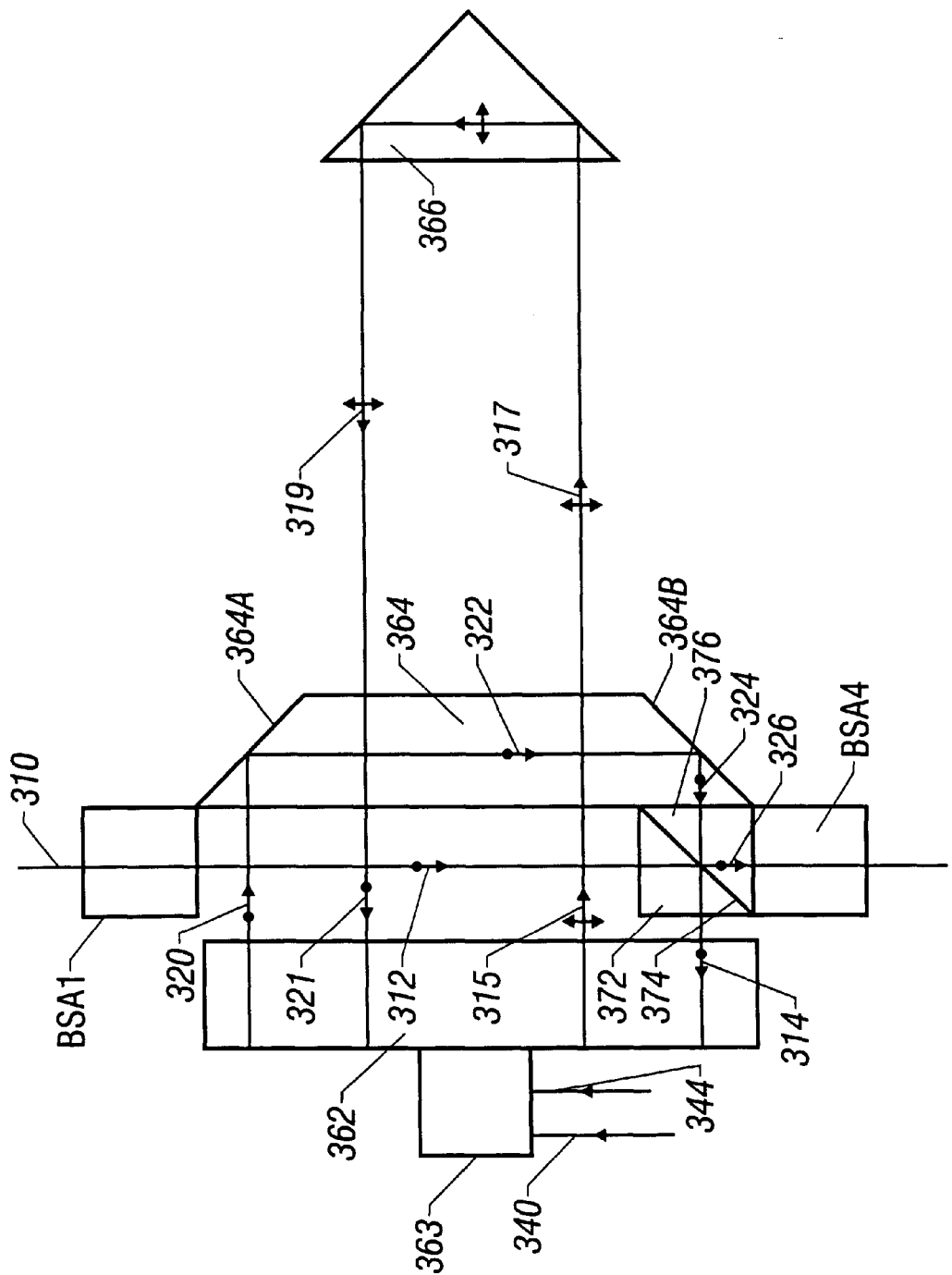

Beam 315 is transmitted by dove prism 364 as beam 317 (cf. FIG. 3d). Beam 317 is reflected by measurement object roof prism 366 as beam 319 linearly polarized in the plane of FIG. 3d. The projections of beam 317 and beam 319 on the plane of FIG. 3c are superimposed. Measurement object roof prism 366 may be of either solid or hollow construction. Beam 319 is transmitted by dove prism 364 as beam 321.

Beam 321 enters beam steering element 362 (cf. FIG. 3d) and exits beam steering element 362 as beam 323 (cf. FIG. 3b) propagating in a direction nominally opposite to the direction of propagation of beam 321. Beam 323 enters retroreflector 368 (cf. FIG. 3b) and is retroreflected as beam 325. An end view of retroreflector 368 and dove prism 364 is depicted in FIG. 3f. Beam 325 enters BAS2 and is reflected by interface 360 as beam 327.

Reference beam 312 enters BAS3 and is reflected by interface 374 as beam 314 (cf. FIG. 3d). Beam 314 enters beam steering element 362 (cf. FIG. 3d) and exits beam steering element 362 as beam 316 (cf. FIGS. 3b and 3d) propagating in a direction nominally opposite to the direction of propagation of beam 314. The projections of beam 316 and of beam 314 on the plane of FIG. 3b are superimposed. The projections of beam 316 and of beam 313 on the plane of FIG. 3c are superimposed. Beam 316 enters retroreflector 368 and is retroreflected as beam 318 (cf. FIG. 3b). Beam 318 enters beam steering element 362 (cf. FIG. 3b) and exits beam steering element 362 as beam 320 (cf. FIG. 3d) propagating in a direction nominally opposite to the direction of propagation of beam 318.

Measurement beams 323 and 325 and reference beams 316 and 318 lie in the same top beam plane (cf. FIG. 3b). Measurement beams 315 and 321 and reference beams 314 and 320 lie in the same bottom beam plane (cf. FIG. 3d).

Beam 320 enters dove prism 364 and is reflected by surfaces 364A and 364B as beam 324. Dove prism 364 functions as a roof prism in redirecting beam 320 as beam 324 in the same manner as measurement object roof prism 366 functions in redirecting beam 317 as beam 319. Beam 324, orthogonally polarized to the plane of FIG. 3d, enters BAS3 and is reflected by interface 374 as beam 326.

Beam 327 enters BAS4 (cf. FIG. 3e) and a first portion of beam 327 is reflected by nonpolarizing beam splitting interface 380 as one component of a first output beam 330. Beam 326 enters BAS4 and is reflected by surface 386 as beam 328. A first portion of beam 328 is transmitted by beam splitting interface 380 as a second component of the first output beam 330. First output beam 330 is reflected by surface 382 as output beam 332. Output beam 332 impinges on detector 390 to produce an electrical signal 340 with one component related to any lateral shear of the measurement beam component of output beam 332 in the plane of FIG. 3d, i.e. orthogonal to the plane of FIG. 3e, and a second component to related to any difference in the directions of propagation of measurement and reference beam components in output beam 332 orthogonal to the plane of FIG. 3d, i.e. in the plane of FIG. 3e.

A second portion of beam 327 is transmitted by nonpolarizing beam splitting interface 380 as one component of a second output beam 334. A second portion of beam 328 is reflected by nonpolarizing beam splitting interface 380 as a second component of the second output beam 334. Beam 334 is transmitted by a polarizer 388 that is orientated to produce a mixed optical beam 336. Beam 336 impinges on detector 392 to generate electrical signal 342 related to the difference in phase of the measurement and reference beam components of mixed beam 336. Electrical signal 342 is transmitted to electronic processor and computer 394 for subsequent processing for information about the difference in phase of the measurement and reference beam components of mixed beam 336.

Electrical signal 340 is transmitted to orientation/translation transducer 363. Information contained in signal 340 is used as the error signals in a servo system to alter the orientation of beam steering element 362 by orientation/translation transducer 363 so as to maintain both the lateral shear of beam 327 in the plane of FIG. 3b and the direction of propagation of measurement beam 327 in a plane orthogonal to the plane of FIG. 3b substantially constant independent of changes of orientation of measurement object roof prism 366. Under the condition that the physical path length of the measurement beam from the first redirection by the beam steering element 362 to measurement object roof prism 366 is equal to the physical path length of the measurement beam from measurement object roof prism 366 to the second redirection by beam steering element 362, there will be no lateral shear of beam 327 orthogonal to the plane of FIG. 3b when changes in orientation of measurement object roof prism 366 are compensated by changes in orientation of beam steering mirror 362. This condition with respect to physical path lengths will be referenced as the third embodiment condition.

Compliance with the third embodiment condition eliminates the lateral shear of measurement beam 323 at beam steering element 362 when changes in orientation of measurement object roof prism 366 are compensated by changes in orientation of beam steering element 362. However, there will be introduced lateral shear of reference beam 316 when changes in orientation of measurement object roof prism 366 are compensated by changes in orientation of beam steering element 362 Although a lateral shear will be introduced in reference beam 316, the magnitude of the lateral shear is significantly reduced in relation to the lateral shear introduced in measurement beam components of prior art plane mirror interferometers due to changes in orientation of the object mirror, the reduction factor being proportional to the ratio of the physical length of the reference leg to the physical length of the measurement leg of an interferometer.

The remaining description of the third embodiment is the same as corresponding portions of the description given for the first embodiment.

A first variant of the third embodiment of the present invention is described for measuring the linear displacement of an object substantially independent of the orientation of the object and substantially independent of a lateral displacement of the object, the lateral displacement being orthogonal to the linear displacement. The first variant of the third embodiment is from the first class of embodiments and variants thereof operating in the second mode of operation for changes in orientation of the object about two orthogonal axes and/or for a lateral displacement of the object, the lateral displacement being orthogonal to the linear displacement.

The interferometer system and at least one beam steering assembly of the first variant of the third embodiment comprise the same elements as the interferometer system and at least one beam steering assembly of the third embodiment except for the object element, the detector of a certain optical beam, a signal produced by the detector of the certain optical beam, and a respective servo system.

The measurement object element of the third embodiment, roof prism 366, is replaced by a measurement object retroreflector 366A (not shown in a figure) in the first variant of the third embodiment. As a consequence, the relative directions of propagation of the reference and measurement beam components of output beam 332A, the output beam of the first variant of the third embodiment corresponding to output beam 332 of the third embodiment, is substantially independent of changes in orientation of the beam steering element 362 of the first variant of the third embodiment. However a lateral translation of measurement object retroreflector 366A in a plane orthogonal to the direction of the linear displacement and/or a change in orientation of measurement object retroreflector 366A will generate a lateral displacement of measurement beam component of output beam 332A.

Detector 390A of the first variant of the third embodiment, corresponding to detector 390 of the third embodiment, detects the lateral displacement or shear of the measurement beam component of output beam 332A in two orthogonal directions and generates electrical signal 340A, the electrical signal corresponding to electrical signal 340 of the third embodiment.

Electrical signal 340A is transmitted to orientation/translation transducer 363 of the first variant of the third embodiment. Information contained in signal 340A is used as the error signal in a servo system to alter the orientation of beam steering element 362 by orientation/translation transducer 363 so as to maintain the lateral location of measurement beam component of output beam 332A substantially constant independent of a lateral translation of measurement object retroreflector 366A in a plane orthogonal to the direction of the linear displacement and/or substantially independent of changes in orientation of measurement object retroreflector 366A about two orthogonal axes.

The remaining description of the first variant of the third embodiment is the same as corresponding portions of the description given for the third embodiment.

FIGS. 4a–4f depict, in schematic form, the fourth embodiment of the present invention for measuring a linear displacement of an object substantially independent of the orientation of the object and substantially independent of a lateral displacement of the object, the lateral displacement being orthogonal to the linear displacement. The fourth embodiment is from the first class of embodiments and variants thereof operating in the first mode of operation for changes in orientation of the object about a first axis and in the second mode of operation for changes in orientation of the object about a second axis orthogonal to the first axis and/or a lateral displacement of the object, the lateral displacement being orthogonal to both the second axis and the linear displacement.

The interferometer system of the third and fourth embodiments are generically similar except with respect to the number of passes the measurement beam makes to the object and the associated number of passes made by the reference beam to a reference mirror: the measurement (reference) beam of the fourth embodiment traverses certain sections of the measurement (reference) path in two opposite directions of propagation where in the third embodiment, the corresponding measurement (reference) beam transits the certain sections in only one direction of propagation. Efficient separation of an output measurement (reference) beam component from an input measurement (reference) beam component in the multiple pass configuration of the fourth embodiment is effected by use of polarization encoding and polarizing beam splitters.

Many elements of the third and fourth embodiments perform like functions and these elements are indicated by a numeric numbering scheme wherein the numeric number of elements performing like functions for the fourth embodiment are equal to the numeric number of corresponding elements of the third embodiment incremented by 100. The certain sections of the reference and measurement beam paths are indicated by the numeric numbering scheme wherein the numeric number of the certain section of the reference or measurement path of the fourth embodiment having the same description as a corresponding path section of the third embodiment is equal to the numeric number of corresponding path section of the third embodiment incremented by 100.

For the certain sections of the measurement (reference) beam path for the fourth embodiment, there is a measurement (reference) beam traversing the certain sections in a reverse direction of propagation, the nonreverse or forward direction of propagation being associated with a first pass to the measurement object roof prism 466 (reference beam dove prism 464) and the reverse direction of propagation being associated with a second pass to the measurement object roof prism 466 (reference beam dove prism 464). The description of the additional measurement (reference) beam traversing the certain sections in a reverse direction are otherwise the same as the corresponding portions of the description given associated measurement (reference) beam traversing in a nonreverse direction of propagation for the third embodiment, the alphanumeric number of a measurement (reference) beam traversing in a reverse direction being equal to the numeric number of the associated measurement (reference) beam traversing in a nonreverse direction augmented with the suffix R.

The fourth embodiment comprises light beam 410, a light beam steering assembly comprising beam steering element 462 and orientation/translation transducer 463, a first, second, third, and fourth beam splitting assemblies, retroreflector 468, measurement object element 466 comprising a roof prism, reference beam element 464 comprising a dove prism, mirror 461, and quarter wave phase retardation plate 457. Rhomboidal prism 450 and prism 454 comprise the first beam splitting assembly BAS1 wherein interface 452 is a polarizing beam splitting interface and surface 456 is a reflecting surface (cf. FIG. 4a). Prisms 458 and 470 (cf. FIG. 4b) comprise the second beam splitting assembly BAS2 wherein interface 460 is a reflecting interface. Prisms 472 and 476 (cf. FIG. 4d) comprise the third beam splitting assembly BAS3 wherein interface 474 is a reflecting interface. Prisms 451, 453, and 465 and rhomboidal prism 467 comprise the fourth beam splitting assembly BAS4 (cf. FIG. 4e) wherein interface 455 is a nonpolarizing beam splitting interface, interface 469 is a polarizing beam splitting interface, and surface 471 is a reflecting surface.

The descriptions of the generation of measurement beam 427 and reference beam 426 is the same as the descriptions given for corresponding descriptions of the generation of measurement beam 327 and reference beam 326 of the third embodiment. As shown in FIG. 4e, beam 427 enters the fourth beam splitting assembly and a first portion of beam 427 is transmitted by nonpolarizing beam splitting interface 455 as measurement beam component 401 polarized orthogonal to the plane of FIG. 4e. A second portion of beam 427 is reflected by nonpolarizing beam splitting interface 455 as measurement beam component 403 polarized orthogonal to the plane of FIG. 4e. Beam 426 enters BAS4 and a first portion of beam 426 is transmitted by nonpolarizing beam splitting interface 455 as reference beam component 400 polarized in the plane of FIG. 4e. A second portion of beam 426 is reflected by nonpolarizing beam splitting interface 455 as measurement beam component 402 polarized in the plane of FIG. 4e.

Beam 401 is reflected by polarizing beam splitting interface 469 as one component of a first output beam 406. Beam 402 is reflected by reflecting surface 404 and beam 404 is transmitted by polarizing beam splitting interface 469 as a second component of the first output beam 406. First output beam 406 impinges on detector 496 to produce an electrical signal 441 with a first component related to any lateral shear of the measurement beam component of output beam 406 produced by a displacement of measurement object roof prism 466 in the plane of FIG. 4d and nominally orthogonal to the direction of propagation of beam 417 and/or a change in orientation of measurement object roof prism 466 about an axis perpendicular to the plane of FIG. 4d and with a second component related to any difference in the directions of propagation of measurement and reference beam components in output beam 406 produced by a change in orientation of the measurement object roof prism 466 about an axis in the plane of FIG. 4d and nominally orthogonal to the direction of propagation of beam 417.

Figure 4A:
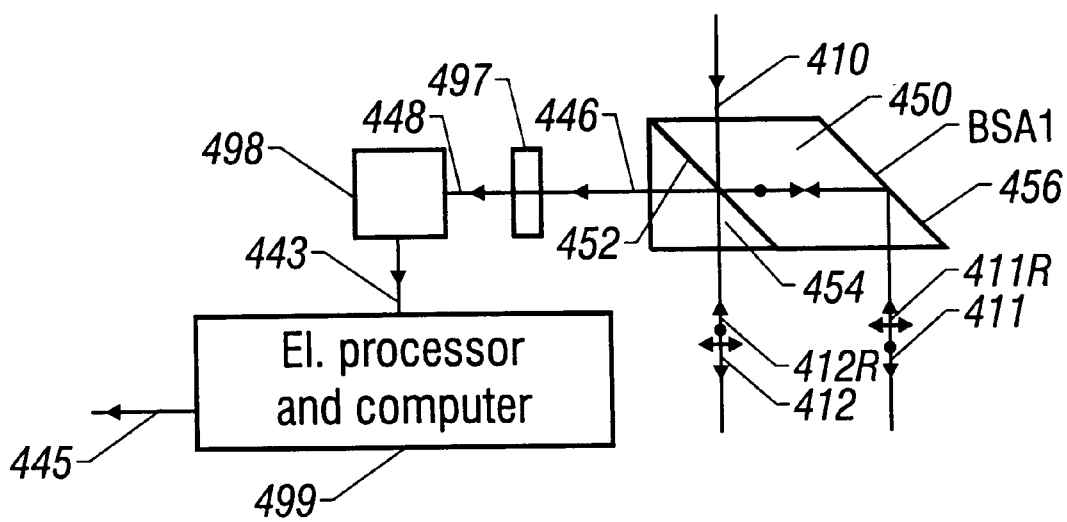
Figure 4E:
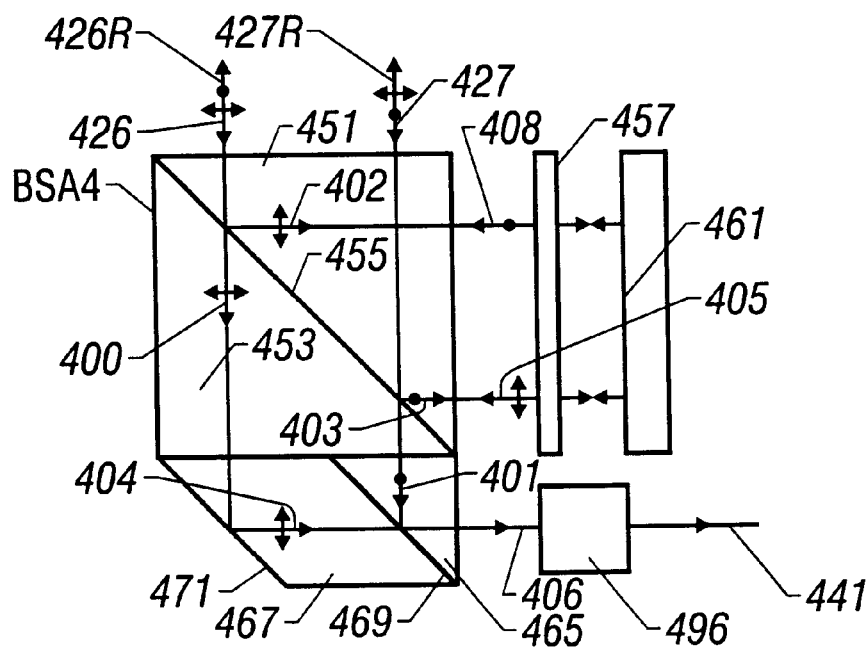
Figure 4D:
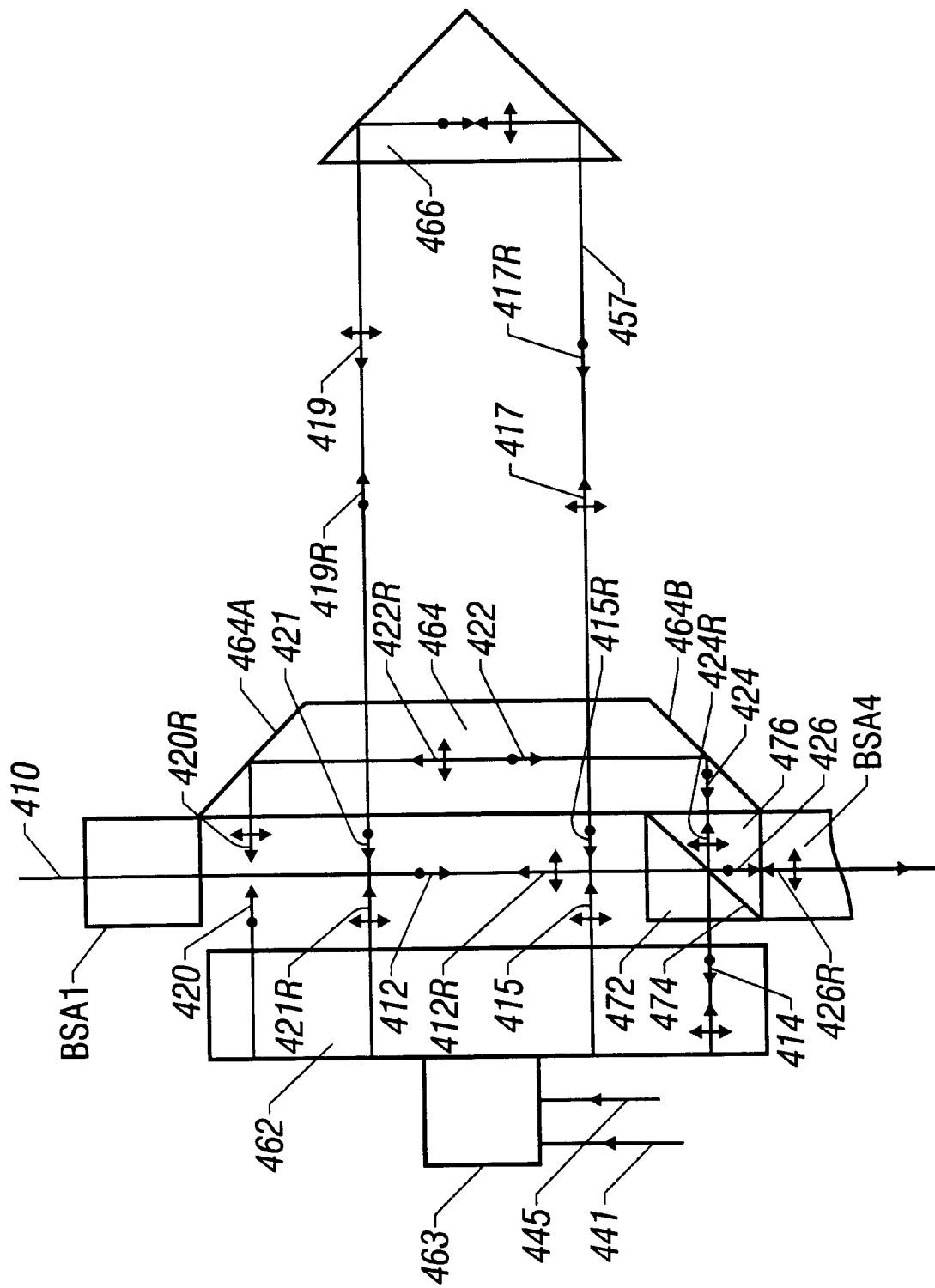

In FIG. 4e, beam 403, polarized orthogonal to the plane of FIG. 4d, is transmitted by quarter wave phase retardation plate 457 as a circularly polarized beam, reflected by mirror 461 as a beam with opposite-handed circular polarization, and subsequently transmitted by phase retardation plate 457 as beam 405 linearly polarized in the plane of FIG. 4e. Beam 405 enters BAS4 and a portion of beam 405 is reflected by nonpolarizing beam splitting interface 455 as beam 427R. Beam 427R has polarization orthogonal to the polarization of beam 427.

Beam 402, polarized in the plane of FIG. 4e, is transmitted by quarter wave phase retardation plate 457 as a circularly polarized beam, reflected by mirror 461 as a beam with opposite-handed circular polarization, and subsequently transmitted by phase retardation plate 457 as beam 408 polarized orthogonal to the plane of FIG. 4e. Beam 408 enters BAS4 and a portion of beam 408 is reflected by nonpolarizing beam splitting interface 455 as beam 426R. Beam 426R has polarization orthogonal to the polarization of beam 426.

Beam 427R is substantially coextensive with beam 427 and beam 427R has a direction of propagation substantially opposite to the direction of propagation of 427. As a consequence, beam 427R substantially retraces the pass through portions of the interferometer, the pass leading to the generation of beam 427, to generate beam 411R. The retrace through portions of the interferometer includes in particular a pass to the measurement object roof prism 466. Beam 411R is substantially coextensive with beam 411 and beam 411R has a direction of propagation substantially opposite to the direction of propagation of beam 411.

Beam 426R is substantially coextensive with beam 426 and beam 426R has a direction of propagation substantially opposite to the direction of propagation of 426. As a consequence, beam 426R substantially retraces the pass through portions of the interferometer, the pass leading to the generation of beam 426, to generate beam 412R. The retrace through portions of the interferometer includes a pass to the reference dove prism 464. Beam 412R is substantially coextensive with beam 412 and beam 412R has a direction of propagation substantially opposite to the direction of propagation of 412.

As shown in FIG. 4a, beam 411R being polarized in the plane of FIG. 4a enters the first beam splitting assembly to be reflected by reflecting surface 456 and transmitted by polarizing beam splitting interface 452 as a first component of a second output beam 446. Beam 412R being polarized orthogonal to the plane of FIG. 4a enters the first beam splitting assembly to be reflected by polarizing beam splitting interface 452 as a second component of the second output beam 446.

Beam 446 is transmitted by a polarizer 497 orientated to produce a mixed optical beam 448. Beam 448 impinges on detector 498 to generate electrical signal 443 related to the difference in phase of the measurement and reference beam components of mixed beam 448. Electrical signal 443 is transmitted to electronic processor and computer 499 for subsequent processing for information about the difference in phase of the measurement and reference beam components of mixed beam 448.

The significant feature of the fourth embodiment is the generation of a double pass to the measurement object roof prism 466 over the same optical path normally traversed in a single pass with prior art interferometry.

The remaining description of the fourth embodiment is the same as corresponding portions of the description given for the third embodiment.

A first variant of the fourth embodiment is described wherein the generation of the electrical signals used in the servo system used to control the beam steering element 462 differs from that used in the fourth embodiment. In the first variant of the fourth embodiment, detector 496 generates only the first component of electrical signal 441 related to any lateral shear of the measurement beam component of output beam 406 produced by a displacement of measurement object roof prism 466 in the plane of FIG. 4d and nominally orthogonal to the direction of propagation of beam 417 and/or a change in orientation of measurement object roof prism 466 about an axis perpendicular to the plane of FIG. 4d and a third detector 498A (not shown in a figure) is added to generate an electrical signal 441A to serve the function of the second component of signal 441 of the fourth embodiment related to any difference in the directions of propagation of measurement and reference beam components in output beam 406 produced by a change in orientation of the measurement object roof prism 466 about an axis in the plane of FIG. 4d and nominally orthogonal to the direction of propagation of beam 417.

The third detector 498A detects a first portion of the second output beam 446 reflected by a nonpolarizing beam splitter inserted in the path of beam 446, a second portion of second output beam 446 being transmitted by inserted beam splitter, transmitted by polarizer 497 orientated to produce a mixed beam, and detected by detector 499.

The advantage of the first variant of the fourth embodiment is that the first portion of the second output beam 446 has a difference in the directions of propagation of its measurement and reference beam components that is twice the difference in the directions of propagation of the measurement and reference beam components in output beam 406 produced by a change in orientation of the object roof prism 466 about an axis in the plane of FIG. 4d and nominally orthogonal to the direction of propagation of beam 417. In addition, the measurement and reference beam components of the first portion of the second output beam 446 have substantially no lateral shear produced by a displacement of measurement object roof prism 466 in the plane of FIG. 4d and nominally orthogonal to the direction of propagation of beam 417 and/or a change in orientation of measurement object roof prism 466 about an axis perpendicular to the plane of FIG. 4d.

A second variant of the fourth embodiment of the present invention is described for measuring the linear displacement of an object substantially independent of the orientation of the object and substantially independent of a lateral displacement of the object, the lateral displacement being orthogonal to the linear displacement. The second variant of the fourth embodiment is from the first class of embodiments and variants thereof operating in the second mode of operation for changes in orientation of the object about two orthogonal axes and/or for a lateral displacement of the object, the lateral displacement being orthogonal to the linear displacement.

The interferometer system and at least one beam steering assembly of the second variant of the fourth embodiment comprise the same elements as the interferometer system and at least one beam steering assembly of the fourth embodiment except for the object element, the detector of a certain optical beam, a signal produced by the detector of the certain optical beam, and a respective servo systems.

The measurement object element of the fourth embodiment, measurement object roof prism 466, is replaced by an measurement object retroreflector 466B (not shown in a figure) in the second variant of the fourth embodiment. As a consequence, the relative directions of propagation of the reference and measurement beam components of output beam 401B, the output beam of the second variant of the fourth embodiment corresponding to output beam 401 of the fourth embodiment, are substantially independent of changes in orientation of the beam steering element 462 of the second variant of the fourth embodiment. However a lateral translation of measurement object retroreflector 466B in a plane orthogonal to the direction of the linear displacement will generate a lateral displacement of measurement beam component of output beam 401B.

Detector 496B of the second variant of the fourth embodiment, corresponding to detector 496 of the fourth embodiment, detects the lateral displacement or shear of the measurement beam component of output beam 401B in two orthogonal directions and generates electrical signal 441B, the electrical signal corresponding to electrical signal 441 of the fourth embodiment. Electrical signal 441B is comprised of two components, one component related to any lateral shear of the measurement beam component of output beam 406 produced by a displacement of measurement object retroreflector 466B in the plane of FIG. 4d and nominally orthogonal to the direction of propagation of beam 417 and/or a change in orientation of measurement object retroreflector 466B about an axis perpendicular to the plane of FIG. 4d and a second component related to any lateral shear of the measurement beam component of output beam 406 produced by a displacement of measurement object retroreflector 466B perpendicular to the plane of FIG. 4d and nominally orthogonal to the direction of propagation of beam 417 and/or a change in orientation of measurement object retroreflector 466B about an axis parallel to the plane of FIG. 4d.

Electrical signal 441B is transmitted to orientation/translation transducer 463 of the second variant of the fourth embodiment. Information contained in signal 441B is used as error signals in a servo system to alter the orientation of beam steering element 462 by orientation/translation transducer 463 so as to maintain the lateral location of measurement beam component of output beam 401B substantially constant independent of a lateral translation of measurement object retroreflector 466B in a plane orthogonal to the direction of the linear displacement and/or substantially independent of changes in orientation of measurement object retroreflector 466B about two orthogonal axes.

The remaining description of the second variant of the fourth embodiment is the same as corresponding portions of the description given for the fourth embodiment.

Figure 5:
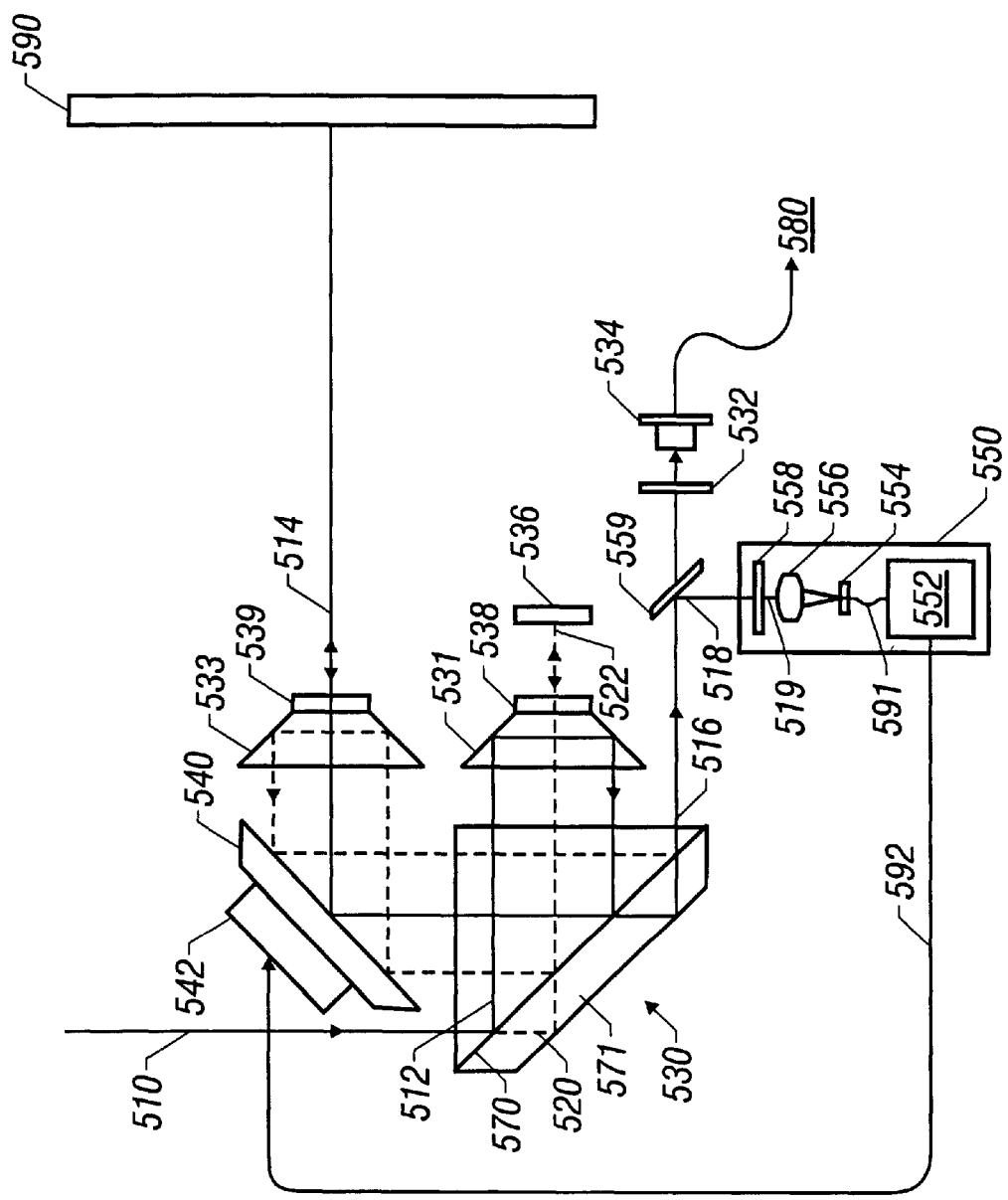
FIG. 5 is a schematic drawing of a fifth embodiment of the interferometry system.

FIG. 5 depicts, in schematic form, the fifth embodiment of the present invention for measuring a linear displacement of an object substantially independent of the orientation of the object and substantially independent of a lateral displacement of the object, the lateral displacement being orthogonal to the linear displacement. The first embodiment is from the first class of embodiments and variants thereof of the present invention operating in the first mode of operation for changes in orientation of the object about two orthogonal axes.

The embodiment is comprised principally of a beam division and recombination optic 530, beam steering mirror 540 attached to a orientation/translation transducer 542, a relative beam angle sensor assembly 550, a reference mirror 536, two retroreflectors 531 and 533, a photodetector 534, two quarter wave retardation plates 538 and 539, and a measurement object mirror 590. Retroreflectors 531 and 533 are truncated so that a beam passing centrally through either one is not retroreflected.

The fifth embodiment is adapted for use with a heterodyne interferometer system. The description of the source of beam 510 and of beam 510 is the same as the description of the source of beam 110 and beam 110 given for the first embodiment. Entrance beam 510 impinges upon a polarizing beam splitter surface 570 of beam division and recombination optic 530. Polarizing beam splitter surface 570 separates the orthogonally polarized components of entrance beam 510 into a measurement beam 512 and a reference beam 520. Measurement beam 512 initially has a linear polarization perpendicular to the plane of the FIG. 5. Reference beam 520 initially has a linear polarization in the plane of FIG. 5. Polarizing beam splitter surface 570 reflects light polarized orthogonal to the plane of FIG. 5 and transmits light polarized in the plane of FIG. 5.

Measurement beam 512 initially traveling from left to right in FIG. 5 after a first reflection from polarizing beam splitter surface 570 reverses direction after reflection from retroreflector 531. Measurement beam 512, now traveling from right to left, reflects a second time. from polarizing beam splitter surface 570 and subsequently travels upwards. Measurement beam 512 reflects a first time from adjustable mirror 540 and passes centrally a first time through retroreflector 533 and then a first time through quarter wave phase retardation plate 539. Quarter wave retardation plate 539 converts measurement beam 512 with an initial linear polarization orthogonal to the plane of FIG. 5, now denoted 514 in the figure, to circular. Measurement beam 514 then reverses direction after reflecting from measurement object mirror 590 and passes a second time through quarter wave phase retardation plate 539, resulting in a net change to linear polarization in the plane of FIG. 5. Measurement beam 514 passes centrally a second time through retroreflector 533, then reflects a second time from adjustable mirror 540 and travels downwards. Measurement beam 514 passes a first time through polarization beam splitter surface 570 and reflects once from a reflective back surface 571 of beam division and recombination optic 530. Measurement beam 514 then passes a second time through polarization beam splitter surface 570 and continues traveling from left to right as a component of exit beam 516 polarized in the plane of FIG. 5.

Reference beam 520 initially traveling downwards after passing a first time through polarizing beam splitter surface 570 reflects once from reflective back surface 571 of beam division and recombination optic 530. Reference beam 520, now traveling from left to right, passes a second time through polarizing beam splitter surface 570, passes centrally a first time through retroreflector 531 and then a first time through quarter wave phase retardation plate 538. Quarter wave phase retardation plate 538 converts the polarization of reference beam 520, polarized in the plane of FIG. 5, to circularly polarized beam now denoted 522. Reference beam 522 then reverses direction after reflecting from reference mirror 536 and passes a second time through quarter wave retardation plate 538, resulting in a net change to linear polarization orthogonal to the plane of FIG. 5. Reference beam 522, now traveling from right to left, passes centrally a second time through retroreflector 531, then reflects a first time from polarizing beam splitter surface 570 and travels upwards. Reference beam 522 reflects a first time from adjustable mirror 540 and travels from left to right, then reverses direction after reflection from retroreflector 533. Reference beam 522 then reflects a second time from adjustable mirror 540, travels downward, reflects a second time from polarizing beam splitter surface 570 and continues traveling from left to right as a component of exit beam 516 polarized orthogonal to the plane of FIG. 5.

Exit beam 516 comprises orthogonally polarized components corresponding to measurement beam 514 and reference beam 522, respectively. Exit beam 516 passes through a pick-off mirror 559 and through a mixing polarizer 532 onto photodetector 534. Mixing polarizer 532, oriented at approximately 45° with respect to the plane of the FIG. 5, combines the orthogonally polarized components of exit beam 516 into mixed beam comprising a single linear polarization component. Photodetector 534 converts the mixed beam into an electronic interference signal, e.g., by photoelectric detection, with signal 580 being transmitted to a signal processing system (not shown in FIG. 5). Electronic interference signal 580 has the same frequency as the optical frequency difference between the orthogonal components of entrance beam 510 shifted by any Doppler shifts introduced by a relative motion of measurement mirror 590 and reference mirror 536. The phase of electronic interference signal 580 varies in accordance with the difference between the optical paths of measurement beam 514 and reference beam 522. Thus electronic interference signal 580 provides a means of monitoring displacement of measurement object mirror 590 with respect to reference mirror 536, using optical interference phenomena.

At the same time, a sample beam 518 from exit beam 516 reflects from pick-off mirror 559 and travels into relative beam angle sensor assembly 550. Within relative beam angle sensor assembly 550 there is a polarizer 558 which selects a measurement beam component out of sample beam 518. Beam 519 then travels through a lens 556 to detector 554 such as a quad cell detector, a high-speed CCD camera, or a lateral effect photodiode or like means for determining the angular orientation of the measurement beam component of beam 519. Information from detector 554 passes as an electrical error signal 591 to servo control 552.

Servo control 552 sends an electronic drive signal 592 to orientation/translation transducer 542, which modifies the angular orientation of beam steering mirror 540 in response to changes in the detected angle of measurement beam 514 as it exits beam division and recombination optic 530. Orientation/translation transducer 542 changes, in response to signal 592, the orientation of beam steering mirror 540 preferably about a nodal point of retroreflector 533, changes in orientation of beam steering mirror 542 about a nodal point of reference retroreflector 533 producing substantially reduced lateral shear effects experienced by the reference beam. In normal operation, electronic servo control 552 maintains the angle of measurement beam 514 as it exits beam division and recombination optic 530 at some fixed value with respect to the angle of reference beam 522 as it exits beam division and recombination optic 530. Most often, it is desirable to minimize the difference in angle between the reference beam 522 and measurement beam 514 as they exit the beam division and recombination optic 530, so as to maximize the strength of electronic interference signal 580 and minimize errors attributable to beam shear.

The combined action of relative beam angle sensor assembly 550, beam steering mirror 540, and orientation/translation transducer 542 is to compensate for changes in orientation of measurement object mirror 590. In the present embodiment, this compensation is typically achieved without disturbing the measured linear displacement of measurement object mirror 590. Thus the optical path difference between measurement beam 514 and reference beam 522 is substantially independent of changes in angle or position of beam steering mirror 540.

There are several advantages of the fifth embodiment. Firstly, the paths for measurement beam 514 and reference beam 522 are highly symmetric, meaning that measurement beam 514 and reference beam 522 pass through the same amount of glass and air, exclusive only of the variable air path defined by the displacement of measurement object mirror 590. Measurement beam 514 and reference beam 522 also have substantially parallel paths, although they are spatially separated to minimize contamination of the measurement and reference beams, one by the other, which generate cyclic errors in the measured phase of the electronic interference signal 580. This symmetry leads to high thermal and mechanical stability.

Secondly, measurement beam 514 and reference beam 522 each reflect from the same flat surfaces an equal number of times, in particular, from reflective back surface 571 and polarizing beam splitter surface 570 of beam division and recombination optic 530. This greatly reduces the requirements for parallelism of the two surfaces of beam division and recombination optic 530.

Thirdly, the embodiment is comprised of easily fabricated optical components. The retroreflectors may be of the common type, either solid or hollow, with the apex ground down and polished flat. Beam division and recombination optic 530 may be an ordinary cube beam splitter with one edge ground flat and polished to become reflective back surface 571. Pick-off mirror 559 may be a small piece of uncoated glass, in this case oriented to favor the component of exit beam 516 polarized orthogonal to the plane of FIG. 5.

Fourthly, there are very few opportunities for ghost reflections, also known as spurious reflections, particularly with regard to spurious multiple passing to measurement object mirror 590. This characteristic reduces the possibility of cyclic errors that are common to the majority of prior-art plane-mirror interferometers.

The remaining description of the fifth embodiment is the same as corresponding portions of the description given for the first embodiment except with respect to lateral shears introduced into the measurement and reference beams by a translation of the beam steering mirror 530 in a direction nominally orthogonal to the surface of the beam steering mirror 540.

Figures 6A, 6B:
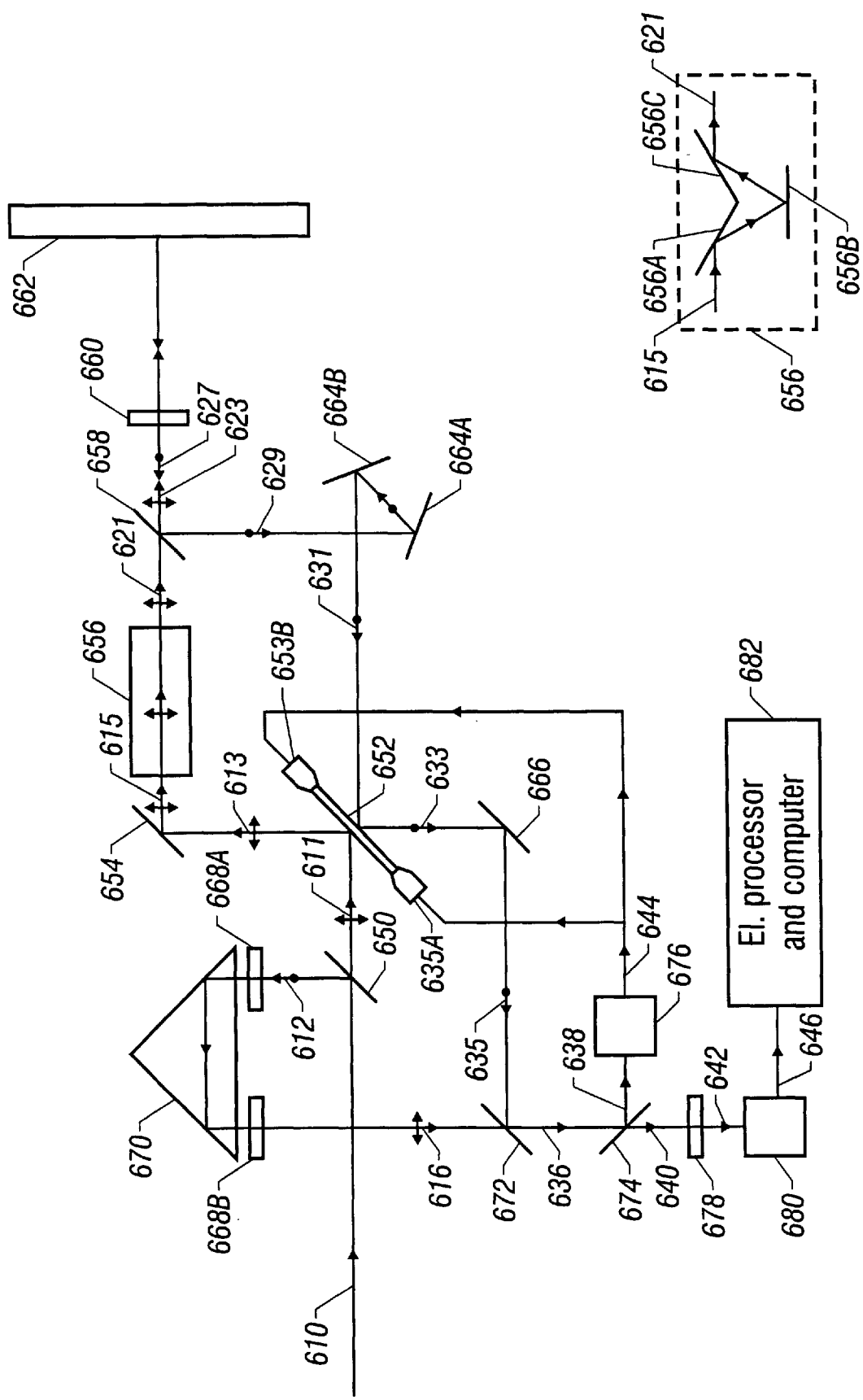
FIGS. 6a–6b are schematic drawings of a sixth embodiment of the interferometry system.

FIGS. 6a and 6b depict in schematic form a sixth embodiment of the present invention for measuring a linear displacement of an object substantially independent of the orientation of the object and substantially independent of a lateral displacement of the object, the lateral displacement being orthogonal to the linear displacement. The sixth embodiment is from the second class of embodiments and variants thereof of the present invention operating in the first mode about two orthogonal axes.

The description of light beam 610 shown in FIG. 6a and of a source of light beam 610 is the same as the description of light beam 110 and of a source of light beam 110 given for the first embodiment. As shown in FIG. 6a, beam 610 impinges on beam splitter 650, e.g., a polarizing type beam splitter. A portion of beam 610 is transmitted as measurement beam 611 polarized in the plane of FIG. 6a and a second portion of beam 610 is reflected as reference beam 612 orthogonally polarized to the plane of FIG. 6a.

In FIG. 6a, beam 611 is reflected by a first surface of beam steering mirror 652 as beam 613. Beam steering mirror 652 and orientation transducers 653A and 6533 comprise a beam steering assembly that redirects measurement beam 613. Beam 613 is reflected by mirror 654 and enters mirror assembly 656 as beam 615. As shown in FIG. 6b, mirror assembly 656 is comprised of three mirrors 656A, 656B, and 656C. The plane of FIG. 6b is orthogonal to the plane of FIG. 6a. Beam 615 is reflected by each of the three mirrors 656A, 656B, and 656C and exits mirror assembly 656 as beam 621. Mirror assembly 656 is an image inverter about an axis in the plane of FIG. 6a and orthogonal to the direction of propagation of beam 615. However, the primary function of mirror assembly 656 is to transform a change in the direction of propagation of beam 615 in the plane of FIG. 6b to a change in the opposite direction of propagation of beam 621 in the plane of FIG. 6b and to translate a change in direction of beam 615 in the plane of FIG. 6a to the same change in direction of propagation of beam 621 in the plane of FIG. 6a.

Beam 621, being polarized in the plane of FIG. 6a, is transmitted by polarizing beam splitter 658 as beam 623. Beam 623, polarized in the plane of FIG. 6a, is transmitted by a quarter wave phase retardation plate 660 as a circularly polarized beam, reflected by measurement object mirror 662 as a beam with opposite-handed circular polarization, and subsequently transmitted by quarter wave phase retardation plate 660 as beam 627 linearly polarized perpendicular to the plane of FIG. 6a. Beam 627 is reflected by beam splitter 658 as beam 629.

Beam 629 is reflected by mirrors 664A and 664B to form beam 631. Mirrors 664A and 664B together produce a constant deviation between beams 629 and 631 in the plane of FIG. 6a, the same as a penta prism. Beam 631 is reflected from a second surface of beam steering mirror 652 as beam 633. A change in the orientation of measurement object mirror 662 will effect a change in direction of propagation and lateral shear of beam 633 at beam steering mirror 652. It is possible to compensate for both of the effects on beam 633 by an appropriate change in the orientation of beam steering mirror 652 in conjunction with image inverter 656, beam splitter 658, constant deviation mirror assembly comprising mirrors 664A and 664B, and measurement object mirror 662 located in the path of the measurement beam between the first and second reflections from beam steering mirror 652.

Beam 633 is reflected by mirror 666 as beam 635. Beam 635 is polarized perpendicular to the plane of FIG. 6a.

Reference beam 612 is transmitted by a quarter wave phase retardation plate 668A as a circularly polarized beam, reflected by retroreflector 670, and transmitted by quarter wave phase retardation plate 668B as beam 616 linearly polarized in the plane of FIG. 6a.

A portion of beam 635 is reflected by polarizing beam splitter 672 as one component of output beam 636. A portion of beam 616 is transmitted by polarizing beam splitter 672 as a second component of output beam 636.

A portion of output beam 636 is reflected by nonpolarizing beam splitter 674 as beam 638. Beam 638 impinges on detector 676 to produce an electrical signal 644 related to any difference in the directions of propagation of measurement and reference beam components in beam 638.

A second portion of output beam 636 is transmitted by nonpolarizing beam splitter 674 as beam 640. Beam 640 is transmitted by a polarizer 678 orientated to produce a mixed optical beam 642. Beam 642 impinges on detector 680 to generate electrical signal 646 related to the difference in phase of the measurement and reference beam components of mixed beam 642. Electrical signal 646 is transmitted to electronic processor and computer 682 for subsequent processing for the information about the difference in phase of the measurement and reference beam components of mixed beam 642.

Electrical signal 644 is transmitted to orientation transducers 653A and 653B. Information contained in signal 644 is used as the error signal in a servo system to alter the orientation of beam steering mirror 652 by orientation transducers 653A and 653B so as to maintain the direction of propagation of beam 633 substantially constant independent of changes of orientation of measurement object mirror 662. Orientation transducers 653A and 653B changes, in response to signal 644, the orientation of beam steering mirror 652 preferably about a point of reference retroreflector 1532, changes in orientation of beam steering mirror 1522 about a nodal point of reference retroreflector 1532 producing substantially reduced lateral shear effects experienced by the reference beam. As a result, the exit reference and Under the condition that the physical path length of the measurement beam from the first surface of beam steering mirror 652 to measurement object mirror 662 is equal to the physical path length of the measurement beam from measurement object mirror 662 to the second surface of beam steering mirror 652, there will be no lateral shear of beam 633 at beam steering mirror 652 when changes in orientation of measurement object mirror 662 are compensated by changes in orientation of beam steering mirror 652. This condition with respect to physical path lengths will be referenced as the sixth embodiment condition.

Under the sixth embodiment condition, projections of measurement beams 611 and 633 at the surface of beam steering mirror 652 onto a plane parallel to and in the center of the surface planes of beam steering mirror 652 can be maintained superimposed, changes in orientation of beam steering mirror 652 by orientation transducers 653A and 653B in response to signal 644 being about the center of the projections of measurement beams 611 and 633 at the surface of beam steering mirror 652 onto the plane parallel to and in the center of the surface planes of beam steering mirror 652.

The remaining description of the sixth embodiment is the same as corresponding portions given for the first embodiment.

The six embodiment of the present invention exhibits advantages additional to those described for the first embodiment of the present invention. The additional advantages include no changes in any part of the path of the reference beam associated with changes in orientation of the beam steering mirror 652 and/or the measurement object mirror 662 and no changes in the path of the measurement beam 611, measurement beam 633, and measurement beams and beam components for which beam 633 is a progenitor that are associated with changes in orientation of the steering mirror 652 and/or the measurement object mirror 662. Further, under the sixth embodiment condition, the size of the beam steering mirror 652 need only be large enough to accommodate the projected size of measurement beam 611, the location of measurement beams 611 and 633 being stationary at beam steering mirror 652. This leads to an additional advantage for the sixth embodiment with respect to a reduced minimum size permitted for beam steering mirror 652 and orientation transducers 653A and 653B and concomitant improvement in frequency response of beam steering mirror assembly.

Figures 7A, 7B:
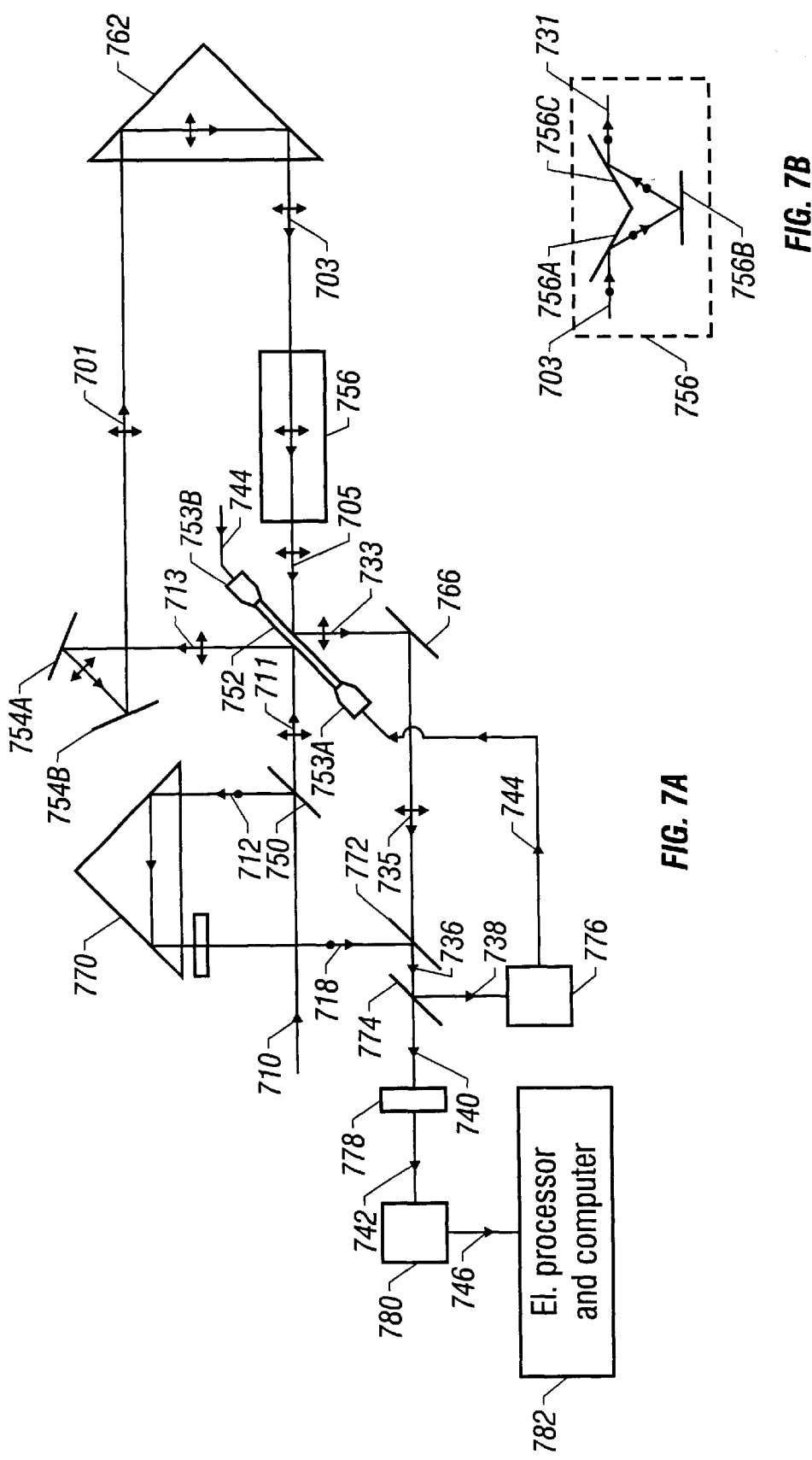
FIGS. 7a–7b are schematic drawings of a seventh embodiment of the interferometry system.

FIGS. 7a and 7b depict, in schematic form, the seventh embodiment of the present invention for measuring a linear displacement of an object substantially independent of the orientation of the object and substantially independent of a lateral displacement of the object, the lateral displacement being orthogonal to the linear displacement. The seventh embodiment is from the second class of embodiments and variants operating in the first mode of operation for changes in orientation of the object about a first axis and in the second mode of operation for changes in orientation of the object about a second axis orthogonal to the first axis and/or a lateral displacement of the object, the lateral displacement being orthogonal to both the second axis and the linear displacement.

The interferometer system of the seventh embodiment is the same as the interferometer system of the sixth embodiment except with respect to the reflecting properties of the object: the reflecting properties of the object for the sixth embodiment are those of a plane mirror and the reflecting properties of the object for the seventh embodiment are those of a roof prism. There are also important similarities between the third embodiment and the seventh embodiment, the reflecting properties of object for both the third and seventh embodiments being those of a roof prism.

In the seventh embodiment, the separation of the measurement beam components incident on and reflected from the object is accomplished by spatially separating the measurement beam components incident on and reflected from the object with a roof prism furnishing the reflection function of the object, the same as for the third embodiment. In the sixth embodiment, the separation of the measurement beam components incident on and reflected from the object is accomplished by use of polarization encoding, a quarter wave phase retardation plate, and a polarizing beam splitter.

Many elements of the sixth and seventh embodiments perform like functions and these elements are indicated by a numeric numbering scheme wherein the numeric number of elements performing like functions for the seventh embodiment are equal to the numeric number of corresponding elements of the sixth embodiment incremented by 100. The description of certain sections of the reference and measurement beam paths for the seventh embodiment are the same as the description given for corresponding paths of the sixth embodiment. The certain sections are indicated for the seventh embodiment by a numeric numbering scheme wherein the numeric number of the certain section of the reference or measurement path of the seventh embodiment having the same description as a corresponding path section of the sixth embodiment is equal to the numeric number of corresponding path section of the sixth embodiment incremented by 100.

The descriptions of the generation of measurement beam 713 and reference beam 716 are the same as the descriptions given for corresponding descriptions of the generation of measurement beam 613 and reference beam 616 of the sixth embodiment. As shown in FIG. 7a, beam 613 is reflected by mirrors 754A and 754B to form beam 701. Mirrors 754A and 754B together produce a constant deviation between beams 713 and 701 in the plane of FIG. 6a, the same as a penta prism. Beam 701 is reflected by measurement object roof prism 762 as beam 703 polarized in the plane of FIG. 7a. Beam 703 enters image inverter 756 and exits as beam 705. Image inverter 756 inverters an image about one axis and the description of image inverter 756 is the same as the description of image inverter 656 of the sixth embodiment. The primary function of image inverter 756 in the seventh embodiment is the same as the primary function of image inverter 656 in the sixth embodiment.

Reference beam 712 enters retroreflector 770 and is retroreflected as 718 polarized orthogonal to the plane of FIG. 7a. The description of the generation of beams 738 and 742 from beams 705 and 718 in the seventh embodiment is the same as the corresponding description given for the generation of beams 638 and 642 from beams 631 and 616 in the sixth embodiment.

The description of the generation of electronic signal 744 from the detection of beam 738 in the seventh embodiment is the same as the description given in the third embodiment for the generation of electronic signal 340 from beam 332. The description of the generation of electronic signal 746 from the detection of beam 746 in the seventh embodiment is the same as the description given in the third embodiment for the generation of electronic signal 342 from beam 336.

The remaining description of the seventh embodiment is the same as corresponding portions of descriptions given for the third and sixth embodiments.

The advantage of the seventh embodiment in relation to the sixth embodiment is the same advantage the third embodiment has with respect to the first embodiment.

A first variant of the seventh embodiment of the present invention is described for measuring the linear displacement of an object substantially independent of the orientation of the object and substantially independent of a lateral displacement of the object, the lateral displacement being orthogonal to the linear displacement. The first variant of the seventh embodiment is from the second class of embodiments and variants thereof operating in the second mode of operation for changes in orientation of the object about two orthogonal axes and/or for a lateral displacement of the object, the lateral displacement being orthogonal to the linear displacement.

The interferometer system and at least one beam steering assembly of the first variant of the seventh embodiment comprise the same elements as the interferometer system and at least one beam steering assembly of the seventh embodiment except for the object element, the detector of a certain optical beam, signal produced by the detector of the certain optical beam, and respective servo system.

The measurement object element of the seventh embodiment, roof prism 762, is replaced by a measurement retroreflector 762A (not shown in a figure) in the first variant of the seventh embodiment. As a consequence, the relative directions of propagation of the reference and measurement beam components of output beam 738A, the output beam of the first variant of the seventh embodiment corresponding to output beam 738 of the seventh embodiment, is substantially independent of changes in orientation of the measurement object retroreflector 762A of the first variant of the seventh embodiment. However a lateral translation of measurement object retroreflector 762A in a plane orthogonal to the direction of the linear displacement will generate a lateral displacement of measurement beam component of output beam 738A.

Detector 776A of the first variant of the seventh embodiment, corresponding to detector 776 of the seventh embodiment, detects the lateral displacement or shear of the measurement beam component of output beam 738A and generates electrical signal 744A, the electrical signal corresponding to electrical signal 744 of the seventh embodiment.

Electrical signal 744A is transmitted to orientation transducers 753A and 753B of the first variant of the seventh embodiment. Information contained in signal 744A is used as the error signal in a servo system to alter the orientation of beam steering mirror 752 by orientation transducers 753A and 753B of the first variant of the seventh embodiment so as to maintain the lateral location of measurement beam component of output beam 738A substantially constant independent of a lateral translation of measurement object retroreflector 762A in a plane orthogonal to the direction of the linear displacement and/or substantially independent of changes in orientation of measurement object retroreflector 762A about two orthogonal axes which are nominally orthogonal to the direction of propagation of beam 701 of the first variant of the seventh embodiment The remaining description of the first variant of the seventh embodiment is the same as corresponding portions of the description given for the seventh embodiment.

Figure 8A:
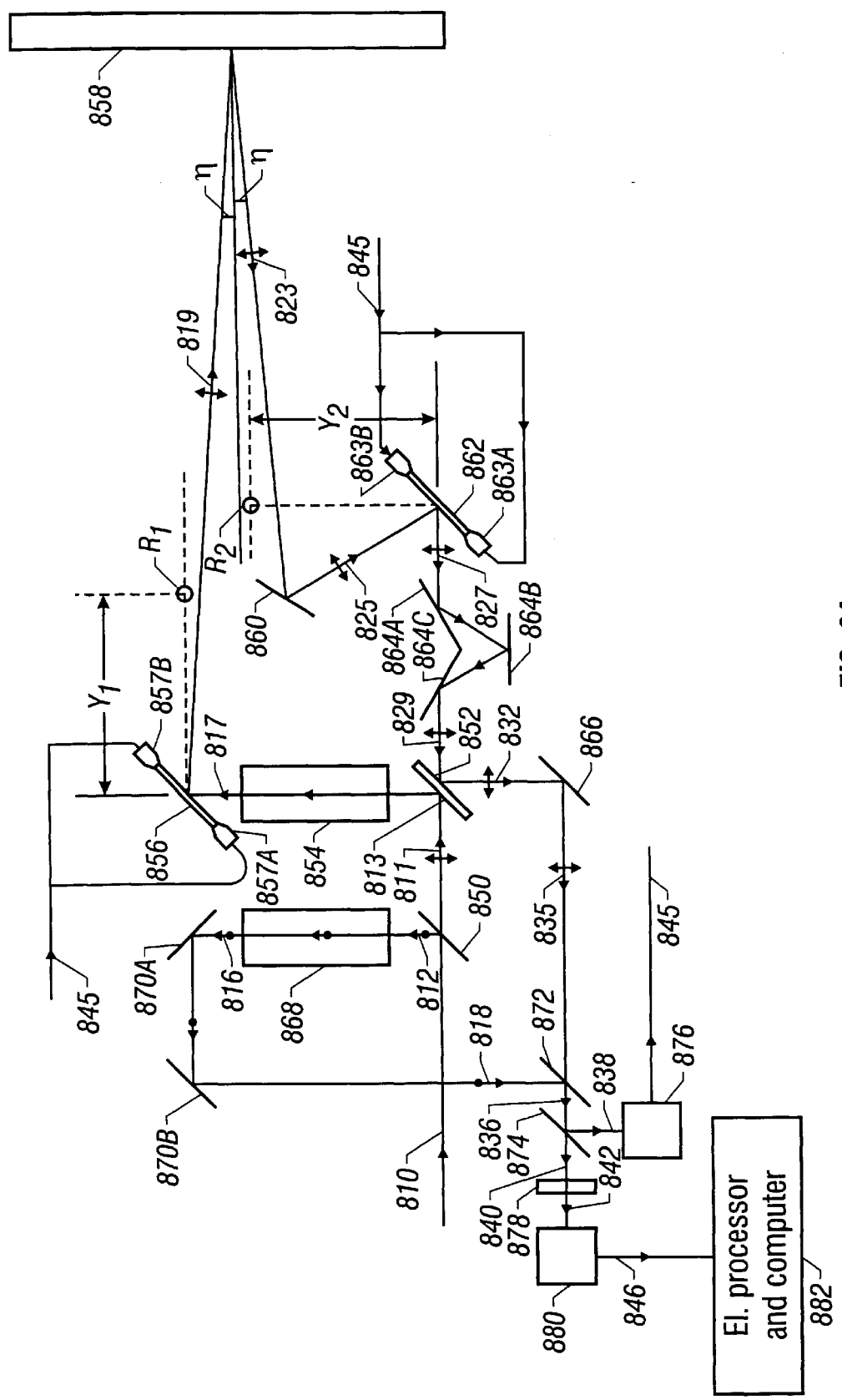
FIGS. 8a–8c are schematic drawings of an eighth embodiment of the interferometry system.
Figure 8B:
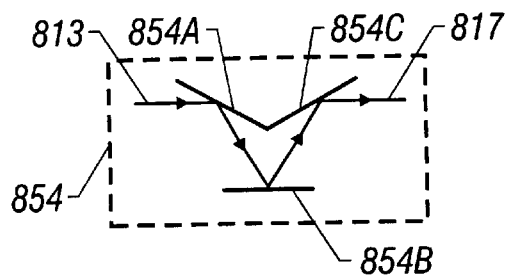
Figure 8C:
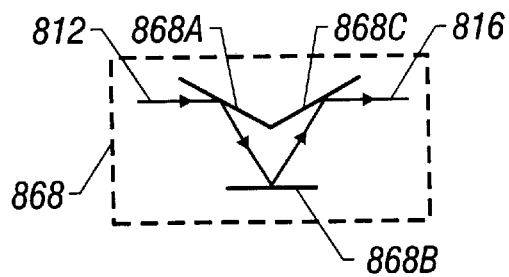

FIGS. 8a–8c depict in schematic form an eighth embodiment of the present invention for measuring a linear displacement of an object with a fixed orientation wherein the direction of propagation of the measurement beam reflected from the object is sensitive to changes in orientation of the object and a high transmission efficiency is maintained for the measurement beam without the use of polarization encoding. The eighth embodiment is from the second class of embodiments and variants operating in the second mode of operation for changes in the linear displacement of the object.

The description of light beam 810 shown in FIG. 8a and of a source of light beam 810 is the same as the description of light beam 110 and of a source of light beam 110 given for the first embodiment. As shown in FIG. 8a, beam 810 impinges on polarizing beam splitter 850. A portion of beam 810 is transmitted as measurement beam 811 polarized in the plane of FIG. 8a and a second portion of beam 810 is reflected as reference beam 812 orthogonally polarized to the plane of FIG. 8a.

In FIG. 8a, beam 811 is reflected by a first surface of mirror 852 as beam 813. Beam 813 enters image inverter 854. As shown in FIG. 8b, image inverter 854 is comprised of three mirrors 854A, 854B, and 854C. Beam 813 is reflected by each of the three mirrors 854A, 854B, and 854C and exits mirror assembly 854 as beam 817. Image inverter 854 inverters an image about one axis and the description of image inverter 854 is the same as the description of image inverter 656 of the sixth embodiment.

Beam 817 is reflected by beam steering mirror 856 as beam 819. Beam steering mirror 856 and orientation transducers 857A and 857B comprise a beam steering assembly that redirects beam 819. Beam 819 is reflected by measurement object mirror 858 as beam 823. Beam 823 is reflected by mirror 860 as beam 825 and beam 825 is reflected by beam steering mirror 862 as beam 827. Beam steering mirror 862 and orientation transducers 863A and 863B comprise a beam steering assembly that redirects beam 827.

Beam 827 is reflected by mirrors 864A, 864B, and 864C to form beam 829. Mirrors 864A, 864B, and 864C together comprise an image inverter which inverters an image about one axis orthogonal to plane of FIG. 8a and the description of which is the same as the description of image inverter 656 of the sixth embodiment. The primary function of the image inverter comprised of mirrors 864A, 864B, and 864C is the same as the primary function of image inverter 656 in the sixth embodiment. The angle of incidence of beam 829 on mirror 852 is nominally the same as the angle of incidence of beam 811 on mirror 852.

Beam 829 is reflected from a second surface of mirror 852 as beam 833. A translation of measurement object mirror 858 with a fixed orientation in a direction parallel to the average directions of propagation of beams 819 and 823 will effect a change in the lateral location of beam 833 at mirror 852. It is possible to compensate for the effect on beam 833 by appropriate changes in the orientations of beam steering mirrors 856 and 862, the appropriate changes being accomplished by the respective orientation transducers in conjunction with the combination of mirror 860 and measurement object mirror 858 located in the path of the measurement beam between beam steering mirrors 856 and 862.

Beam 833 is reflected by mirror 866 as beam 835. Beam 835 is polarized in the plane of FIG. 8a.

Reference beam 812 enters image inverter 868. As shown in FIG. 8c, image inverter 868 is comprised of three mirrors 868A, 868B, and 868C. The plane of FIG. 8c is orthogonal to the plane of FIG. 8a. Beam 812 is reflected by each of the three mirrors 868A, 868B, and 868C and exits mirror assembly 868 as beam 816. The primary function of the image inverter 868 is the same as the primary function of image inverter 656 in the sixth embodiment.

Reference beam 816 is subsequently reflected by mirrors 870A and 870B to form beam 818. Mirrors 870A and 870B function together as a roof prism. Beam 818 is polarized perpendicular to the plane of FIG. 8a.

Beam 835 is transmitted by polarizing beam splitter 872 as one component of output beam 836, beam 835 being polarized in the plane of FIG. 8a. A portion of beam 816 is transmitted by polarizing beam splitter 872 as a second component of output beam 836, beam 816 being polarized orthogonal to the plane of FIG. 8a.

A portion of output beam 836 is reflected by nonpolarizing beam splitter 874 as beam 838. Beam 838 impinges on detector 876 to produce an electrical signal 845 related to the lateral location of the measurement beam component in beam 838.

A second portion of output beam 836 is transmitted by nonpolarizing beam splitter 874 as beam 840. Beam 840 is transmitted by a polarizer 878 orientated to produce a mixed optical beam 842. Beam 842 impinges on detector 880 to generate electrical signal 846 related to the difference in phase of the measurement and reference beam components of mixed beam 842. Electrical signal 846 is transmitted to electronic processor and computer 882 for subsequent processing for the information about the difference in phase of the measurement and reference beam components of mixed beam 842.

The electronic signal 845 is used by orientation transducers 857A and 857B to effect a rotation of steering mirror 856 in the plane of FIG. 8a about point $R_1$ shown in FIG. 8a. Similarly, electronic signal 845 is used by orientation transducers 863A and 863B to effect a rotation of steering mirror 862 about point $R_2$ in the plane of FIG. 8a. For each rotation of beam steering mirror 856 produced by orientation transducers 857A and 857B resulting from a given signal 845, the same angular rotation of beam steering mirror 862 is generated by orientation transducers 863A and 863B also based on signal 845. Thus the direction of propagation of beam 827 is unaltered by the combined rotations of beam steering mirrors 856 and 862 arising from a given signal 845.

The line of length $y_1$ from $R_1$ to the point where beam 817 intersects beam steering mirror 856 is orthogonal to the direction of propagation of beam 817. The line of length $y_2$ from $R_2$ to the point where beam 827 intersects beam steering mirror 862 is orthogonal to the direction of propagation of beam 827. Under a set of eighth embodiment conditions comprising the condition that $$y_1 = y_2 \qquad (2)$$

the condition that the physical path length of beam 819 is equal to the combined physical path lengths of beams 823 and 825, and the condition that points $R_1$ and $R_2$ are coextensive, beam steering mirrors 856 and 862 can each be rotated by an angle $\gamma$ in the plane of FIG. 8a about points $R_1$ and $R_2$, respectively, such that for a translation of measurement object mirror 858 of fixed orientation in a direction parallel to the average direction of propagation of beams 819 and 823 before the translation, 1) there will be no change in the average direction of propagation of beams 819 and 823;
2) there will be no lateral shear introduced in beam 819 at measurement object mirror 858;
3) there will be no lateral shear introduced in beam 817 at beam steering mirror 856 or in beams which are progenitors of beam 817; and
4) there will be no lateral shear introduced in beam 827 at beam steering mirror 862 or in measurement beams or measurement beam components for which beam 827 is a progenitor.

The absolute magnitude of the changes in angles of rotation $\gamma$ will be equal to the absolute magnitude of changes in $\eta/2$ where $\eta$ is the angle of incidence of beam 819 at measurement object mirror 858. The magnitude of the changes in angles of rotation $\eta$ encountered in typical operation of a distance measuring interferometer will be of the order of 0.005 radians for measurement leg lengths varying between 0.4 m and 1.0 m.

The remaining description of the eight embodiment is the same as corresponding portions of the descriptions given for the sixth embodiment.

An advantage of the eighth embodiment is a high transmission efficiency of the measurement beam without the use of polarization encoding and without the introduction of variable lateral displacements of measurement beam 811, measurement beam 833, and measurement beams and measurement beam components for which beam 833 is a progenitor, the advantage being present for a measurement of a linear displacement of an object of a fixed orientation wherein the direction of propagation of the measurement beam reflected from the object is sensitive to changes in orientation of the object.

Figure 9B:
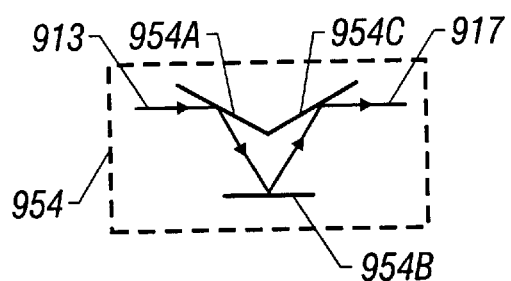
FIGS. 9a–9c are schematic drawings of a ninth embodiment of the interferometry system.
Figure 9C:
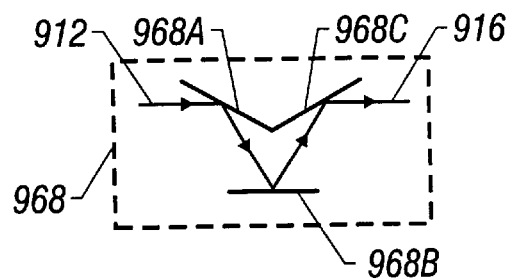
Figure 9A:
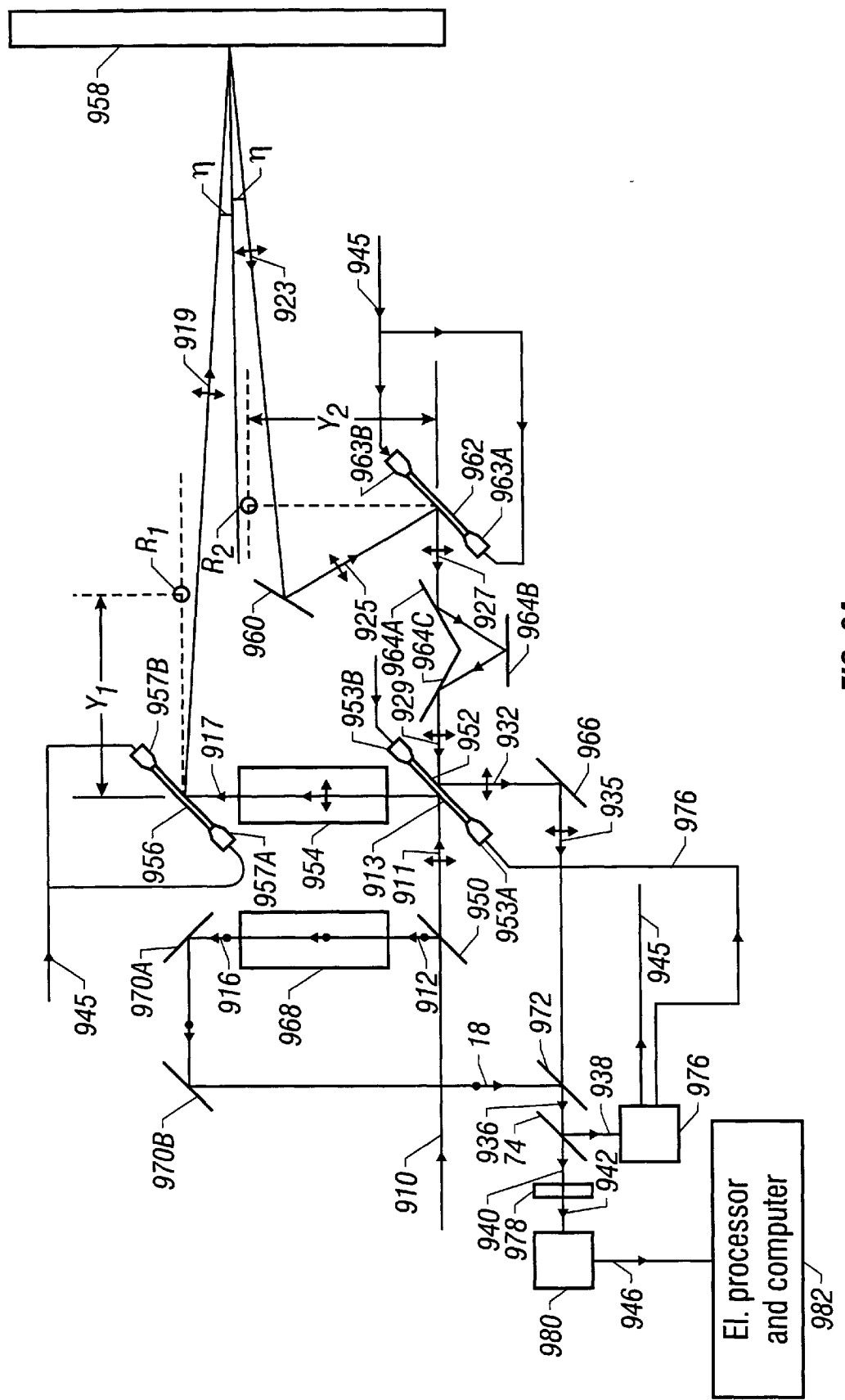

FIGS. 9a–9c depicts in schematic form a ninth embodiment of the present invention for measuring a linear displacement of an object substantially independent of the orientation of the object and substantially independent of a lateral displacement of the object, the lateral displacement being orthogonal to the linear displacement. The ninth embodiment is from the second class of embodiments and variants operating in the first mode of operation for changes in orientation of the object about two orthogonal axes, the orthogonal axes being orthogonal to the linear displacement and/or a lateral displacement of the object, the lateral displacement being orthogonal to the linear displacement.

The ninth embodiment incorporates the beam steering beam assemblies of the sixth and eighth embodiments. In this role, the elements of the ninth embodiment shown in FIG. 9a perform like functions as like numbered elements of the eighth embodiment shown in FIG. 8a incremented by 100 except for beam steering mirror 952 and orientation transducers 953A and 953B. The description of beam steering mirror 952 and orientation transducers 953A and 953B is the same as the description given for beam steering mirror 652 and orientation transducers 653A and 653B of the sixth embodiment.

Detector 976 performs the functions of detector 676 of the sixth embodiment and generates electronic signal 944, the description of electronic signal 944 of the ninth embodiment being the same as corresponding portions of the description given for electronic signal 644 of the sixth embodiment. Detector 976 in addition performs the functions of detector 876 of the eighth embodiment and generates electronic signal 945, the description of electronic signal 945 being the same as the description given for electronic signal 845 of the eighth embodiment.

In the normal mode operation of the ninth embodiment, if the orientation of beam steering mirror 952 is not correct for a given orientation of measurement object mirror 958, there will be a difference in the directions of propagation of the measurement beam and reference beam components of beam 938 and a lateral shear of the measurement beam component relative to the reference beam component of beam 938. Detector 976 detects the difference in directions of propagation of the measurement and reference beam components of beam 938 and generates electronic signal 944. Electronic signal 944 is transmitted to orientation transducers 953A and 953B which adjust the orientation of beam steering mirror 952 so that the directions of propagation of the measurement and reference beam components of beam 938 are the same. The lateral shear of the measurement beam component relative to the reference beam component of beam 938 due to the incorrect orientation of beam steering mirror 952 is compensated simultaneously with the compensation of the difference in the directions of propagation of the measurement beam and reference beam components of beam 938.

There will be a residual lateral shear of the measurement beam component relative to the reference beam component of beam 938 should there be an incorrect orientation of beam steering mirrors 956 and 962. Detector 976 detects the residual lateral shear of the measurement and reference beam components of beam 938 and generates electronic signal 945. Electronic signal 945 is transmitted to orientation transducers 957A and 957B which adjust the orientation of beam steering mirror 956 and to orientation transducers 963A and 963B which adjust the orientation of beam steering mirror 962 so that the residual lateral shear of the measurement and reference beam components of beam 938 is compensated.

The remaining description of the ninth embodiment is the same as that given for corresponding portions of the descriptions given for the sixth and eight embodiments.

Figure 10B:
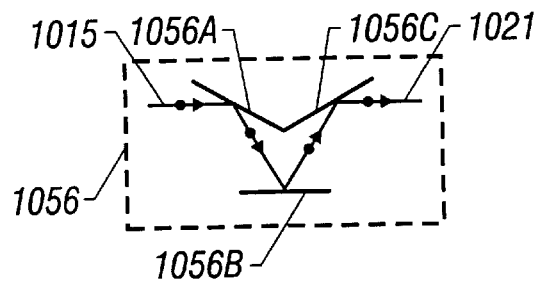
FIGS. 10a–10c are schematic drawings of a tenth embodiment of the interferometry system.
Figure 10C:
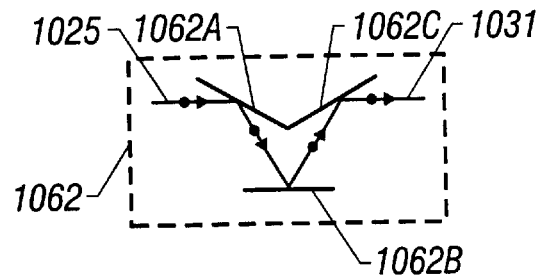
Figure 10A:
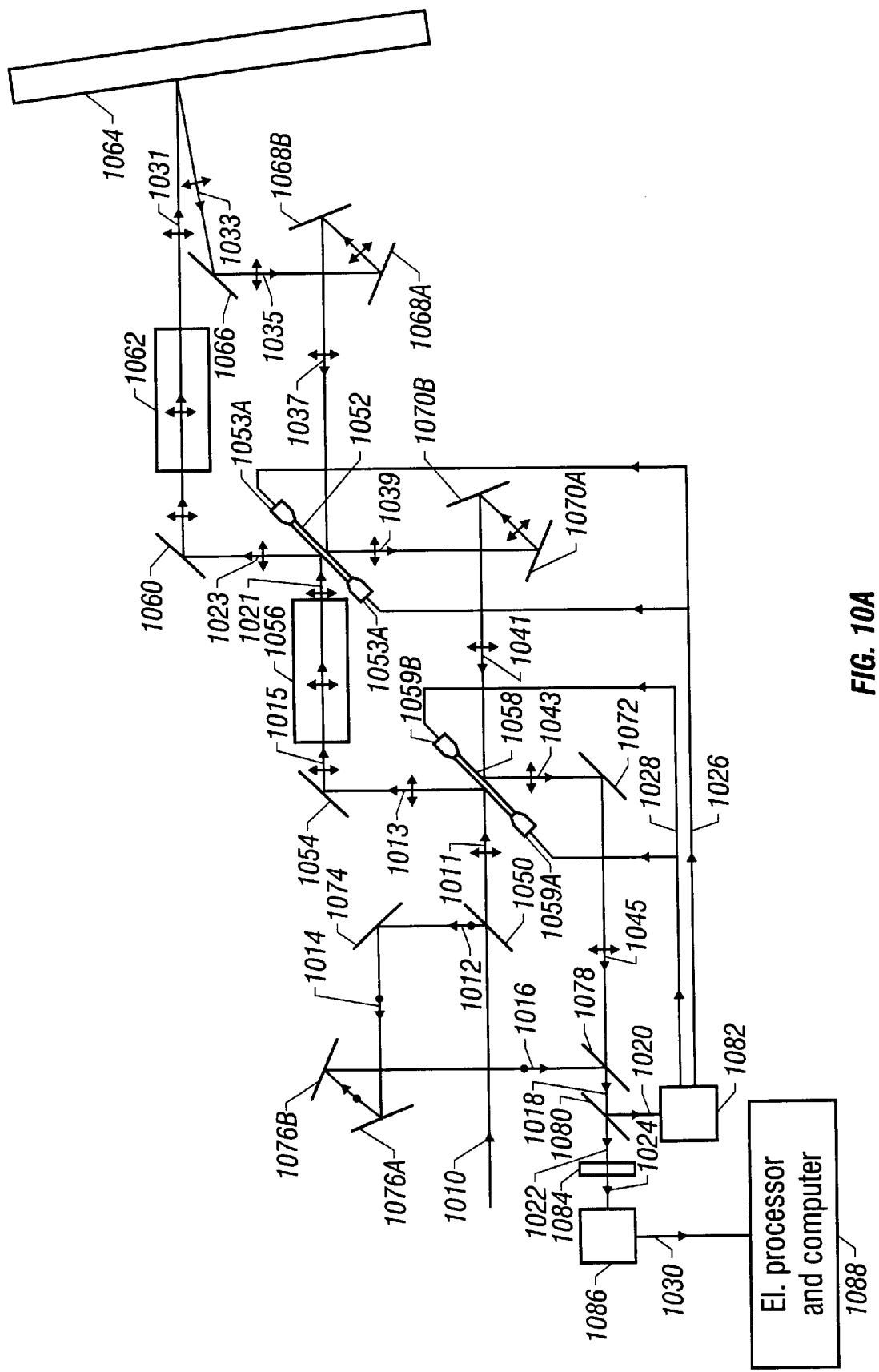

FIGS. 10a–10c depict in schematic form a tenth embodiment of the present invention for measuring a linear displacement of an object substantially independent of the orientation of the object and substantially independent of a lateral displacement of the object, the lateral displacement being orthogonal to the linear displacement, and wherein a high transmission efficiency of the measurement beam is maintained without the use of polarization encoding. The tenth embodiment is from the second class of embodiments and variants operating in the first mode of operation for changes in orientation of the object about two orthogonal axes, two orthogonal axes being orthogonal to the linear displacement and/or a lateral displacement of the object, the lateral displacement being orthogonal to the linear displacement.

The tenth embodiment may be considered a variant of the ninth embodiment of the present invention. The function performed by mirror assembly comprised of beam steering mirror 1052 and orientation transducers 1053A and 1053B of the tenth embodiment is the same function performed by the mirror assembly comprised of mirror 952 and orientation transducers 953A and 953B of the ninth embodiment. The function performed by mirror assembly comprised of beam steering mirror 1058 and orientation transducers 1059A and 1059B of the tenth embodiment is the same as the combined functions performed by the mirror assembly comprised of beam steering mirror 956 and orientation transducers 957A and 957B and beam steering mirror assembly comprised of mirror 962 and orientation transducers 963A and 963B of the ninth embodiment.

The description of electronic signals 1026 and 1028 of the tenth embodiment is the same as the corresponding portions of the descriptions given for electronic signals 944 and 945, respectively, of the ninth embodiment. The description of the remaining elements of the tenth embodiment shown in FIG. 10a perform like functions as like numbered elements of the ninth embodiment shown in FIG. 9a incremented by 100.

The relevant tenth embodiment conditions are that:
1) the physical path length from measurement beam 1013 at beam steering mirror 1058 to measurement beam 1021 at beam steering mirror 1052 is equal to the physical path length from measurement beam 1039 at beam steering mirror 1052 to measurement beam 1041 at steering mirror 1058;
2) the physical path length from measurement beam 1023 at beam steering mirror 1052 to measurement beam 1031 at measurement object mirror 1064 is equal to the physical path length from measurement beam 1033 at measurement object mirror 1064 to measurement beam 1037 at beam steering mirror 1052;
3) the angle of incidence of beam 1011 and the angle of incidence of beam 1041 at beam steering mirror 1058 are nominally the same; and
4) the angle of incidence of beam 1021 and the angle of incidence of beam 1037 at beam steering mirror 1052 are nominally the same.

It will be evident to those skilled in the art that under the tenth embodiment conditions that the location of beam 1011 and the location of beam 1043 at beam steering mirror 1058 will be substantially one above the other and that the location of beam 1021 and the location of beam 1039 at beam steering mirror 1052 will be substantially one above the other.

The description of the steering beam assembly comprising steering mirror 652 of the sixth embodiment with respect to the size of respective components and frequency response is applicable for both of the beam steering assemblies of the tenth embodiment comprising beam steering mirrors 1052 and 1058.

The remaining description of the tenth embodiment is the same as corresponding portions of the description given for the ninth embodiment.

FIGS. 11a–11f depict, in schematic form, the eleventh embodiment of the present invention for measuring a linear displacement of an object substantially independent of the orientation of the object and substantially independent of a lateral displacement of the object, the lateral displacement being orthogonal to the linear displacement. The eleventh embodiment is from the second class of embodiments and variants thereof operating in the first mode of operation for changes in orientation of the object about two orthogonal axes, two orthogonal axes being orthogonal to the linear displacement, and/or a lateral displacement of the object, the lateral displacement being orthogonal to both the linear displacement.

The interferometer system of the tenth and eleventh embodiments are generically similar except with respect to the number of passes the measurement beam makes to the object: the measurement beams of the eleventh embodiment traverse certain sections of the measurement path in two opposite directions of propagation where in the tenth embodiment, the corresponding measurement beam transits the certain sections in only one direction of propagation. Efficient separation of an output measurement beam component from an input measurement beam component in the multiple pass configuration of the eleventh embodiment is effected by use of polarization encoding and polarizing beam splitters.

Many elements of the tenth and eleventh embodiments perform like functions and these elements are indicated by a numeric numbering scheme wherein the numeric number of elements performing like functions for the eleventh embodiment are equal to the numeric number of corresponding elements of the tenth embodiment incremented by 100. The certain sections of the reference and measurement beam paths are indicated by the numeric numbering scheme wherein the numeric number of the certain section of the reference or measurement path of the eleventh embodiment having the same description as a corresponding path section of the tenth embodiment is equal to the numeric number of corresponding path section of the tenth embodiment incremented by 100.

For the certain sections of the measurement beam paths for the eleventh embodiment, there are measurement beams traversing the certain sections in a reverse direction of propagation, the nonreverse or forward direction of propagation being associated with a first pass to measurement object mirror 1164 and the reverse direction of propagation being associated with a second pass to the measurement object mirror 1164. The description of the additional measurement beams traversing the certain sections in a reverse direction are otherwise the same as the corresponding portions of the description given associated measurement beams traversing in a nonreverse direction of propagation for the tenth embodiment, an alphanumeric number of a measurement beam traversing in a reverse direction being equal to the numeric number of the associated measurement beam traversing in a nonreverse direction augmented with the suffix R.

The descriptions of the generation of measurement beam 1143 and reference beam 1112 is the same as the descriptions given for corresponding descriptions of the generation of measurement beam 1043 and reference beam 1012 of the tenth embodiment. As shown in FIG. 11d, a first portion of beam 1143 is transmitted by nonpolarizing beam splitter 1171 as beam 1145. Beam 1145 impinges on detector 1190 to generate electrical signal 1128. A second portion of beam 1143, being polarized in the plane of FIG. 11*d*, is reflected by nonpolarizing beam splitter 1171, is transmitted by quarter wave phase retardation plate 1172 as a circularly polarized beam, reflected by mirror 1173 as a beam with opposite-handed circular polarization, transmitted by phase retardation plate 1172 as a beam orthogonally polarized to the plane of FIG. 11*d*, and subsequently a portion thereof reflected by nonpolarizing beam splitter 1171 as beam 1143R. Beam 1143R is orthogonally polarized to the plane of FIG. 11*d*.

Figure 11A:
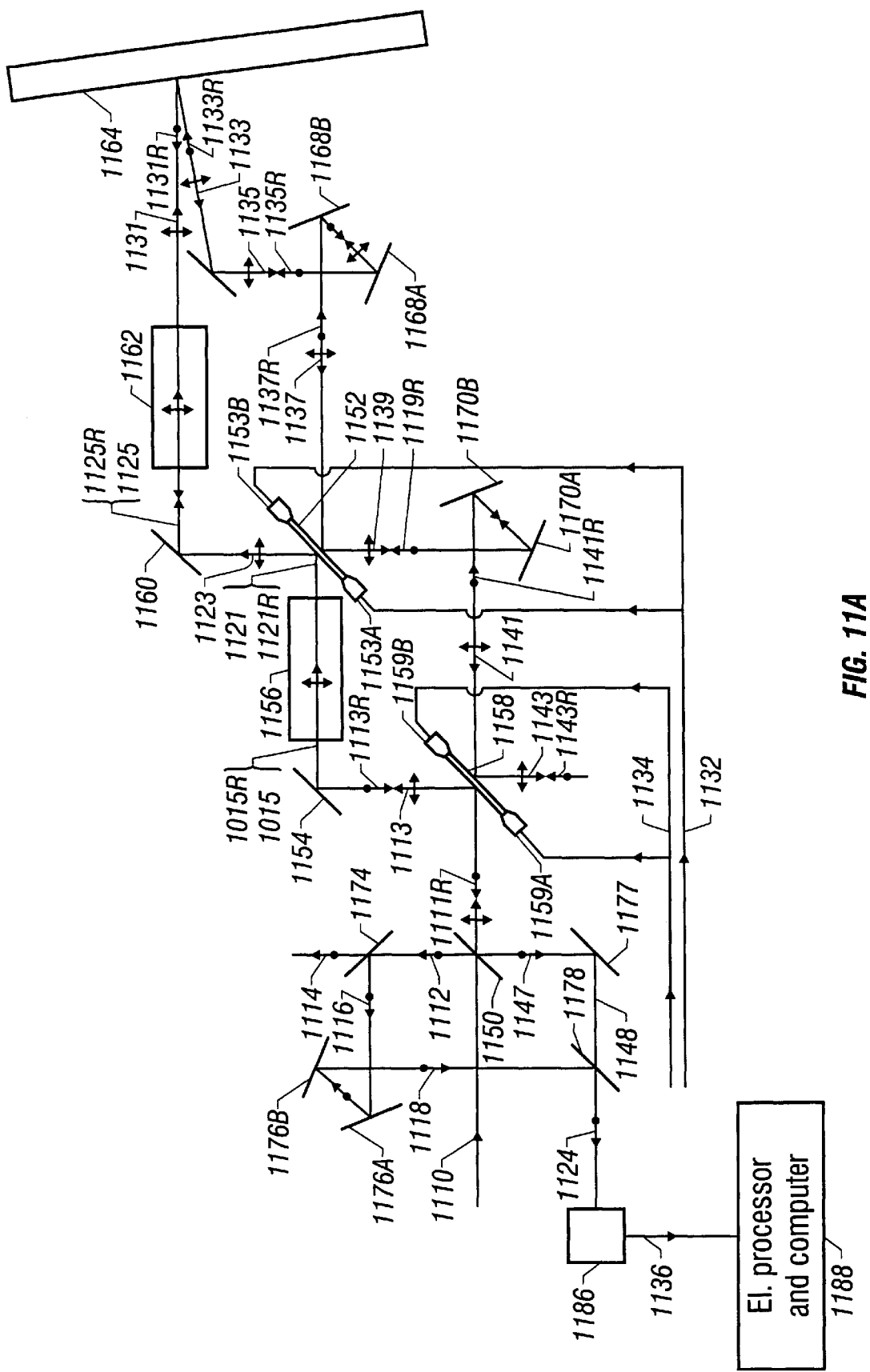
FIGS. 11a–11f are schematic drawings of an eleventh embodiment of the interferometry system.
Figure 11B:
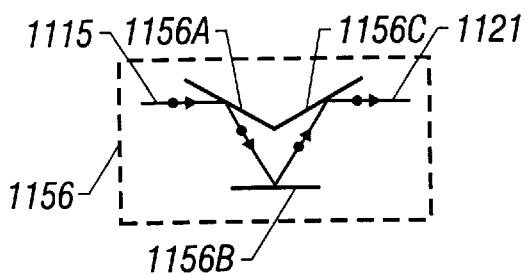
Figure 11C:
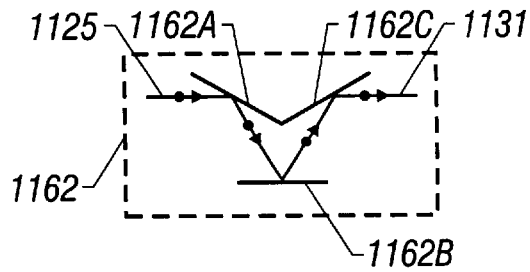
Figure 11D:
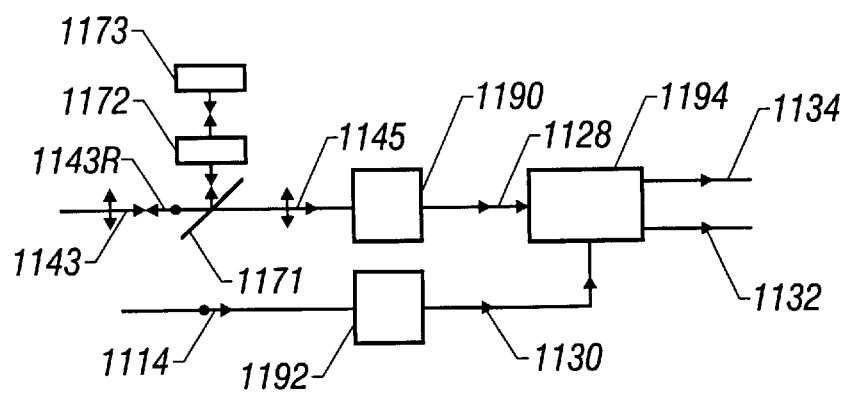
Figure 11E:
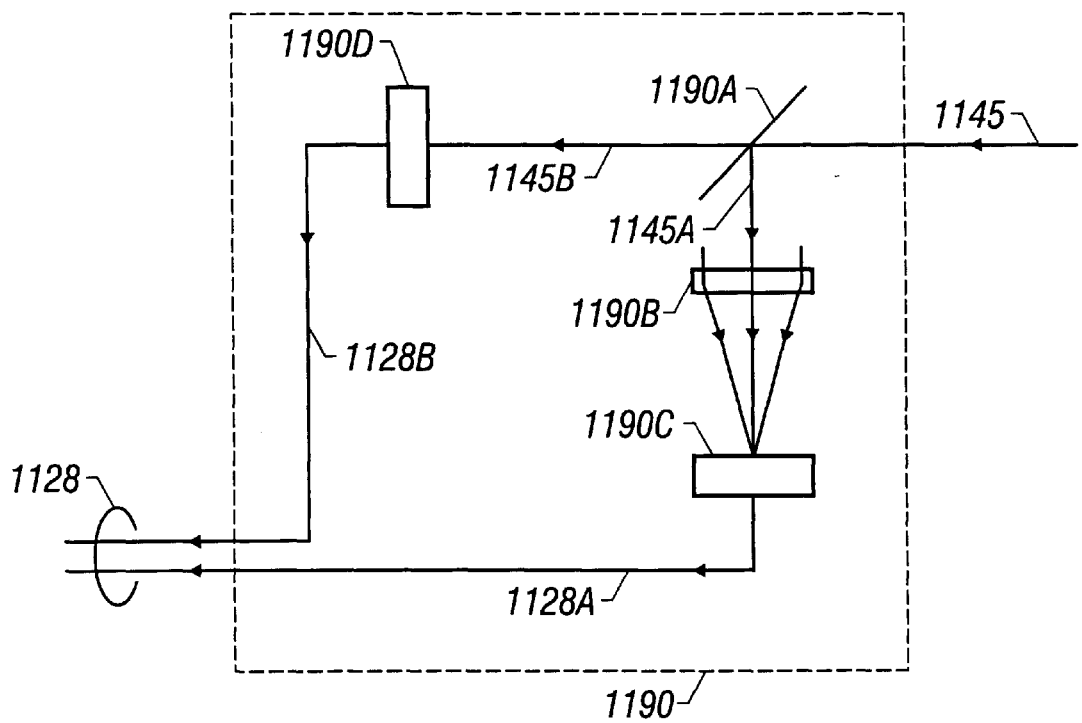

The elements of detector 1190 are depicted, in schematic form, in FIG. 11*e*. Beam 1145 enters detector 1190 and a first portion of beam 1145 is reflected by nonpolarizing beam splitter 1190A as beam 1145A. Beam 1145A is focused by lens 1190B to a spot on detector 1190C such as a quad cell detector, a two-dimensional high speed CCD camera, or a lateral effect photodiode. Two-dimensional data arrays are transmitted as electronic signal 1128A. The location of the spot on detector 1190C is not effected by a lateral shear of beam 1145A but a change in the direction of propagation of beam 1145A does shift the location of the spot on detector 1190C. Thus the electronic signal 1128A contains information about the direction of propagation of beam 1145A.

A second portion of beam 1145 is transmitted as beam 1145B. Beam 1145B impinges on detector 1190D such as a quad cell to generate electronic signal 1128B. The location of beam 1145B on detector 1190D is effected by a lateral shear of beam 1145B but a change in the direction of propagation of beam 1145B at detector 1190D does shift the location of beam 1145B on detector 1190D. Thus the electronic signal 1128B contains information about lateral shear of beam 1145B. Electronic signals 1128A and 1128B comprise electronic signal 1128.

Figure 11F:
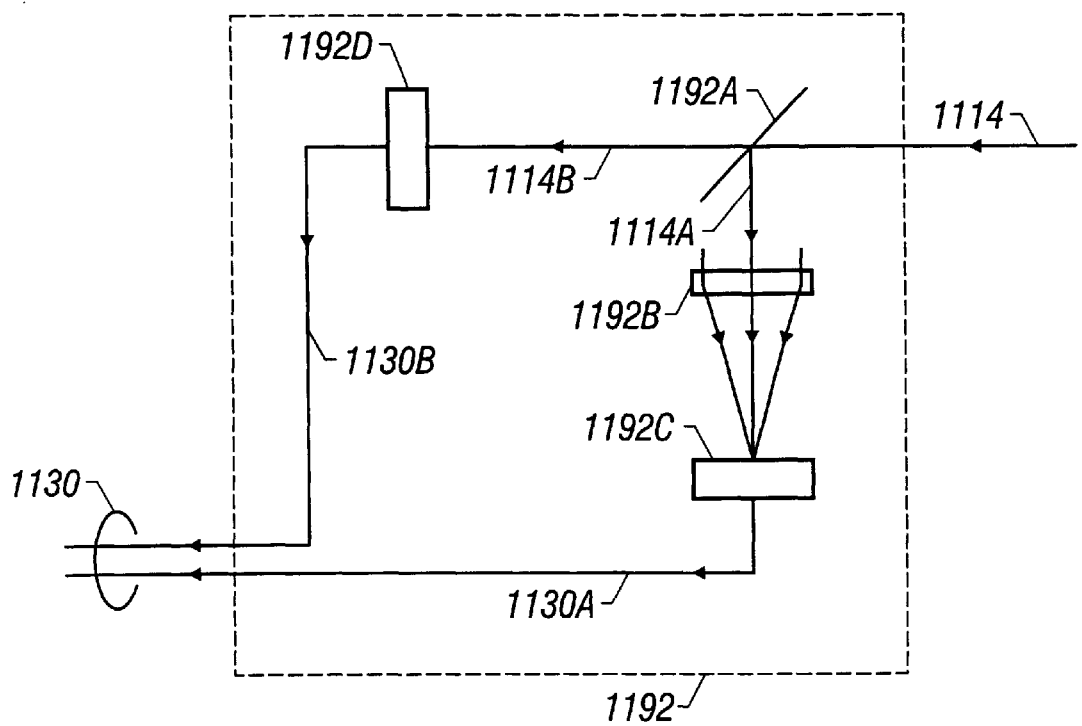

As shown in FIG. 11*a*, a first portion of reference 1112 is transmitted by nonpolarizing beam splitter 1174 as beam 1114 and a second portion of reference 1112 is reflected by nonpolarizing beam splitter 1174 as beam 1116. As shown in FIGS. 11*d* and 11*f*, beam 1114 impinges on detector 1192 to generate electrical signal 1130.

The elements of detector 1192 are depicted, in schematic form, in FIG. 11*f*. Beam 1114 enters detector 1192 and a first portion of beam 1114 is reflected by nonpolarizing beam splitter 1192A as beam 1114A. Beam 1114A is focused by lens 1192B to a spot on detector 1192C such as a quad cell detector, a two-dimensional high speed CCD camera, or a lateral effect photodiode. Two-dimensional data arrays are transmitted as electronic signal 1130A. The location of the spot on detector 1192C is not effected by a lateral shear of beam 1114A but a change in the direction of beam 1114A does shift the location of the spot on detector 1192C. Thus the electronic signal 1130A contains information about the direction of propagation of beam 1114A.

A second portion of beam 1114 is transmitted by nonpolarizing interface 1192A as beam 1114B. Beam 1114B impinges on detector 1192D such as a quad cell to generate electronic signal 1130B. The location of beam 1114B on detector 1192D is effected by a lateral shear of beam 1114B but a change in the direction of propagation of beam 1114B at detector 1192D does shift the location of beam 1114B on detector 1192D. Thus the electronic signal 1130B contains information about lateral shear of beam 1114B. Electronic signals 1130A and 1130B comprise electronic signal 1130.

Electronic signals 1128 and 1130 are transmitted to electronic signal processor 1194 (cf. FIG. 11*d*). From the components of electronic signals 1128 and 1130 that contain information about the directions of propagation of measurement beam 1145A and reference beam 1114A, electronic processor 1194 generates electronic signal 1132. From the components of electronic signals 1128 and 1130 that contain information about the lateral shear of measurement beam 1145B and reference beam 1114B, electronic processor 1194 generates electronic signal 1134.

Electrical signal 1132 is transmitted to orientation transducers 1153A and 1153B and electronic signal 1134 is transmitted to orientation transducers 1159A and 1159B. Information contained in signal 1132 is used as the error signal in a servo system to alter the orientation of beam steering mirror 1152 by orientation transducers 1153A and 1153B so as to maintain in two orthogonal dimensions the direction of propagation of measurement beam 1143 substantially constant independent of changes of orientation of measurement object mirror 1164. Information contained in signal 1134 is used as the error signal in a servo system to alter the orientation of beam steering mirror 1158 by orientation transducers 1159A and 1159B so as to maintain in two orthogonal dimensions the lateral position of measurement beam 1143 substantially constant independent of changes in the location of measurement object mirror 1164 along the average of the paths of beams 1131 and 1133. Under a set of eleventh embodiment conditions that the physical path length of the measurement beam from the location of the first redirection of the measurement beam by the beam steering element 1158 to the first redirection of the measurement beam by the beam steering element 1152 is equal to the physical path length of the measurement beam from the second redirection of the measurement beam by the beam steering element 1152 to the second redirection of the measurement beam by the beam steering element 1158 and that the physical path length of the measurement beam from the location of the first redirection of the measurement beam by the beam steering element 1152 to measurement object mirror 1164 is equal to the physical path length of the measurement beam from measurement object mirror 1164 to the location of the second redirection of the measurement beam by the beam steering mirror 1152, there will be no lateral shear of beam 1143 at beam steering element 1158 when changes in orientation of measurement object mirror 1164 are compensated by changes in orientation of beam steering element 1152 and when the effects of changes in the location of measurement object mirror 1164 along the average of the paths of beams 1131 and 1133 are compensated by changes in orientation of beam steering mirror 1158. These conditions with respect to physical path lengths will be referenced as the eleventh embodiment conditions.

Beam 1143R is substantially coextensive with beam 1143 and beam 1143R (cf. FIG. 11*a*) has a direction of propagation substantially opposite to the direction of propagation of 1143. As a consequence, beam 1143R substantially retraces the pass through portions of the interferometer, the pass leading to the generation of beam 1143, to generate beam 1111R. The retrace through portions of the interferometer includes in particular a pass to the measurement object mirror 1164. Beam 1111R is substantially coextensive with beam 1111 and beam 1111R has a direction of propagation substantially opposite to the direction of propagation of beam 1111.

Beam 1111R, being polarized orthogonal to the plane of FIG. 11*a*, is reflected by polarizing beam splitter 1150 as beam 1147. Beam 1147 is reflected by mirror 1177 as beam 1149.

Reference beam 1116 is reflected by mirrors 1176A and 1176B to form beam 1118. Mirrors 1176A and 1176B together produce a constant deviation between beams 1116 and 1118 in the plane of FIG. 11*a*, the same as a penta prism.

A portion of beam 1149 is transmitted by nonpolarizing beam splitter 1178 as one component of output beam 1124. A portion of beam 1118 is transmitted by nonpolarizing beam splitter 1178 as a second component of the output beam 1124. Beam 1124 is a mixed optical beam, beams 1149 and 1118 being both polarized orthogonal to the plane of FIG. 11a and beam splitter 1178 being of the nonpolarizing type. Beam 1124 impinges on detector 1186 to generate electrical signal 1136 related to the difference in phase of the measurement and reference beam components of mixed beam 1124. Electrical signal 1136 is transmitted to electronic processor and computer 1188 for subsequent processing to obtain information about the difference in phase of the measurement and reference beam components of mixed beam 1124. The detection of mixed beam is typically by photoelectric detection to produce a heterodyne signal, the phase of which is related to the difference in optical path lengths of the measurement and reference beams. The phase of the heterodyne signal may be determined by electronic processor and computer 1188 for example from a Fourier transform or Hilbert transform of the heterodyne signal.

The remaining description of the eleventh embodiment is the same as corresponding portions given for the descriptions of the fourth and tenth embodiments.

FIGS. 12a–12e depict, in schematic form, the twelfth embodiment of the present invention for measuring a linear displacement of an object substantially independent of the orientation of the object and substantially independent of a lateral displacement of the object, the lateral displacement being orthogonal to the linear displacement. The twelfth embodiment is from the second class of embodiments and variants thereof operating in the first mode of operation for changes in orientation of the object about a first axis and in the second mode of operation for changes in orientation of the object about a second axis orthogonal to the first axis, the first and second axes being orthogonal to the linear displacement, and/or a lateral displacement of the object, the lateral displacement being orthogonal to both the second axis and the linear displacement.

The interferometer system of the seventh and twelfth embodiments are generically similar except with respect to the number of passes the measurement beam makes to the object: the measurement beams of the twelfth embodiment traverse certain sections of the measurement path in two opposite directions of propagation where in the seventh embodiment, the corresponding measurement beam transits the certain sections in only one direction of propagation. Efficient separation of an output measurement beam component from an input measurement beam component in the multiple pass configuration of the twelfth embodiment is effected by use of polarization encoding and polarizing beam splitters.

Many elements of the seventh and twelfth embodiments perform like functions and these elements are indicated by a numeric numbering scheme wherein the numeric number of elements performing like functions for the twelfth embodiment are equal to the numeric number of corresponding elements of the eleventh embodiment incremented by 500. The certain sections of the measurement beam paths are indicated by a numeric numbering scheme wherein the numeric number of the certain section of the measurement path of the twelfth embodiment having the same description as a corresponding path section of the seventh embodiment is equal to the numeric number of corresponding path section of the seventh embodiment incremented by 500.

For the certain sections of the measurement beam paths for the twelfth embodiment, there are measurement beams traversing the certain sections in a reverse direction of propagation, the nonreverse or forward direction of propagation being associated with a first pass to measurement object roof prism 1262 and the reverse direction of propagation being associated with a second pass to the measurement object roof prism 1262. The description of the additional measurement beams traversing the certain sections in a reverse direction are otherwise the same as the corresponding portions of the description given associated measurement beams traversing in a nonreverse direction of propagation for the seventh embodiment, an alphanumeric number of a measurement beam traversing in a reverse direction being equal to the numeric number of the associated measurement beam traversing in a nonreverse direction augmented with the suffix R.

The descriptions of the generation of measurement beam 1233 and reference beam 1212 is the same as the descriptions given for corresponding descriptions of the generation of measurement beam 733 and reference beam 712 of the seventh embodiment. As shown in FIG. 12c, a first portion of beam 1233 is transmitted by nonpolarizing beam splitter 1271 as beam 1235. Beam 1235 impinges on detector 1290 to generate electrical signal 1228. A second portion of beam 1233, being polarized in the plane of FIG. 12c, is reflected by nonpolarizing beam splitter 1271, is transmitted by quarter wave phase retardation plate 1272 as a circularly polarized beam, reflected by mirror 1273 as a beam with opposite-handed circular polarization, transmitted by quarter wave phase retardation plate 1272 as a beam orthogonally polarized to the plane of FIG. 12c, and subsequently a portion thereof reflected by nonpolarizing beam splitter 1271 as beam 1233R. Beam 1233R is orthogonally polarized to the plane of FIG. 12c.

Figures 12A, 12B:
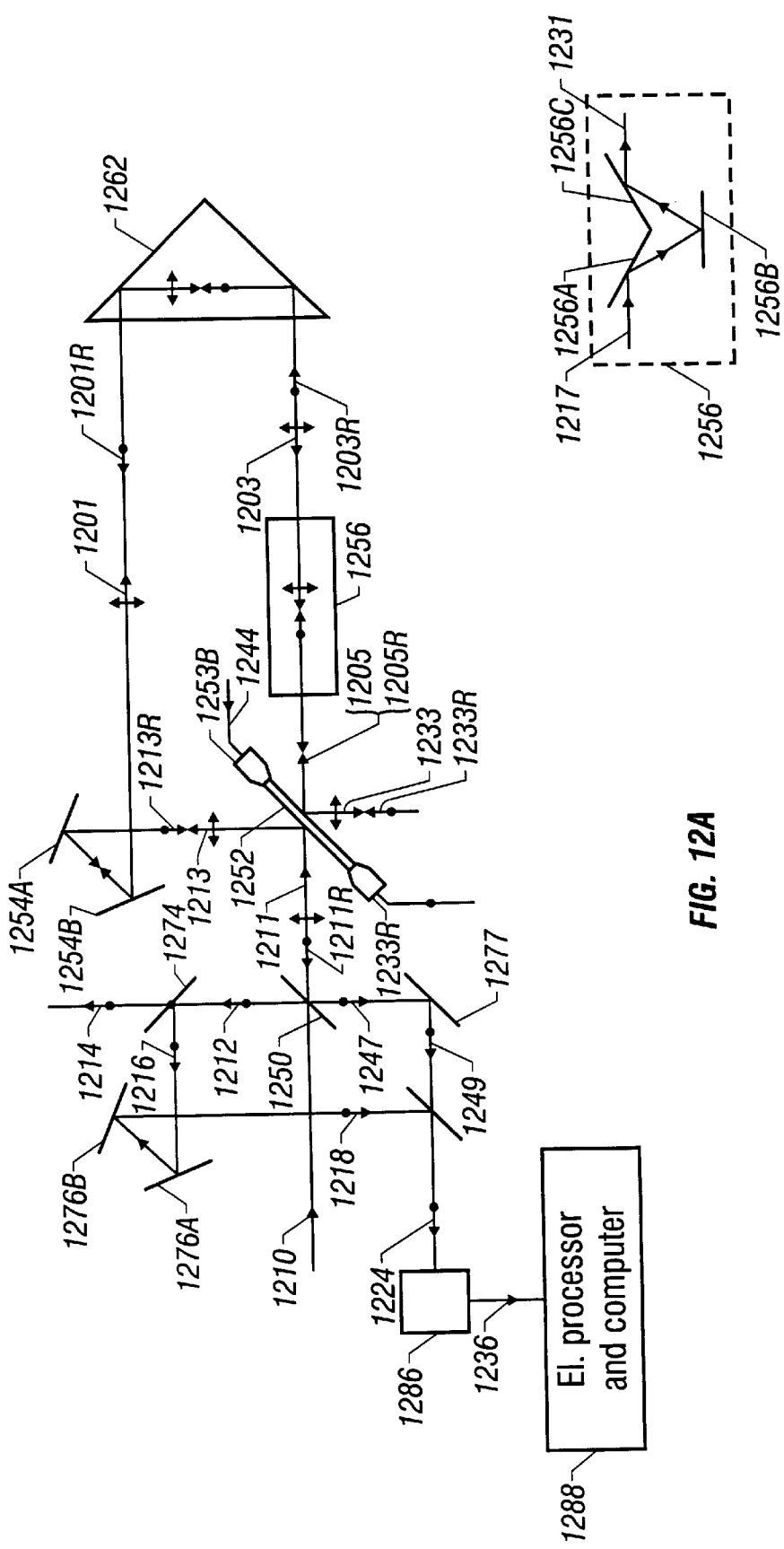
FIGS. 12a–12e are schematic drawings of a twelfth embodiment of the interferometry system.
Figure 12C:
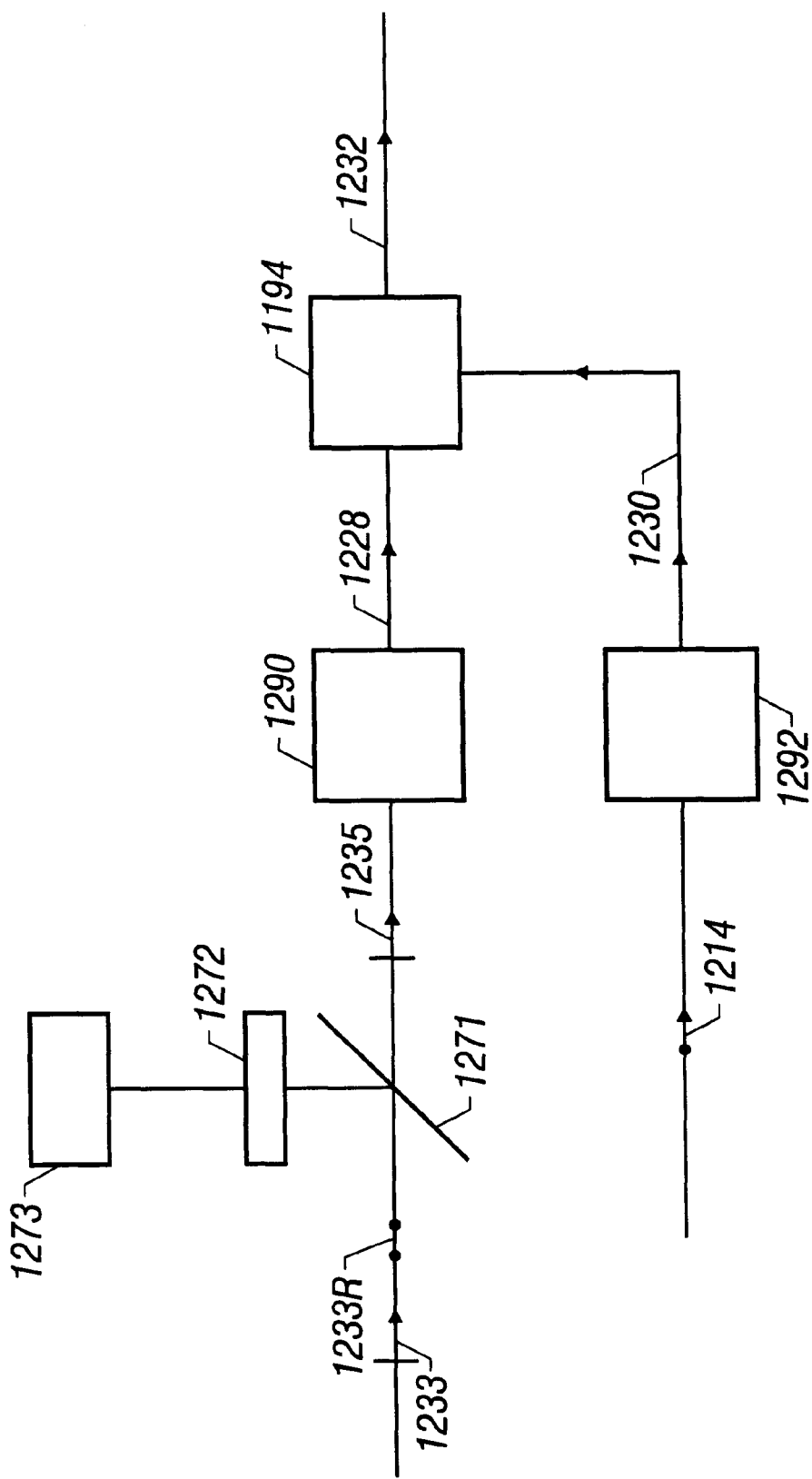
Figure 12D:
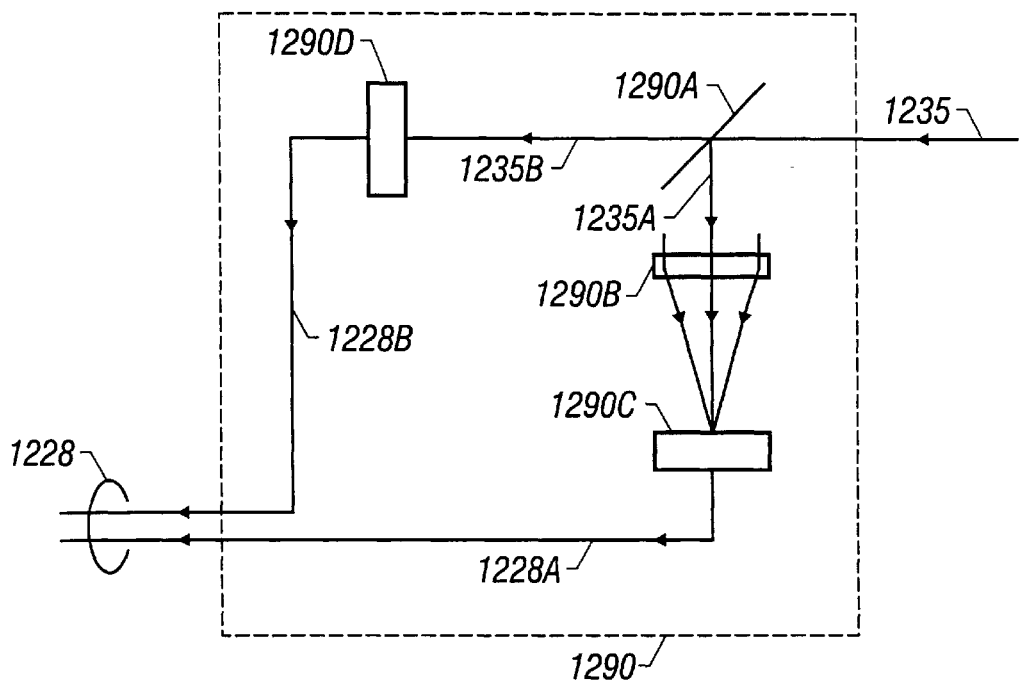

The elements of detector 1290 are depicted, in schematic form, in FIG. 12d. Beam 1235 enters detector 1290 and a first portion of beam 1235 is reflected by nonpolarizing beam splitter 1290A as beam 1235A. Beam 1235A is focused by lens 1290B to a spot onto a one dimensional detector 1290C such as a dual cell detector, a linear array, high speed CCD camera, or a lateral effect photodiode. An one-dimensional data array is transmitted as electronic signal 1228A. The location of the spot on one dimensional detector 1290C is not effected by a lateral shear of beam 1235A but a change in the direction of beam 1235A in the plane defined by the one dimensional detector 1290C and the nominal direction of beam 1235A does shift the location of the spot on detector 1290C. Thus the electronic signal 1228A contains information about the direction of propagation of beam 1235A in the plane defined by the one dimensional detector 1290C and the nominal direction of beam 1235A, a plane corresponding to a plane orthogonal to the plane of FIG. 12a and orthogonal to the nominal direction of propagation of measurement beam 1201.

A second portion of beam 1235 is transmitted as beam 1235B. Beam 1235B impinges on one dimensional detector 1290D such as a dual cell detector to generate electronic signal 1228B. The location of beam 1235B on detector 1290D is effected by a lateral shear of beam 1235B but a change in the direction of propagation of beam 1235B at detector 1290D does shift the location of beam 1235B on one dimensional detector 1290D. Thus the electronic signal 1228B contains information about lateral shear of beam 1235B, the plane defined by the one dimensional detector 1290D being orthogonal to the plane defined by the one dimensional detector 1290C. Electronic signals 1228A and 1228B comprise electronic signal 1228.

Figure 12E:
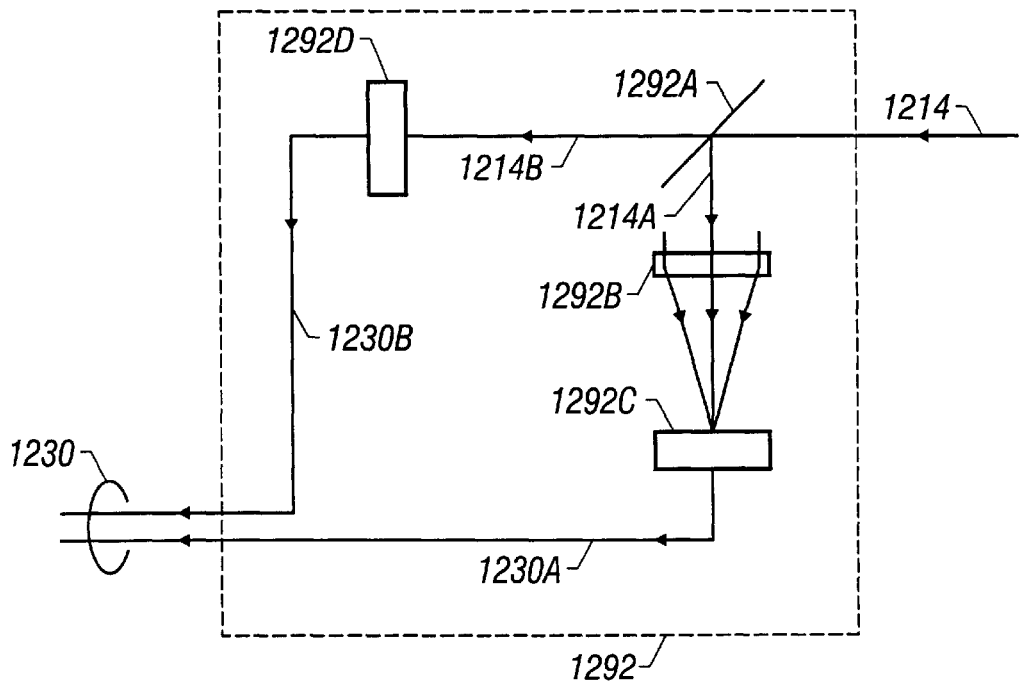

As shown in FIG. 12a, a first portion of reference 1212 is transmitted by nonpolarizing beam splitter 1274 as beam 1214 and a second portion of reference 1212 is reflected by nonpolarizing beam splitter 1274 as beam 1216. As shown in FIGS. 12c and 12e, beam 1214 impinges on detector 1292 to generate electrical signal 1230.

The elements of detector 1292 are depicted, in schematic form, in FIG. 12e. Beam 1214 enters detector 1292 and a first portion of beam 1214 is reflected by nonpolarizing beam splitter 1292A as beam 1214A. Beam 1214A is focused by lens 1292B to a spot on a one dimensional detector 1292C such as a dual cell detector, linear array high, speed CCD camera, or a lateral effect photodiode. A one-dimensional data array is transmitted as electronic signal 1230A. The location of the spot on the one dimensional detector 1292C is not effected by a lateral shear of beam 1214A but a change in the direction of propagation of beam 1214A does shift the location of the spot on the one dimensional detector 1292C. Thus the electronic signal 1230A contains information about the direction of propagation of beam 1214A in the plane defined by the one dimensional detector 1292C and the nominal direction of beam 1214A the plane of one dimensional detector 1292C arranged to correspond to the plane of one dimensional detector 1290C.

A second portion of beam 1214 is transmitted as beam 1214B. Beam 1214B impinges on a one dimensional detector 1292D such as a dual cell detector to generate electronic signal 1230B. The location of beam 1214B on detector 1292D is effected by a lateral shear of beam 1214B but a change in the direction of propagation of beam 1214B at detector 1292D does shift the location of beam 1214B on detector 1292D. Thus the electronic signal 1230B contains information about lateral shear of beam 1214B, the plane defined by the one dimensional detector 1292D arranged to correspond to the plane defined by the one dimensional detector 1290D. Electronic signals 1230A and 1230B comprise electronic signal 1230.

Electronic signals 1228 and 1230 are transmitted to electronic signal processor 1294 (cf. FIG. 12c). From the components of electronic signals 1228 and 1230 that contain information about the directions of propagation of measurement beam 1235A and reference beam 1214A in a plane orthogonal to the plane of FIG. 12c and parallel to the nominal direction of propagation of beam 1235A, electronic processor 1294 generates electronic signal 1232. From the components of electronic signals 1228 and 1230 that contain information about the lateral shear of measurement beam 1235B and reference beam 1214B in the plane of FIG. 12c, electronic processor 1294 generates electronic signal 1234.

Electrical signal 1232 is transmitted to orientation transducers 1253A and 1253B. Information contained in signal 1232 is used as the error signal in a servo system to alter the orientation of beam steering mirror 1252 by orientation transducers 1253A and 1253B so as to maintain in a first plane the direction of propagation of measurement beam 1233 substantially constant independent of changes of orientation of measurement object roof prism 1262, the first plane being orthogonal to the plane of FIG. 12a and parallel to the nominal direction of propagation of beam 1201, and to maintain in a plane orthogonal to the first plane the lateral position of measurement beam 1233 substantially constant independent of translations of measurement object roof prism 1262 nominally orthogonal to the direction of propagation of measurement beam 1201 and substantially independent of changes in the orientation of measurement object roof prism 1262 about a axis orthogonal to the plane of FIG. 12a and orthogonal to the nominal direction of propagation of beam 1201. Under the condition that the physical path length of the measurement beam from the location of the first redirection of the measurement beam by the beam steering element 1252 to measurement object roof prism 1262 is equal to the physical path length of the measurement beam from measurement object roof prism 1262 to the location of the second redirection of the measurement beam by the beam steering mirror 1252, there will be no lateral shear of beam 1233 at beam steering element 1252 when changes in orientation of measurement object roof prism 1262 are compensated by changes in orientation of beam steering element 1252 and when the effects of displacements in the location of measurement object roof prism 1262 nominally orthogonal to the path of beam 1233 are compensated by changes in orientation of beam steering element 1252. This condition with respect to physical path lengths will be referenced as the twelfth embodiment condition.

Beam 1233R is substantially coextensive with beam 1233 and beam 1233R (cf. FIG. 12c) has a direction of propagation substantially opposite to the direction of propagation of 1233. As a consequence, beam 1233R substantially retraces the pass through portions of the interferometer, the pass leading to the generation of beam 1233, to generate beam 1211R. The retrace through portions of the interferometer includes in particular a pass to the object roof prism 1262. Beam 1211R is substantially coextensive with beam 1211 and beam 1211R has a direction of propagation substantially opposite to the direction of propagation of beam 1211.

Beam 1211R, being polarized orthogonal to the plane of FIG. 12a, is reflected by polarizing beam splitter 1250 as beam 1247. Beam 1247 is reflected by mirror 1177 as beam 1249.

Reference beam 1216 is reflected by mirrors 1276A and 1276B to form beam 1218. Mirrors 1276A and 1276B together produce a constant deviation between beams 1216 and 1218 in the plane of FIG. 12a, the same as a penta prism.

A portion of beam 1249 is transmitted by nonpolarizing beam splitter 1278 as one component of output beam 1224. A portion of beam 1218 is transmitted by nonpolarizing beam splitter 1278 as a second component of the output beam 1224. Beam 1224 is a mixed optical beam, beams 1249 and 1218 being both polarized orthogonal to the plane of FIG. 12a and beam splitter 1278 being of the nonpolarizing type. Beam 1224 impinges on detector 1286 to generate electrical signal 1236 related to the difference in phase of the measurement and reference beam components of mixed beam 1224. Electrical signal 1236 is transmitted to electronic processor and computer 1288 for subsequent processing to obtain information about the difference in phase of the measurement and reference beam components of mixed beam 1224. The detection of mixed beam is typically by photoelectric detection to produce a heterodyne signal, the phase of which is related to the difference in optical path lengths of the measurement and reference beams. The phase of the heterodyne signal may be determined by electronic processor and computer 1288 for example from a Fourier transform or Hilbert transform of the heterodyne signal.

The remaining description of the twelfth embodiment is the same as corresponding portions given for the descriptions of the fourth and eleventh embodiments.

A first variant of the twelfth embodiment of the present invention is described for measuring the linear displacement of an object substantially independent of the orientation of the object and substantially independent of a lateral displacement of the object, the lateral displacement being orthogonal to the linear displacement. The first variant of the twelfth embodiment is from the second class of embodiments and variants thereof operating in the second mode of operation for changes in orientation of the object about two orthogonal axes and/or for a lateral displacement of the object, the lateral displacement being orthogonal to the linear displacement.

The interferometer system and at least one beam steering assembly of the first variant of the twelfth embodiment comprise the same elements as the interferometer system and at least one beam steering element of the twelfth embodiment except for the object element, the detector of a certain optical beam, signal produced by the detector of the certain optical beam, and respective servo system.

The object element of the twelfth embodiment, measurement object roof prism 1262, is replaced by a measurement object retroreflector 1262A (not shown in a figure) in the first variant of the twelfth embodiment. As a consequence, the relative directions of propagation of the reference and measurement beam components of output beam 1238A, the output beam of the first variant of the twelfth embodiment corresponding to output beam 738 of the seventh embodiment, is substantially independent of changes in orientation of the measurement object retroreflector 1262A of the first variant of the twelfth embodiment. However a lateral translation of measurement object retroreflector 1262A in a plane orthogonal to the direction of the linear displacement will generate a lateral displacement of measurement beam component of output beam 1238A.

Detector 1276A of the first variant of the twelfth embodiment, corresponding to detector 776 of the seventh embodiment, detects the lateral displacement or shear of the measurement beam component of output beam 1238A and generates electrical signal 1244A, the electrical signal corresponding to electrical signal 744 of the seventh embodiment.

Electrical signal 1244A is transmitted to orientation transducers 1253A and 1253B of the first variant of the twelfth embodiment. Information contained in signal 1244A is used as the error signal in a servo system to alter the orientation of beam steering mirror 1252 by orientation transducers 1253A and 1253B of the first variant of the twelfth embodiment so as to maintain the lateral location of measurement beam component of output beam 1238A substantially constant independent of a lateral translation of measurement object retroreflector 1262A in a plane orthogonal to the direction of the linear displacement and/or substantially independent of changes in orientation of measurement object retroreflector 1262A about two orthogonal axes which are nominally orthogonal to the direction of propagation of beam 1201 of the first variant of the twelfth embodiment.

The remaining description of the first variant of the twelfth embodiment is the same as corresponding portions of the description given for the twelfth embodiment.

FIGS. 13a–13b depict in schematic form an thirteenth embodiment of the present invention for measuring a linear displacement of an object substantially independent of the orientation of the object and lateral displacements of the object, the lateral displacements being orthogonal to the linear displacement. The thirteenth embodiment is from a third class of embodiments and variants thereof of the present invention operating in the first mode of operation for changes in orientation of the object about two orthogonal axes.

The description of light beam 1310 shown in FIG. 13a and of a source of light beam 1310 is the same as the description of light beam 110 and of a source of light beam 110 given for the first embodiment. As shown in FIG. 13a, beam 1310 is reflected by a surface of beam steering mirror 1350 as beam 1312. Beam steering mirror 1350 and orientation transducers 1351A and 1351B comprise a beam steering assembly that redirects the input beam 1310. Beam 1312 is reflected by mirrors 1352A and 1352B to form beam 1314. Mirrors 1352A and 1352B together produce a constant deviation between beams 1312 and 1314 in the plane of FIG. 13a, the same as a penta prism.

Continuing with FIG. 13a, beam 1314 impinges on polarizing beam splitter 1354 with a portion of beam 1314 transmitted as measurement beam 1315 polarized in the plane of FIG. 13a and a second portion of beam 1314 reflected as reference beam 1316 orthogonally polarized to the plane of FIG. 13a.

Beam 1315 is transmitted by polarizing beam splitter 1356 as beam 1317. Beam 1317, polarized in the plane of FIG. 13a, is transmitted by a quarter wave phase retardation plate 1358 as a circularly polarized beam, reflected by measurement object mirror 1360, comprised of a single reflecting surface, as a beam with opposite-handed circular polarization, and subsequently transmitted by quarter wave phase retardation plate 1358 as beam 1319 linearly polarized orthogonal to the plane of FIG. 13a. Beam 1319 is reflected by polarizing beam splitter 1356 as beam 1321. Beam 1321 is reflected by mirror 1362 as beam 1323.

Reference beam 1316 is transmitted by half-wave phase retardation plate 1364 as beam 1318 linearly polarized in the plane of FIG. 13a. Beam 1318 is retroreflected by retroreflector 1366 as beam 1320.

Measurement beam 1323 is reflected by polarizing beam splitter 1368 as one component of output beam 1328. Beam 1320 is transmitted by polarizing beam splitter 1368 as a second component of output beam 1328. Beam 1328 is reflected by mirror 1370 as beam 1330 and beam 1330 is reflected by a second surface of beam steering mirror 1350 as output beam 1332.

Output beam 1332 enters optical system 1398 and exits as beam 1338. The reference beam component of output beam 1332 has experienced image inversions about two orthogonal axes and the measurement beam component of output beam 1332 has experienced an image inversion about one of the orthogonal axes. Optical system 1398 in FIG. 13a introduces an additional image inversion in the measure beam component of beam 1332 relative to the reference beam component of beam 1332 so that reference beam component of beam 1338 has experienced the same number of image inversions about for each of two orthogonal axes modulo two as number of image inversions experienced by the measurement beam component of beam 1338.

The reference beam component of beam 1332 is transmitted by polarizing beam splitter 1372 and reflected by mirror 1374 as beam 1334. Beam 1334 enters image inverter 1376. As shown in FIG. 13b, image inverter 1376 is comprised of three mirrors 1376A, 1376B, and 1376C. The plane of FIG. 13b is orthogonal to the plane of FIG. 13a. beam 1334 is reflected by each of the three mirrors 1376A, 1376B, and 1376C and exits image inverter 1376 as beam 1336.

The measurement beam component of beam 1332 is reflected by polarizing beam splitter 1372 as beam 1333. Beam 1333 is reflected by mirrors 1378A and 1378B to form beam 1335. Mirrors 1378A and 1378B together produce a constant deviation between beams 1333 and 1333 in the plane of FIG. 13a, the same as a penta prism.

Beam 1336 is transmitted by polarizing beam splitter 1380 as one component of output beam 1338. Beam 1335 is reflected by polarizing beam splitter 1380 as a second component of output beam 1338.

A portion of beam 1338 is reflected by nonpolarizing beam splitter 1382 as beam 1340. Beam 1340 impinges on detector 1384 to produce an electrical signal 1348 related to any difference in the directions of propagation of measurement and reference beam components in beam 1340.

A second portion of output beam 1338 is transmitted by nonpolarizing beam splitter 1382 as beam 1342. Beam 1342 is transmitted by a polarizer 1386 orientated to produce a mixed optical beam 1344. Beam 1344 impinges on detector 1388 to generate electrical signal 1346 related to the difference in phase of the measurement and reference beam components of mixed beam 1344. Electrical signal 1346 is transmitted to electronic processor and computer 1390 for subsequent processing for information about the difference in phase of the measurement and reference beam components of mixed beam 1344.

Electrical signal 1348 is transmitted to orientation transducers 1351A and 1351B. Information contained in signal 1348 is used as the error signal in a servo system to alter the orientation of beam steering mirror 1350 by orientation transducers 1351A and 1351B so as to maintain the direction of propagation of the measurement beam component of beam 1332 substantially constant relative to the direction of propagation of the reference beam component of beam 1332 independent of changes of orientation of measurement object mirror 1360. Under the condition that the physical path length of the measurement beam from the first surface of beam steering mirror 1350 to measurement object mirror 1360 is equal to the physical path length of the measurement beam from measurement object mirror 1360 to the second surface of steering mirror 1350, there will be no lateral shear of measurement beam component of beam 1332 at steering mirror 1350 when changes in orientation of measurement object mirror 1360 are compensated by changes in orientation of steering mirror 1350. This condition with respect to physical path lengths will be referenced as the thirteenth embodiment condition.

The remaining description of the thirteenth embodiment is the same as corresponding portions of the descriptions given for preceding embodiments and variants thereof.

The thirteenth embodiment of the present invention exhibits an advantage additional to those described for the first embodiment of the present invention. The additional advantage relates to the size of the beam steering mirror 1350 and orientation transducers 1351A and 1351B. Under the thirteenth embodiment condition, the size of beam steering mirror 1350 need only be large enough to accommodate the projected size of input beam 1310, the location of input beam 1310 and output beam 1332 being stationary at beam steering mirror 1350. This leads to an additional advantage for the thirteenth embodiment with respect to a reduced minimum size permitted for beam steering mirror 1350 and orientation transducers 1351A and 1351B and concomitant improvement in frequency response of beam steering mirror assembly.

For end use applications where the image inversion in beam 1332 does not present undesired complications, inverter 1398 of the thirteenth embodiment may be omitted to form a variant of the thirteenth embodiment without departing from the scope or spirit of the present invention. The remaining description of the variant of the thirteenth embodiment is the same as corresponding portions of the descriptions given for the thirteenth embodiment. Other variations of the thirteenth embodiment can include those in which the measurement object includes a roof prism or a retroreflector to reflect the measurement beam. In such variations the system can operate in the second mode as required to compensate for changes in the position of the measurement object.

In some of the embodiments described above, the beam steering assembly and control circuit can be used to reduce negative effects of spurious reflections on the laser source generating the reference and measurement beams. Spurious reflections resulting from imperfections in the polarizing beam splitting surfaces or the quarter wave plates can, in some cases, reflect back to the laser source and destabilize or alter the performance of the laser source. To reduce such negative effects, the system can be aligned as follows.

If spurious reflections that negatively affect the performance of the source laser are identified, one of the optics that direct the reference beam is adjusted to slightly alter the direction of the reference beam and produce a corresponding change in the direction or position of the exit reference beam. For example, if the system includes a plane mirror as a reference object, the angular orientation of the plane mirror can be adjusted, or if the system includes mirrors that form a reference retroreflector, these mirrors can be adjusted so that their surfaces are not exactly normal to one another. Alternatively, a wedge or prism can be introduced into the reference path to introduce a small angular offset in the reference beam. Whatever the optic, that optic is adjusted until the spurious reflections derived from the reference beam no longer propagate back to the laser source.

In addition, the detector in the control circuit detects the change in the direction or position of the exit reference beam and causes the servo controller to reorient the beam steering mirror in response to a change in the relative position and/or direction of the exit reference and measurement beams. The beam steering mirror redirects the measurement beam such that the exit measurement beam tracks the changes to the exit reference beam, e.g., such that the exit reference and measurement beams remain substantially parallel and/or coextensive. As a result, the spurious reflections derived from the measurement beam should no longer propagate back to the laser source. Moreover, the beam steering assembly and control circuit maintains the alignment of the reference and measurement beams.

This procedure can be implemented during fabrication of the interferometry system to determine an alignment for the optics of the system that prevents or reduces propagation of spurious reflections back to the laser source. In general, the procedure optically introduces a bias offset to the control circuit and its control of the orientation of the beam steering assembly. Alternatively, an offset can be introduced electronically in the servo controller. However introduced, the offset should be large enough to prevent, or at least minimize, propagation of spurious reflections back to the laser source over the typical range of orientations exercised by the beam steering element in response to changes in the angular orientation or position of the measurement object.

Figure 17A:
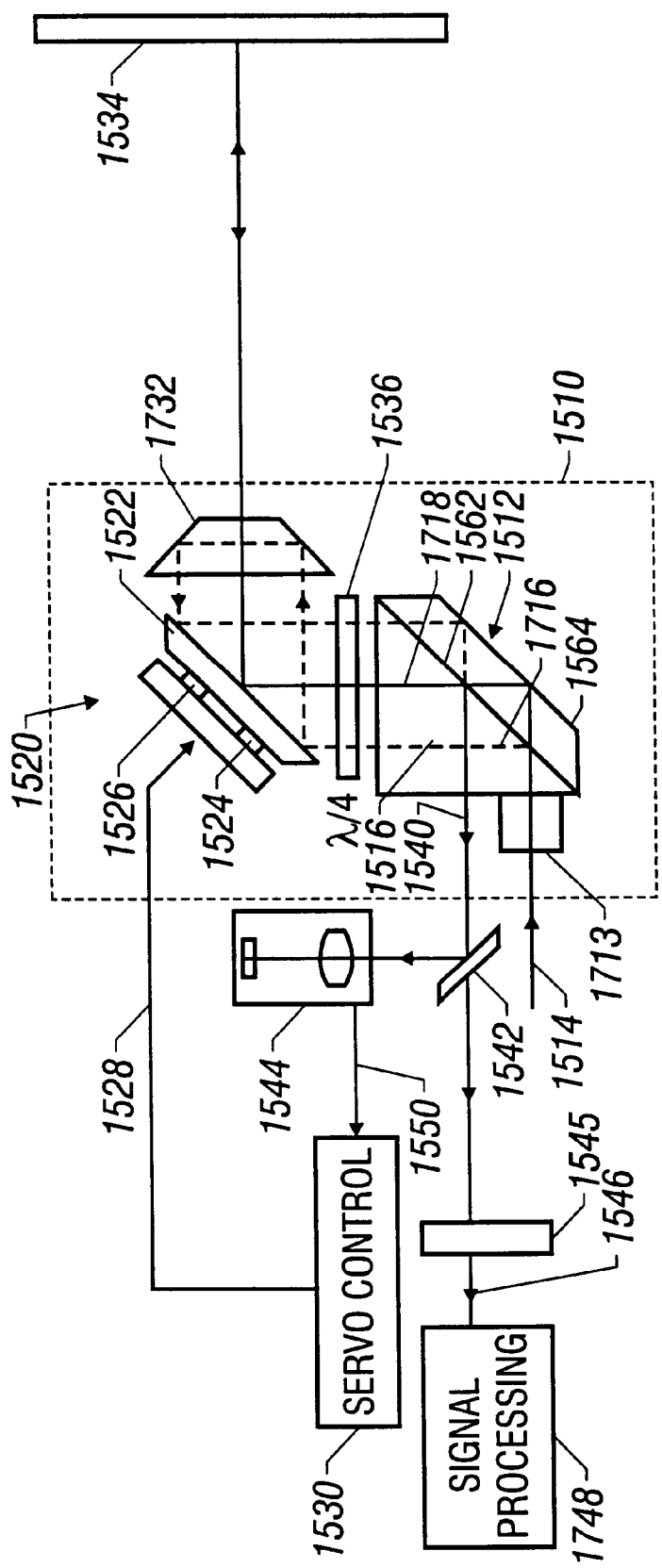
FIGS. 17a–17c are schematic drawings of an angle and distance-measuring embodiment of the interferometry system.
Figure 17B:
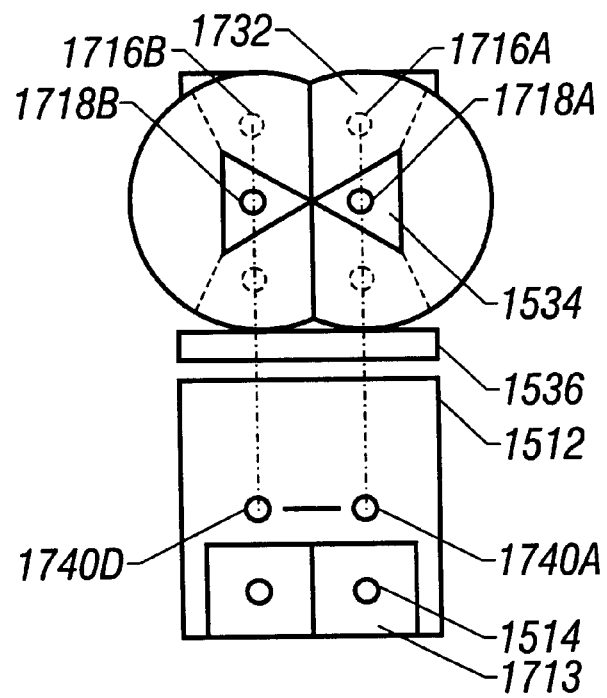
Figure 17C:
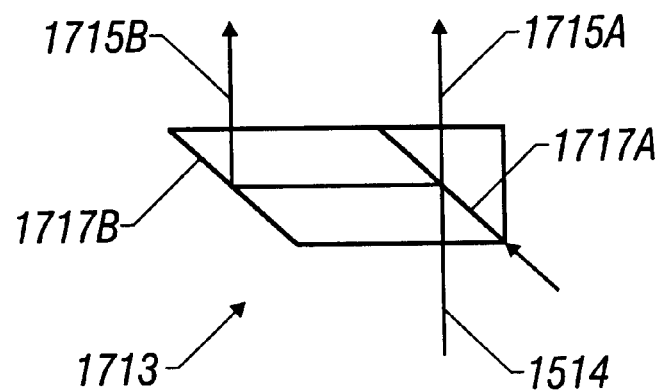

Embodiments of the interferometry system having one or more beam steering assemblies can also be used to measure the angular orientation of a measurement object, in addition to measuring changes in displacement to the measurement object. To measure angular orientation of, e.g., a stage mirror, the interferometry system includes multiple displacement measuring interferometers that are "stacked" to measure distance to multiple, spatially seperated locations on the stage mirror, from which the angular orientation of the stage mirror can be determined. For example, the distance from a reference plane to each of three non-collinear points on the stage mirror completely defines the position and angular orientation of the stage mirror. The interferometry system can include a beam steering assembly that directs beam(s) into and out of the stacked set of interferometers. Alternativelty, the interferometry system can include a common beam steering assembly that directs at least one of the measurement and reference beams for each of the stacked set of interferometers. FIGS. 17a–c illustrates such an embodiment for two stacked interferometers.

The interferometer 1710 of FIGS. 17a–c is identical to that of FIG. 15a described above except that retroreflector 1532 is replaced with a composite retroreflector 1732 (as illustrated in FIG. 17b) and that the system further includes a splitting rhomb 1713 (as illustrated in FIG. 17c) connected to polarizing beam splitter 1512. As shown in FIG. 17c, splitting rhomb 1713 receives input beam 1514 and separates it into two intermediate beams 1715a and 1715b. Splitting rhomb 1713 contains a non-polarizing beam splitting surface 1717a to split the input beam 1514 and a reflective surface 1717b to redirect intermediate beam 1715b parallel to intermediate beam 1715a. FIG. 17c is in a plane perpendicular to that of FIG. 17a and containing input beam 1514.

Polarizing beam splitter 1512 separates intermediate beams 1715a and 1715b into reference beams 1716a and 1716b (dotted line) and measurement beams 1718a and 1718b (solid line), which are linearly polarized orthogonal to one another. FIG. 17a illustrates only one set of reference and measurement beams with the other set propagating parallel to the first set in a second plane parallel to that of FIG. 17a. Subsequent description of the reference and measurement beams will refer to both sets simultaneously as beams 1716 and 1718 unless otherwise specified.

Polarizing beam splitter 1512 directs the measurement beams 1718 to beam steering assembly 1520, which directs the measurement beams through composite reference retroreflector 1732. The composite reference retroreflector is truncated so that beams passing centrally through it are not retroreflected. As a result, beam steering assembly 1520 directs measurement beams 1718 to contact a stage mirror 1534, i.e., the measurement object, at substantially normal incidence. Stage mirror 1534 then reflects the measurement beams back to retrace their paths to beam steering assembly 1520 and polarizing beam splitter 1512. The measurement beams double passes a quarter wave plate 1536, which is positioned between the beam steering assembly 1520 and polarizing beam splitter 1512 and which rotates their linear polarizations by 90°.

Polarizing beam splitter 1512 directs the reference beams 1716 to beam steering assembly 1520, which in turn directs the reference beams to composite reference retroreflector 1732. The composite reference retroreflector then directs the reference beams back to beam steering assembly 1520 and onto polarizing beam splitter 1512. The reference beams also double passes quarter wave plate 1536, which rotates their linear polarizations by 90°. Polarizing beam splitter 1512 then recombines polarization-rotated reference and measurement beams 1716a and 1718a to form output beam 1740a, which includes overlapping exit reference and measurement beams, and recombines polarization-rotated reference and measurement beams 1716b and 1718b to form output beam 1740b, which includes overlapping exit reference and measurement beams.

FIG. 17b is a view of the system looking towards a plane perpendicular to the plane of FIG. 17a and containing the surface of stage mirror 1534. FIG. 17b shows transverse profiles of input beam 1514 on rhomb 1713, reference beams 1716a and 1716b on composite reference retroreflector 1732, measurement beams 1718a and 1718b on stage mirror 1534, and output beams 1740a and 1740b exiting from polarizing beam splitter 1512.

Beam splitter 1542 sends a portion of output beam 1740a to detector system 1544, which measures the difference in directions of propagation of the exit reference and measurement beams of the output beam. The detector system sends an error signal 1550 indicative of any such difference to servo controller 1530, which sends signal 1528 to beam steering assembly 1520 to reorient the beam steering assembly in response to the error signal, as described previously.

Output beam 1740b and the remainder of output beam 1740a each pass through a polarizer that mixes the polarizations of their exit reference and measurement beam components. Signal processing system 1748 receives the mixed beams and determines changes in optical path length between reference beam 1716a and measurement beam 1718a and between reference beam 1716b and measurement beam 1718b, as described above. Based on the changes in measured optical path length and the separation between measurement beams 1718a and 1718b on stage mirror 1534, signal processing system 1548 also determines changes in the angular orientation of the stage mirror.

In other angle-measuring embodiments, the beam steering assembly can be outside the interferometer. One such embodiment includes an interferometry system identical to that of FIG. 15b, except that like the embodiment of FIG. 17a, a splitting rhomb (e.g., splitting rhomb 1713) is attached to polarizing beam splitter 1512 to split input beam 1514 into two parallel propagating beams, and retroreflector 1532 is replaced with composite retroreflector 1732. Because of the splitting rhomb and the composite retroreflector, the interferometer produces two exit beams, just as the embodiment of FIG. 17a produces exit beams 1540a and 1540b. The treatment of the exit beams is identical to that of the embodiment of FIG. 17a in which a signal processor such as signal processor 1748 calculates angle based on signals derived from the two exit beams.

In further embodiments that measure displacement, angle, or both, the beam steering assembly can be used with interferometers that double pass the measurement object. Although such a double pass can passively maintain the parallelism of the exit reference and measurement beams over a range of angular orientations of the measurement object, the dynamic beam steering assembly still provides many of the advantages described above. For example, the beam steering assembly can minimize the transverse displacement of the exit reference and measurement beams or the transverse displacement of components of the reference and measurement beams within the interferometer caused by changes in the angular orientation or position of the measurement object. FIGS. 18a–c schematically illustrate such an embodiment.

The interferometer 1810 of FIGS. 18a–c is identical to that of FIG. 15a described above except that retroreflector 1532 is replaced with a composite retroreflector 1832 (as illustrated in FIG. 18b) and that the system further includes a recirculating prism 1813 (as illustrated in FIG. 18c) connected to polarizing beam splitter 1512 to double pass the beams through the system.

Polarizing beam splitter 1512 separates input beam 1514 into reference beam 1816 (dotted line) and measurement beam 1818 (solid line) and directs the measurement beam 1818 to beam steering assembly 1520, which directs the measurement beam through composite reference retroreflector 1832. The composite reference retroreflector is truncated so that beams passing centrally through it are not retroreflected. As a result, beam steering assembly 1520 directs measurement beam 1818 to contact a stage mirror 1534, i.e., the measurement object, at substantially normal incidence. Stage mirror 1534 then reflects the measurement beam back to retrace its path to beam steering assembly 1520 and polarizing beam splitter 1512. The measurement beam double passes a quarter wave plate 1536, which is positioned between the beam steering assembly 1520 and polarizing beam splitter 1512 and which rotates its linear polarization by 90°.

Polarizing beam splitter 1512 directs the reference beam 1816 to beam steering assembly 1520, which in turn directs the reference beams to composite reference retroreflector 1832. The composite reference retroreflector then directs the reference beam back to beam steering assembly 1520 and onto polarizing beam splitter 1512. The reference beam also double passes quarter wave plate 1536, which rotates its linear polarization by 90°. Polarizing beam splitter 1512 then recombines polarization-rotated reference and measurement beams 1816 and 1818 to form intermediate beam 1841.

As shown in FIG. 18c, recirculating prism 1813 receives intermediate beam 1841 and redirects it back to polarizing beam splitter 1512 with a transverse displacement into the plane of FIG. 18a. In particular, FIG. 18c is in a plane perpendicular to that of FIG. 18a and containing input beam 1514. Thus, recirculating prism 1813 causes intermediate beam 1841 to retrace its path back through the system in a second plane parallel to that of FIG. 18a. As a result, output beam 1840 including overlapping exit reference and measurement beams emerges from the interferometer parallel to input beam 1514 but in the second plane.

FIG. 18b is a view of the system looking towards a plane perpendicular to the plane of FIG. 18a and containing the surface of stage mirror 1534. FIG. 18b shows transverse profiles of input beam 1514 on beam splitter 1512, reference beam 1816 on composite reference retroreflector 1832, measurement beam 1818 on stage mirror 1534, intermediate beam 1841 on recirculating prism 1813, and output beam 1840 exiting from polarizing beam splitter 1512.

Figure 18D:
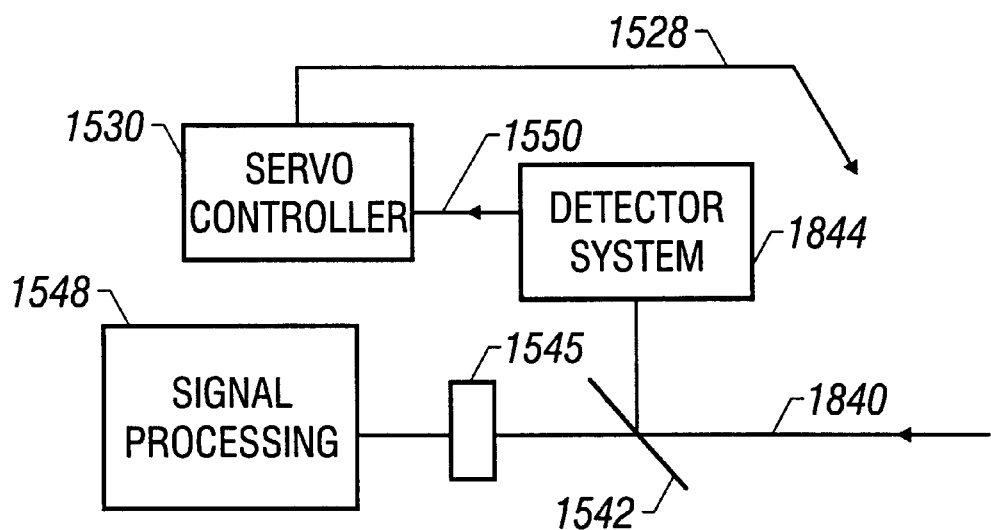

The subsequent treatment of output beam 1840, shown in FIG. 18d, is similar to that described for output beam 1540 with reference to FIG. 15a. In particular, beam splitter 1542 sends a first portion of output beam 1840 to a detector system 1844 and a second portion through polarizer 1545 to signal processing system 1548. Unlike detector system 1544, however, detector system 1844 operates in a hybrid mode. In particular, in a plane parallel to the plane of FIG. 18a, detector system 1844 measures the change in the propagation direction the measurement beam component of output beam 1840 relative to the reference beam component, and in a plane perpendicular to the planes of FIGS. 18a and 18b, it measures the change in position of the measurement beam component of output beam 1840 relative to the reference beam component. Alternatively, detector system 1844 can measure the propagation direction and position of the measurement beam component of output beam 1840 relative to some absolute propagation direction and position, respectively. The measured change in propagation direction of the measurement beam component indicates a change in the angular orientation of stage mirror 1534 in the plane of FIG. 18a, whereas the measured change in position of the measurement beam component indicates a change in the angular orientation of stage mirror 1534 within a plane perpendicular to that of FIG. 18a. Detector system 1844 sends an error signal 1550 indicative of a change in the angular orientation of the stage mirror 1534 to servo controller 1530 based on the measured changes of the measurement beam component. Servo controller 1530 then sends control signal 1528 to beam steering assembly 1512 to reorient beam steering element 1522 in response to the indicated change in angular orientation of stage mirror 1534.

Other double-pass embodiments can include interferometry systems that combine the beam steering assembly described above with double-pass plane mirror interferometers or double-pass differential plane mirror interferometers, such as those described in C. A. Zanoni, "Differential Interferometer Arrangements for Distance and Angle Measurements: Principles, Advantages, and Applications" (*VDI Berichte Nr.* 749:93–106, 1989). Also, in other embodiments the beam steering assembly can be outside the interferometer and the interferometer can double pass the measurement beam to the measurement object. For example, in a manner similar to the incorporation of recirculating prism 1813 and composite retroreflector 1832 in FIG. 18a, which allowed the interfereometer to double pass the reference and measurement beams, a recirculating prism and a composite retroreflector can be added to the interferometry system of FIG. 15c to double pass the reference and measurement beams. In this latter case, the location of the recirculating prism is not between the interferometer and beam steering assembly, but rather downstream of the beam steering assembly. Alternatively, the beam steering assembly can be outside a high-stability plane-mirror interferometer as shown in FIG. 18e.

Figure 18F:
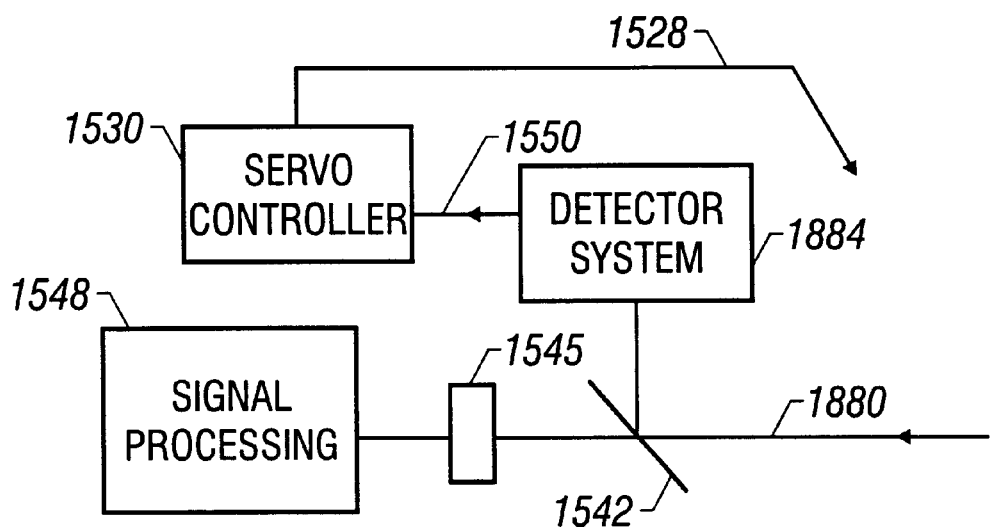
Figure 18E:
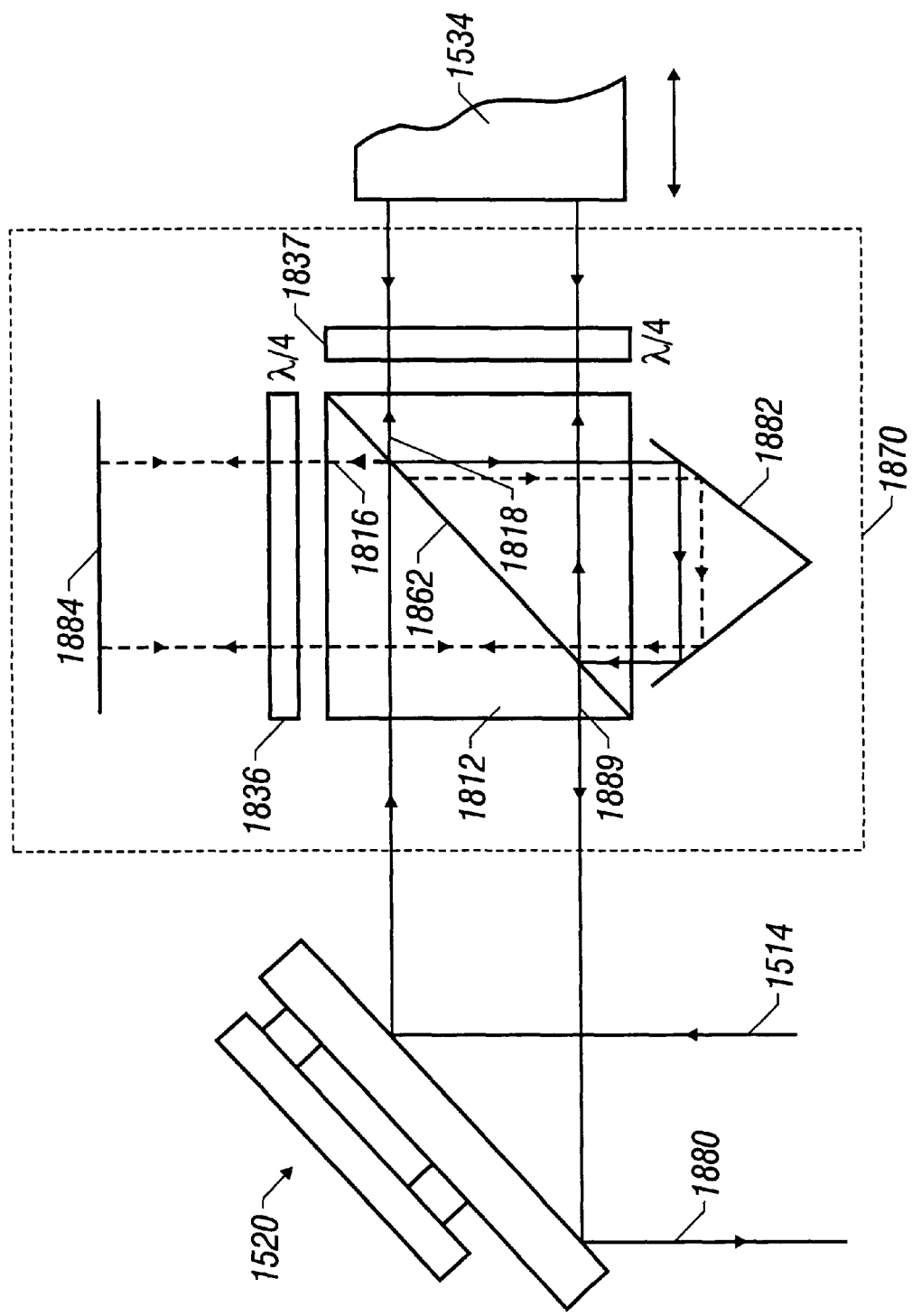

Referring to FIG. 18e, beam steering assembly 1520 directs input beam 1514 into a high-stability, plane-mirror interferometer 1870 comprising a polarizing cube beam splitter 1812, a retroreflector 1882, a reference mirror 1884, and two quarter wave plates 1836 and 1837. Beam splitter 1812 has polarizing beam-splitting interface 1862. Beam splitter 1812 separates input beam 1514 into reference beam 1816 (dotted line) and measurement beam 1818 (solid line), reflecting reference beam towards reference mirror 1884 and transmitting measurement beam 1818 towards stage mirror 1534. Reference mirror 1884 reflects reference beam 1816 back to beam splitter 1812, which now transmits reference beam 1816 to retroreflector 1882 because it double passes quarter wave plate 1836. Retroreflector 1882 in turn directs reference beam 1816 back to beam splitter 1812, which transmits reference beam 1816 back towards reference mirror 1884. Once again, reference mirror 1884 reflects reference beam 1816 back to beam splitter 1812 with reference beam 1816 again double passing quarter wave plate 1836. Similarly, stage mirror 1534 reflects measurement beam 1818 back to beam splitter 1812, which now reflects measurement beam 1818 to retroreflector 1882 because it double passes quarter wave plate 1837. Retroreflector 1882 in turn directs measurement beam 1818 back to beam splitter 1812, which reflects measurement beam 1818 back towards stage mirror 1534. Once again, stage mirror 1534 reflects measurement beam 1818 back to beam splitter 1812 with measurement beam 1818 again double passing quarter wave plate 1837. Note that the reference and measurement beams between beam splitter 1812 and retroreflector 1882 are collinear but FIG. 18e depicts them as separate for clarity.

At this point, reference beam 1816 has contacted reference mirror 1884 twice, double passing it, and the measurement beam 1818 has contacted stage mirror 1534 twice, double passing it. Now, beam splitter 1812 recombines the double-passed reference and measurement beams into intermediate beam 1889, which is then directed by beam steering assembly 1520 to form output beam 1880.

The subsequent treatment of output beam 1880, shown in FIG. 18f, is similar to that described for output beam 1540 with reference to FIG. 15a. In particular, beam splitter 1542 sends a first portion of output beam 1880 to a detector system 1884 and a second portion through polarizer 1545 to signal processing system 1548. Unlike detector system 1544, however, detector system 1884 measures the change in position of the measurement beam component of output beam 1840 relative to the reference beam component and not the change in propagation of direction of the measurement beam component relative to the reference beam component. This is because the double-pass in interferometer 1870 causes the measurement and reference beam components in the output beam 1840 to be parallel to one another despite a change in angular orientation of stage mirror 1534. Such a change, however, imparts a transverse displacement to the measurement beam components of output beam 1880. Thus, a measured change in the position of the measurement beam component of output beam 1880 along a transverse axis in the plane of FIG. 18e indicates a change in the angular orientation of stage mirror 1534 in the plane of FIG. 18e, and a measured change in the position of the measurement beam component of output beam 1880 along a transverse axis perpendicular to the plane of FIG. 18e indicates a change in the angular orientation of stage mirror 1534 in a plane perpendicular to that of FIG. 18e. In other embodiments, detector system 1884 measures changes in the position of the measurement beam component of output beam 1840 relative to some absolute position, rather than relative to the reference beam component, to determine changes in the angular orientation of stage mirror 1534. In any case, detector system 1884 sends an error signal 1550 indicative of a change in the angular orientation of the stage mirror 1534 to servo controller 1530 based on the measured changes in the position of the measurement beam component. Servo controller 1530 then sends control signal 1528 to beam steering assembly 1512 to reorient beam steering element 1522 in response to the indicated change in angular orientation of stage mirror 1534.

As described above, the beam steering assembly redirects the input and output beams to minimize the transverse displacement between the exit reference and measurement beams caused by a change in the angular orientation or position of the measurement object. As a consequence, the beam steering assembly also reduces transverse displacements of beam components within the interferometer caused by a change in the angular orientation or position of the measurement object. In other embodiments, rather than determining the control signal for the beam steering assembly based on a portion of the output beam, the control signal can be determined from a measurement beam component within the interferometer.

In any of the interferometry systems described above, the input, reference, measurements, intermediate, and output beams can include multiple, well-separated wavelengths to measure dispersion along the measurement path to the measurement object. The well-separated wavelengths can come from, for example, fundamental and frequency-doubled wavelengths of a laser, e.g., fundamental and doubled Nd:Yag at 1064 and 532 nm or doubled and quadrupled Nd:Yag at 532 and 266 nm. One such source is a Helium-Neon laser light source as described in U.S. patent application No. 09/305,808 entitled "Helium-Neon Laser Light Source Generating Two Harmonically Related, Single-Frequency Wavelengths for Use in Displacement and Dispersion Measuring Interferometry" by William A. Shull and Carl A. Zanoni filed Apr. 28, 1999 and the contents of which are incorporated herein by reference. The measurement of changes in optical path length to the measurement object at multiple wavelengths can be used to correct the displacement measurement for air turbulence along the measurement path and covert the optical path length change to a geometric path length change.

Figure 19A:
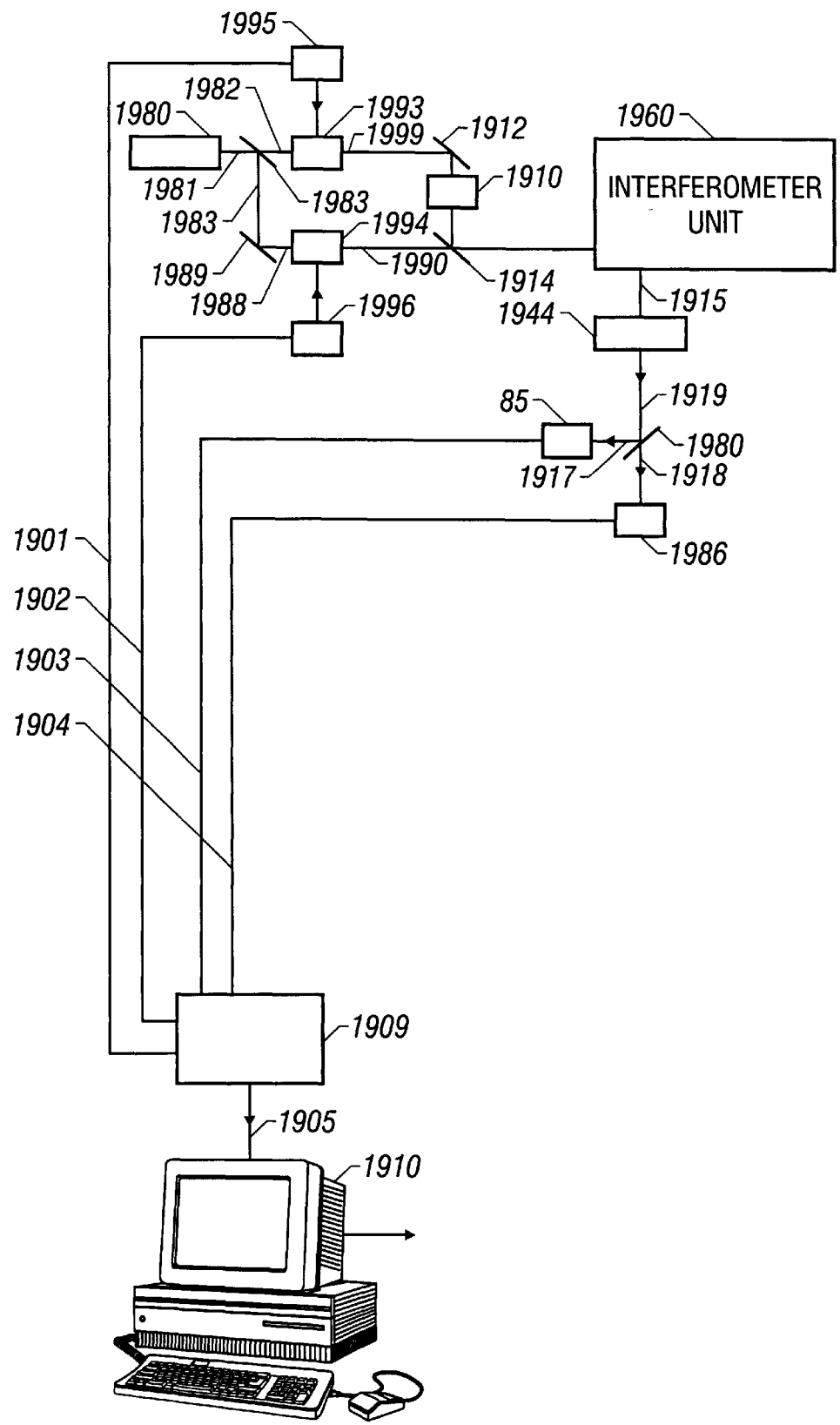
FIGS. 19a–19c relate to a dispersion-measuring embodiment of the interferometry system.
Figure 19B:
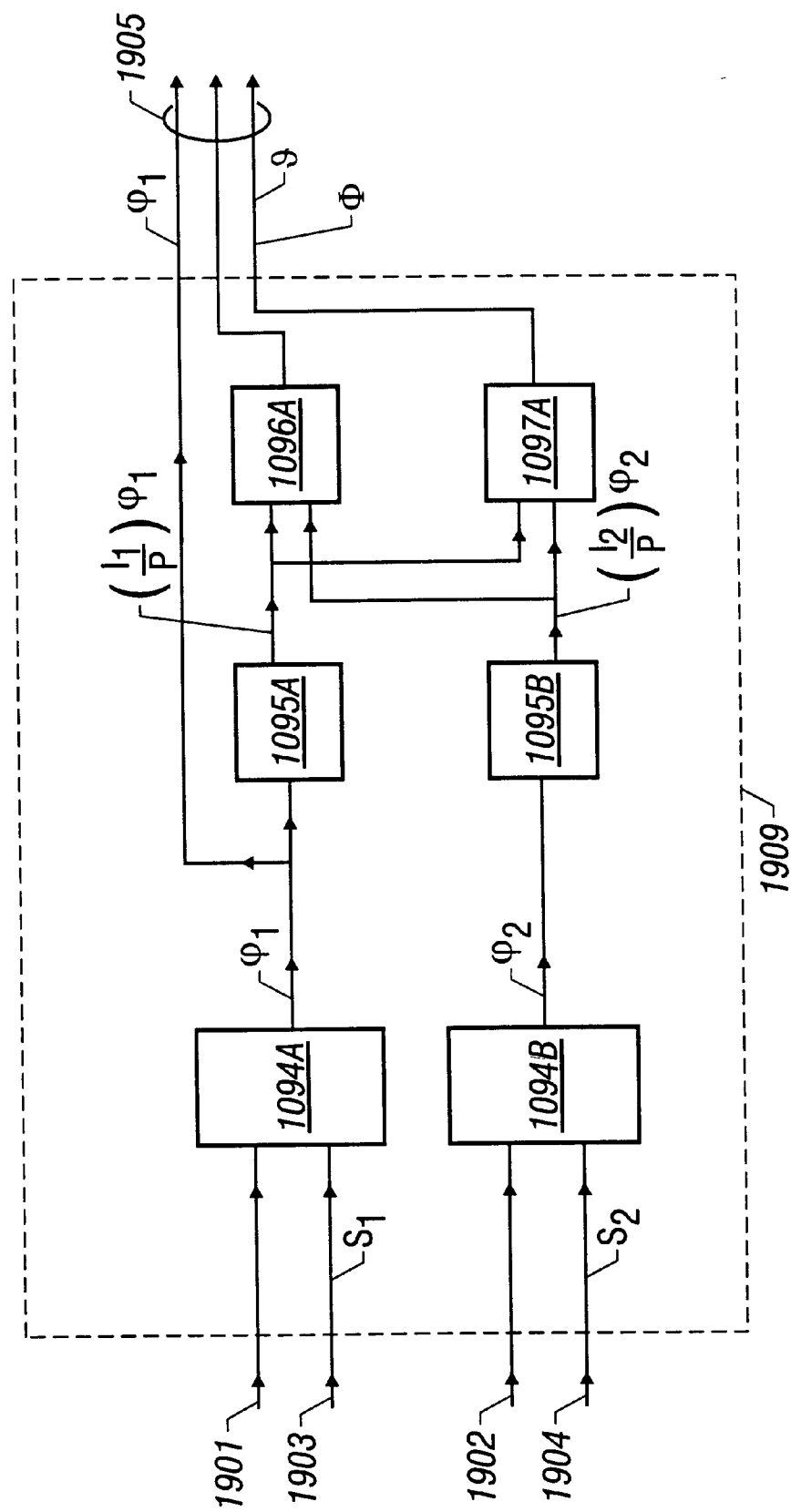

FIGS. 19a–b schematically illustrate a displacement and dispersion interferometry system. A laser light source 1980 generates a light beam 1981 that is a coextensive superposition of two beams having well-separated, single-frequency wavelengths $\lambda_1$ and $\lambda_2$. The ratio of the wavelengths ($\lambda_1/\lambda_2$) has a known value that can be expressed, at least approximately, as $l_1/l_2$ where $l_1$ and $l_2$ are integers. In some embodiments, the two-wavelengths are harmonically related. A dichroic beam splitter 1983 splits superposed beam 1981 into two single-wavelength beams 1982 and 1988, beam 1982 at wavelength $\lambda_1$ and beam 1988 at $\lambda_2$. Beam 1982 passes through a first acousto-optical modulation system 1993 powered by driver 1995 to become beam 1999. Similarly, beam 1988, after being redirected by mirror 1989, passes through a second acousto-optical modulation system 1994 powered by driver 1996 to become beam 1990. Acousto-optical modulation systems 1993 and 1994 each produce a frequency splitting between orthogonal linear polarization components of beams 1999 and 1990, respectively.

In particular, acousto-optical modulation system 1993 shifts the optical frequency of the x-polarization component of beam 1982 by an amount $f_1$ with respect to its y-polarization component to produce beam 1999. Similarly, acousto-optical modulation system 1994 shifts the optical frequency of the x-polarization component of beam 1988 by an amount $f_2$ with respect to its y-polarization component to produce beam 1990. In this description, the z-axis is collinear with the propagation direction of the beam, the x-axis is in the plane of FIG. 19a perpendicular to the z-axis, and the y-axis is perpendicular to the plane of FIG. 19a. The values of the frequency shifts $f_1$ and $f_2$ are determined by drivers 1995 and 1996, respectively, and are many orders of magnitudes smaller (e.g., about $10^{-7}$ smaller) than the optical frequencies defined by $\lambda_1$ and $\lambda_2$. Acousto-optical modulation systems 1993 and 1994 each include at least one acousto-optical modulator and one or more additional optical elements such as a prism and a birefringent element. Suitable acousto-optical modulation systems are described by G. E. Sommargren in U.S. Pat. Nos. 4,684,828 and 4,687,958, and by H. A. Hill in U.S. Pat. application Ser. No. 09/061,928 filed Apr. 17, 1998, the contents of all of which are incorporated herein by reference. The frequency splittings produced by the acousto-optical modulation systems permit the use of heterodyne interferometry techniques. Other frequency splitting techniques known in the art can also be used to produce heterodyne frequency splittings. Alternatively, in other embodiments, homodyne interferometry techniques can be used in which case the frequency splittings are not necessary.

In some embodiments, either or both of acousto-optical modulation systems 1993 and 1994 can additionally introduce a frequency offset to both polarization components of beams 1982 and 1988, respectively. For example, acousto-optical modulation system 1993 can shift the x-polarization component of beam 1982 by $f_0$ and its y-polarization component by $f_0+f_1$, and acousto-optical modulation system 1994 can shift the x-polarization component of beam 1988 by $f_0'$ and its y-polarization component by $f_0'+f_2$. The frequency offsets can improve isolation between source 1980 and the interferometer downstream.

Beam 1999 is directed by mirror 1912 to dichroic beam splitter 1914, which combines beams 1999 and beam 1990 into beam 1920. Beam 1920 thus comprises frequency-shifted orthogonal polarization components at $\lambda_1$ and frequency-shifted orthogonal polarization components at $\lambda_2$, all of which are substantially coextensive and collinear.

Beam-shaping optics 1910 modify the transverse spatial profile of beam 1999 so that the components of beam 1920 at $\lambda_1$ have similar diameters and, more particularly, similar transverse intensity profiles as those of the components of beam 1920 at $\lambda_2$. In other embodiments, beam-shaping optics 1910 can be positioned either before or after the acousto-optical modulation systems and can vary the beam at $\lambda_1$ or the beam at $\lambda_2$ where ever they are separated from one another. Suitable beam-shaping optics include, for example, beam expanders, beam compressors, variable density filters, and apodizing masks. Such elements can be used separately or in combination to produce the similar transverse intensity profiles.

Beam 1920 is directed into an interferometer unit 1960 that includes an interferometer and a beam steering assembly, as described in any of the embodiments above. Interferometer unit 1960 produces exit beam 1915 comprising an overlapping pair of exit reference and measurement beams at each of two wavelengths $\lambda_1$ and $\lambda_2$. As described above, the dynamic control system in interferometry unit 1960 reduces the consequences of changes in angular orientation or position of the measurement object on exit beam 1915. The separate reference and measurement paths in interferometry unit 1960 a phase shift $\phi_1$ between the x-polarized and y-polarized components of exit beam 1915 at wavelength $\lambda_1$ and introduces a phase shift $\phi_2$ between the x-polarized and y-polarized components of exit beam 1915 at wavelength $\lambda_2$. An expression for the phase shifts is given by:

$$\phi_j = Lpk_j n_j + \zeta_j, \text{ where } j=1 \text{ or } 2 \tag{3}$$

where L is the round trip distance traversed by measurement beam 1918, p is the number of round-trip passes in the interferometer (p=1 for the presently described interferometer), $n_j$ is the average refractive index of gas 1998 at wavenumber $k_j = (2\pi)/\lambda_j$, and $\zeta_j$ is a phase-offset for wavelength $\lambda_j$, which includes all contributions to the phase shifts $\phi_j$ that are not related to the path traversed by measurement beam 1918. Because the components of measurement beam 1918 at wavelengths $\lambda_1$ and $\lambda_2$ traverse the same geometric distance L but experience different refractive indices $n_1$ and $n_2$, the phases $\Omega_j$ can be used to determine dispersion in along the measurement path to the measurement object.

Polarizer 1944 (oriented, e.g., at 45 degrees to the plane of the FIG. 19*a*) mixes the x- and y-polarization components of exit beam 1915 at each of wavelengths $\lambda_1$ and $\lambda_2$ to produce a mixed beam 1919. A dichroic beam splitter 1980 then separates mixed beam 1919 into a first signal beam 1917 at wavelength $\lambda_1$ and a second signal beam 1918 at wavelength $\lambda_2$. Photoelectric detectors 1985 and 1986 measure the time-varying intensities of signal beams 1917 and 1918, respectively, to produce interference, heterodyne signals $s_1$ and $s_2$, respectively. The signals $s_j$ have the form $$s_j = A_j \cos[\alpha_j(t)], j=1 \text{ and } 2 \tag{4}$$

where the time-dependent arguments $\alpha_j(t)$ are given by $$\alpha_j(t) = 2\pi f_j t + \phi_j, j=1 \text{ and } 2 \tag{5}$$

Heterodyne signals $s_1$ and $s_2$ are transmitted to processing system 1909 for analysis as electronic signals 1903 and 1904, respectively, in either digital or analog format. Processing system 1909 also receives electronic signals 1901 and 1902 from drivers 1995 and 1996, respectively, indicative of their respective driving frequencies (e.g., heterodyne split frequencies $f_1$ and $f_2$) and phases.

Referring to FIG. 19*b*, processing system 1909 further includes electronic processors 1094A and 1094B to determine the phases $\phi_1$ and $\phi_2$, respectively. Processor 1094A determines $\phi_1$ based on signal 1903 ($s_1$) and signal 1901 (heterodyne reference phase at $f_1$ for driver 1995), and processor 1094B determines $\phi_2$ based on signal 1904 ($s_2$) and signal 1902 (heterodyne reference phase at $f_2$ for driver 1996). The processors can use either digital or analog signal processing techniques, including, e.g., time-based phase detection such as a digital Hilbert transform phase detector. See, e.g., section 4.1.1 of R. E. Best, "Phase-locked loops: theory, design, and applications" 2nd ed. (McGraw-Hill, New York, 1993). In other embodiments, signals 1901 and 1902 can be derived from mixed reference phase beams produced by mixing the polarization components of a portion of each of beams 1999 and 1990, respectively.

Phases $\phi_1$ and $\phi_2$ determined by processors 1094A and 1094B are next multiplied by $l_1/p$ and $l_2/p$, respectively, in electronic processors 1095A and 1095B, respectively, preferably by digital processing, resulting in phases $(l_1/p)\phi_1$ and $(l_2/p)\phi_2$, respectively. The phases $(l_1/p)\phi_1$ and $(l_2/p)\phi_2$ are next added together in electronic processor 1096A and subtracted one from the other in electronic processor 1097A, preferably by digital processes, to create the phases $\theta$ and $\Phi$, respectively. Formally, $$\vartheta = \left(\frac{l_1}{p}\varphi_1 + \frac{l_2}{p}\varphi_2\right) \tag{6}$$

$$\Phi = \left(\frac{l_1}{p}\varphi_1 - \frac{l_2}{p}\varphi_2\right) \tag{7}$$

Referring again to FIG. 19*a*, the phases $\phi_1$, $\theta$, and $\Phi$ are transmitted to computer 1910 as signal 1905, in either digital or analog format.

The refractivity of the gas in the measurement path to the measurement object, $(n_1-1)$, can be calculated using the formula $$n_1 - 1 = \frac{\Gamma}{\chi L[1-(K/\chi)^2]}\{[\vartheta(K/\chi) - \Phi] - Q\} \tag{8}$$

where $$\chi = (l_1 k_1 + l_2 k_2)/2 \tag{9}$$

$$K = (l_1 k_1 - l_2 k_2)/2 \tag{10}$$

$$\Gamma = \frac{n_1 - 1}{n_2 - n_1} \tag{11}$$

the quantity $\Gamma$ being the reciprocal dispersive power of the gas which is substantially independent of environmental conditions and turbulence in the gas. The offset term Q is defined as $$Q = \xi(K/\chi) - Z \tag{12}$$

where $$\xi = \left(\frac{l_1}{p}\zeta_1 + \frac{l_2}{p}\zeta_2\right) \tag{13}$$

$$Z = \left(\frac{l_1}{p}\zeta_1 + \frac{l_2}{p}\zeta_2\right) \qquad (14)$$

Values of $\Gamma$ may be computed from knowledge of the gas composition and from knowledge of the wavelength dependent refractivities of the gas constituents. For example, for the wavelengths $\lambda$ equal to 632.8 nm and $\lambda_2$ equal to 316.4 nm, $\Gamma$ equals about 21.4.

For those applications related to displacement measuring interferometry, the heterodyne phase $\phi_1$ and phases $\theta$ and $\Phi$ may be used to determine the geometric distance L, independent of the effects of the refractive index of gas 1998 in the measurement path, using the formula:

$$L = \frac{1}{(\chi + K)}\left\{\frac{l_1}{p}(\varphi_1 - \zeta_1) - \frac{\Gamma}{[1-(K/\chi)]}[(K/\chi)\vartheta - \Phi - Q]\right\} \qquad (15)$$

The ratio of the wavelengths can be expressed in terms of $(K/\chi)$ from Eqs. (9) and (10) with the result $$\frac{\lambda_1}{\lambda_2} = \left(\frac{l_1}{l_2}\right)\left[\frac{1-(K/\chi)}{1+(K/\chi)}\right] \qquad (16)$$

When operating under the condition $$|K/\chi| \ll \frac{(n_2 - n_1)}{(n_2 + n_1)} \qquad (17)$$

the ratio of the phases $\Phi$ and $\theta$ has the approximate value $$(\Phi/\vartheta) \cong -\frac{(n_2 - n_1)}{(n_2 + n_1)} \qquad (18)$$

Where $\epsilon$ is the relative precision desired for the measurement of the refractivity of the gas or of the change in the optical path length of the measurement leg due to the gas, and the following inequality applies:

$$\left|\frac{\lambda_1}{\lambda_2} - \frac{l_1}{l_2}\right| \ll \left(\frac{l_1}{l_2}\right)(n_2 - n_1)\varepsilon \qquad (19)$$

Eqs. (8) and (15) reduce to more simple forms of $$n_1 - 1 = -\frac{\Gamma}{\chi L}(\Phi + Q) \qquad (20)$$

$$L = \frac{1}{\chi}\left[\frac{l_1}{p}(\varphi_1 - \zeta_1) + \Gamma(\Phi + Q)\right] \qquad (21)$$

respectively. Using the equations above, computer 1910 calculates ($n_1$-1), L, and/or changes in L based on signal 1905 from processing system 1909. Similar calculations for L can also be performed with respect to $n_2$.

In the presently described embodiment, interferometer unit 1960 receives input beam 1920 and produces exit beam 1915, each of which include both wavelengths $\lambda_1$ and $\lambda_2$. In other embodiments, the interferometer unit can include polarizer 1944 and dichroic beam splitter 1980 to directly produce signal beams 1917 and 1918. Also, rather than mixing polarizations of exit beam 1915 when it includes both wavelengths $\lambda_1$ and $\lambda_2$ the interferometer unit can split beam 1915 into beams having either wavelength $\lambda_1$ or wavelength $\lambda_2$ and then mix the polarizations of each of the split beams to produce signal beams 1917 and 1918. Furthermore, in other embodiments, the interferometer unit can include dichroic beam splitter 1914 to combine two input beams at wavelengths $\lambda_1$ and $\lambda_2$, respectively, into one input beam at both wavelengths. Also, the interferometer unit can receive separate input beams at wavelengths $\lambda_1$ and $\lambda_2$, respectively, and include one or more dichroic beam splitters to separate each of the input beams into reference and measurement beams at their respective wavelengths. In the latter case, the interferometer unit directs the measurement beams at wavelengths $\lambda_1$ and $\lambda_2$ along a common path contacting the measurement object, and then recombine each of the measurement beams with its respective reference beam.

Figure 19C:
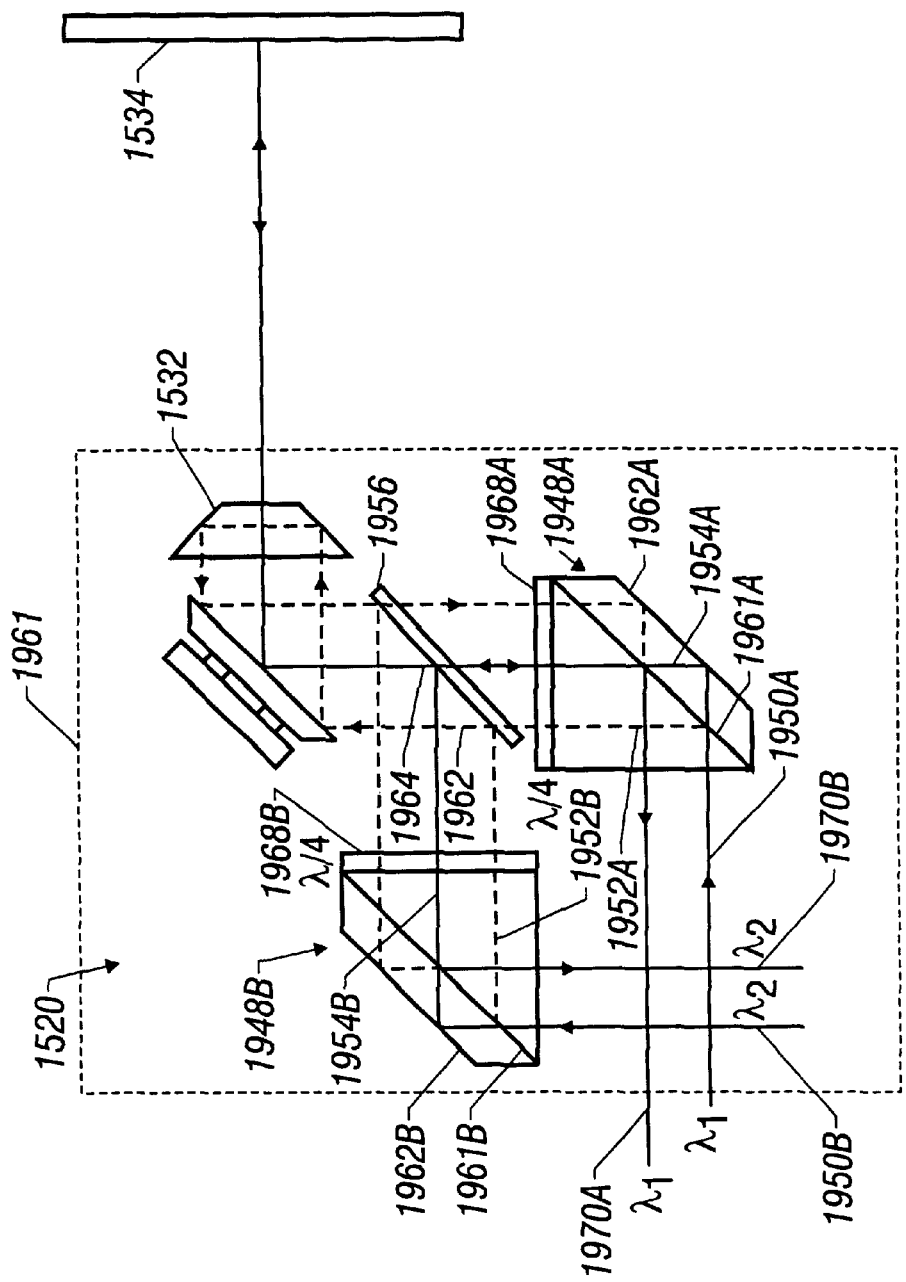

FIG. 19c schematically illustrates such an interferometer unit 1961. Polarizing beam splitter 1948a separates input beam 1950a at wavelength $\lambda_1$ into reference beam 1952a and measurement beam 1954a, both at wavelength $\lambda_1$. Similarly, polarizing beam splitter 1948b separates input beam 1950b at wavelength $\lambda_2$ into reference beam 1952b and measurement beam 1954b, both at wavelength $\lambda_2$. For example, input beams 1950a and 1950b can be beams 1990 and 1999, respectively, from FIG. 19a. Polarizing beam splitters 1948a and 1948b have polarizing beam splitting surfaces 1961a and 1961b, respectively, and reflective surfaces 1962a and 1962b, respectively. Dichroic beam splitter 1956 combines reference beams 1952a and 1952b into reference beam 1962 having both wavelengths $\lambda_1$ and $\lambda_2$, and combines measurement beams 1954a and 1954b into measurement beam 1964 having both wavelengths $\lambda_1$ and $\lambda_2$. Reference beams 1952a, 1952b, and 1962 are depicted as dashed lines in FIG. 19c, whereas measurement beams 1954a, 1954b, and 1964 are depicted as solid lines in FIG. 19c.

Reference beam 1962 and measurement beam 1964 propagate to beam steering assembly 1520, which directs reference beam to retroreflector 1532 and measurement beam to stage mirror 1534. Retroreflector 1532 and stage mirror 1534 reflect the reference and measurement beam, respectively, back to beam steering assembly 1520, which redirects the beams back to dichroic beam splitter 1956. Dichroic beam splitter 1956 then separates reference beam 1962 back into reference beams 1952a and 1952b having wavelengths $\lambda_1$ and $\lambda_2$, respectively, and separates reference beam 1964 back into measurement beams 1954a and 1954b having wavelengths $\lambda_1$ and $\lambda_2$, respectively. Reference and measurement beams 1952a and 1954a then propagate to polarizing beam splitter 1948a, where because they doubled pass quarter wave plate 1968a, polarizing beam splitter 1948a recombines them to form exit beam 1970a having wavelength $\lambda_1$. Similarly, reference and measurement beams 1952b and 1954b then propagate to polarizing beam splitter 1948b, where because they doubled pass quarter wave plate 1968b, polarizing beam splitter 1948b recombines them to form exit beam 1970b having wavelength $\lambda_2$. A portion of one of exit beams 1970a and 1970b is sent to a detector system (not shown) such as detector system 1544 to generate a control signal that causes beam steering assembly 1512 to redirect reference and measurement beams 1962 and 1964 in response to changes in the angular orientation of stage mirror 1534. The description of such a control system is identical that described previously with reference to the embodiment of FIG. 15a.

Exit beams 1970a and 1970b are indicative of changes in optical path length to stage mirror 1534 at wavelengths $\lambda_1$ and $\lambda_2$, respectively, from which dispersion along the measurement path to the stage mirror can be determined. In particular, a polarizer can be used to mix the reference and measurement beam components of each of the exit beams to produce signal beams 1917 and 1918, described above with reference to FIG. 19*a*.

The interferometry systems described above can be especially useful in lithography applications that fabricate large-scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997). Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

The interferometry systems described above are important components of the positioning mechanisms that control the position of the wafer and reticle, and register the reticle image on the wafer.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

The interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, the interferometry systems can be used to measure the position of any one component of the exposure system relative to any other component of the exposure system, in which the interferometry system is attached to, or supported by, one of the components and the measurement object is attached, or is supported by the other of the components.

Figure 14A:
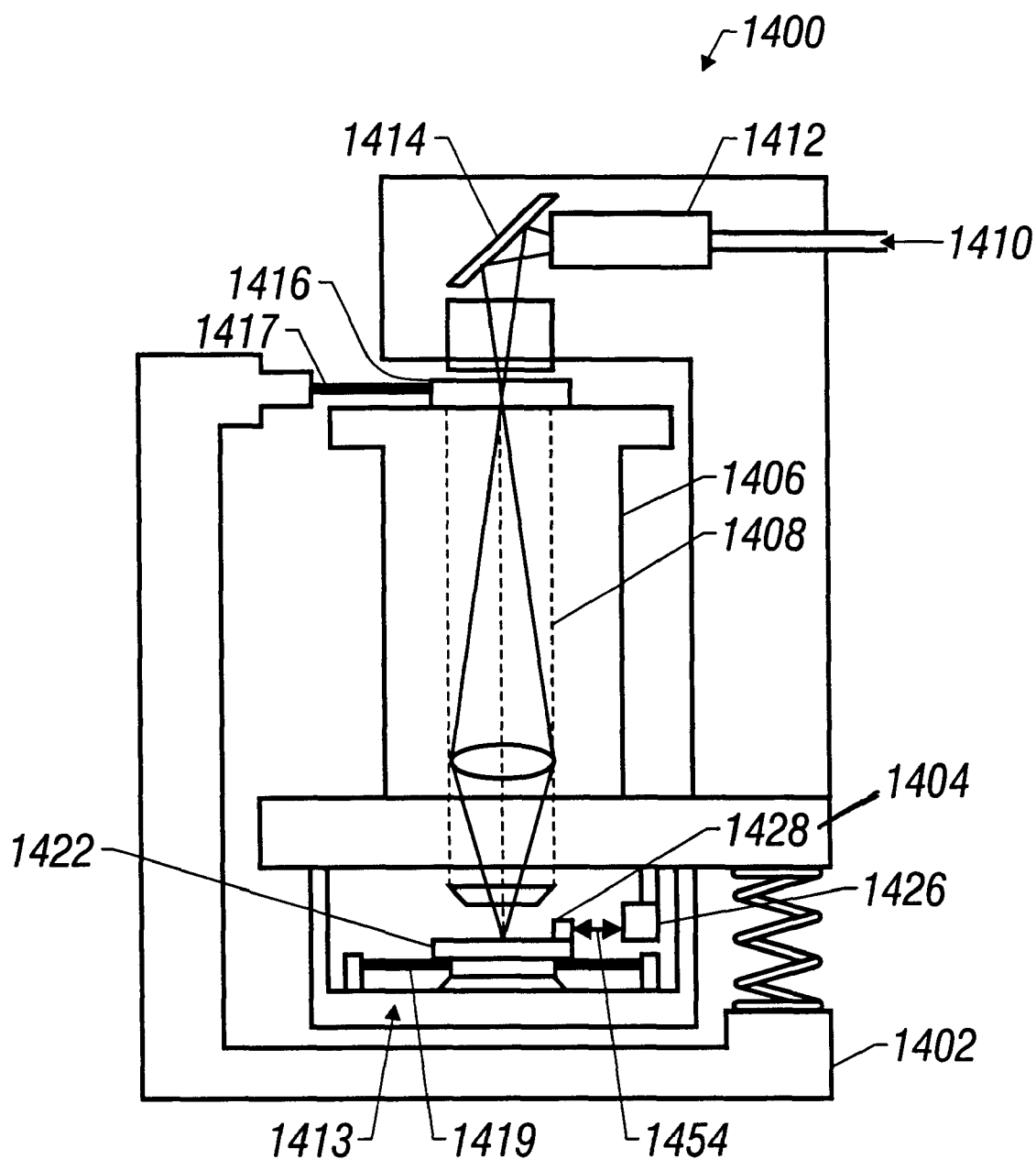
FIG. 14a–c relate to lithography and its application to manufacturing integrated circuits.

An example of a lithography scanner 1400 using an interferometry system 1426 is shown in FIG. 14*a*. The interferometry system is used to precisely measure the position of a wafer within an exposure system. Here, stage 1422 is used to position the wafer relative to an exposure station. Scanner 1400 comprises a frame 1402, which carries other support structures and various components carried on those structures. An exposure base 1404 has mounted on top of it a lens housing 1406 atop of which is mounted a reticle or mask stage 1416, which is used to support a reticle or mask. A positioning system for positioning the mask relative to the exposure station is indicated schematically by element 1417. Positioning system 1417 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1404 is a support base 1413 that carries wafer stage 1422. Stage 1422 includes a plane mirror 1428 for reflecting a measurement beam 1454 directed to the stage by interferometry system 1426. A positioning system for positioning stage 1422 relative to interferometry system 1426 is indicated schematically by element 1419. Positioning system 1419 can include, e.g., piezoelectric transducer elements and corresponding control electronics. The measurement beam reflects back to the interferometry system, which is mounted on exposure base 1404. The interferometry system can be any of the embodiments described previously.

During operation, a radiation beam 1410, e.g., an ultraviolet (UV) beam from a UV laser (not shown), passes through a beam shaping optics assembly 1412 and travels downward after reflecting from mirror 1414. Thereafter, the radiation beam passes through a mask (not shown) carried by mask stage 1416. The mask (not shown) is imaged onto a wafer (not shown) on wafer stage 1422 via a lens assembly 1408 carried in a lens housing 1406. Base 1404 and the various components supported by it are isolated from environmental vibrations by a damping system depicted by spring 1420.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In addition, the lithographic scanner can include a column reference in which interferometry system 1426 directs the reference beam to lens housing 1406 or some other structure that directs the radiation beam rather than a reference path internal to the interferometry system. The interference signal produce by interferometry system 1426 when combining measurement beam 1454 reflected from stage 1422 and the reference beam reflected from lens housing 1406 indicates changes in the position of the stage relative to the radiation beam. Furthermore, in other embodiments the interferometry system 1426 can be positioned to measure changes in the position of reticle (or mask) stage 1416 or other movable components of the scanner system. Also, in other embodiments, the positions of interferometry system 1426 and plane mirror 1428 can be reversed, with the interferometry system on the movable stage and the plane mirror fixed to support structure. Finally, the interferometry systems can be used in a similar fashion with lithography systems involving steppers, in addition to, or rather than, scanners.

Figure 14B:
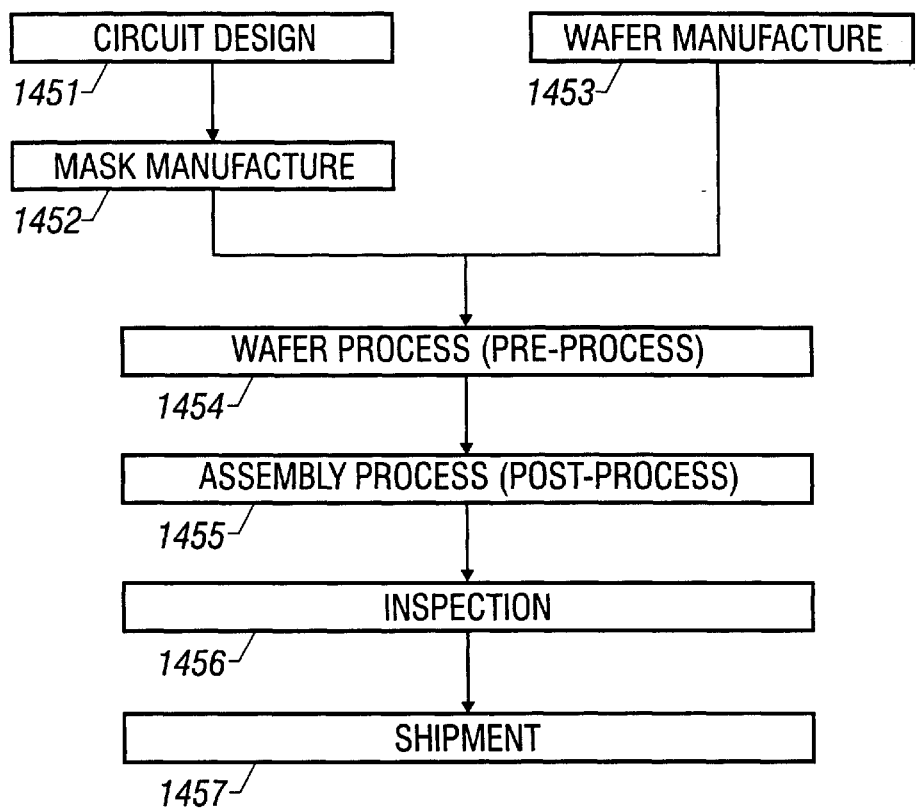

As is well known in the art, lithography is a critical part of manufacturing methods for making semiconducting devices. For example, U.S. Pat. No. 5,483,343 outlines steps for such manufacturing methods. These steps are described below with reference to FIGS. 14b and 14c. FIG. 14b is a flow chart of the sequence of manufacturing a semiconductor device such as a semiconductor chip (e.g. IC or LSI), a liquid crystal panel or a CCD. Step 1451 is a design process for designing the circuit of a semiconductor device. Step 1452 is a process for manufacturing a mask on the basis of the circuit pattern design. Step 1453 is a process for manufacturing a wafer by using a material such as silicon.

Step 1454 is a wafer process which is called a pre-process wherein, by using the so prepared mask and wafer, circuits are formed on the wafer through lithography. Step 1455 is an assembling step, which is called a post-process wherein the wafer processed by step 1454 is formed into semiconductor chips. This step includes assembling (dicing and bonding) and packaging (chip sealing). Step 1456 is an inspection step wherein operability check, durability check and so on of the semiconductor devices produced by step 1455 are carried out. With these processes, semiconductor devices are finished and they are shipped (step 1457).

Figure 14C:
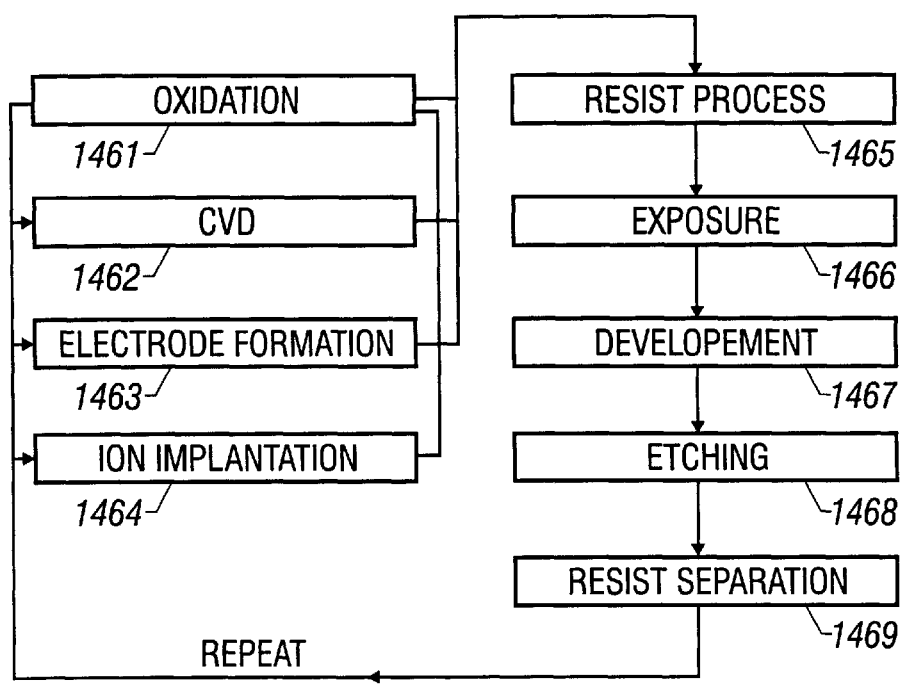

FIG. 14c is a flow chart showing details of the wafer process. Step 1461 is an oxidation process for oxidizing the surface of a wafer. Step 1462 is a CVD process for forming an insulating film on the wafer surface. Step 1463 is an electrode forming process for forming electrodes on the wafer by vapor deposition. Step 1464 is an ion implanting process for implanting ions to the wafer. Step 1465 is a resist process for applying a resist (photosensitive material) to the wafer. Step 1466 is an exposure process for printing, by exposure, the circuit pattern of the mask on the wafer through the exposure apparatus described above. Step 1467 is a developing process for developing the exposed wafer. Step 1468 is an etching process for removing portions other than the developed resist image. Step 1469 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 16:
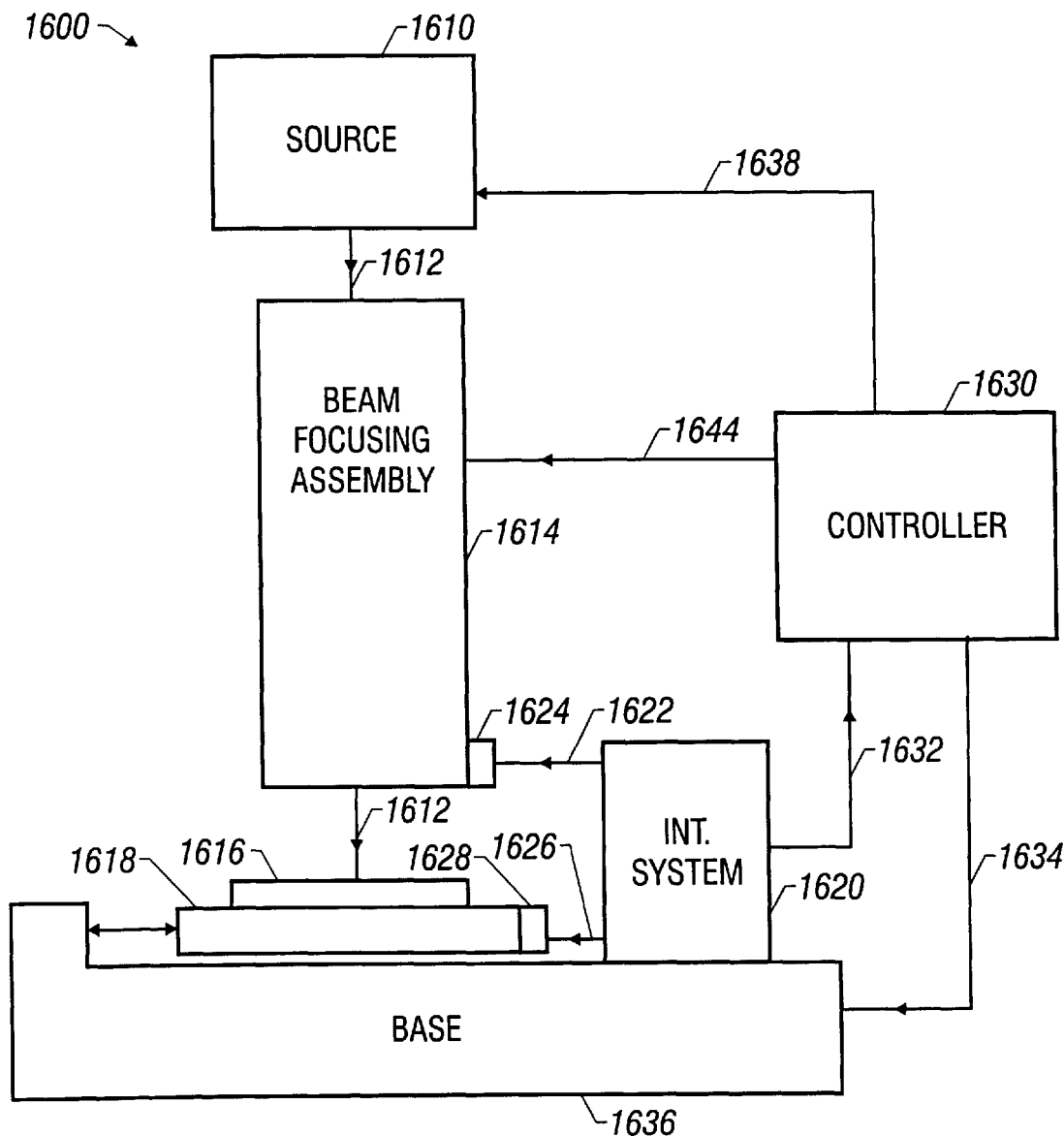
FIG. 16 is a schematic of a beam writing system employing the interferometry system.

As an example, a schematic of a beam writing system 1600 is shown in FIG. 16. A source 1610 generates a write beam 1612, and a beam focusing assembly 1614 directs the radiation beam to a substrate 1616 supported by a movable stage 1618. To determine the relative position of the stage, an interferometry system 1620 directs a reference beam 1622 to a mirror 1624 mounted on beam focusing assembly 1614 and a measurement beam 1626 to a mirror 1628 mounted on stage 1618. Interferometry system 1620 can be any of the interferometry systems described previously. Changes in the position measured by the interferometry system correspond to changes in the relative position of write beam 1612 on substrate 1616. Interferometry system 1620 sends a measurement signal 1632 to controller 1630 that is indicative of the relative position of write beam 1612 on substrate 1616. Controller 1630 sends an output signal 1634 to a base 1636 that supports and positions stage 1618. In addition, controller 1630 sends a signal 1638 to source 1610 to vary the intensity of, or block, write beam 1612 so that the write beam contacts the substrate with an intensity sufficient to cause photophysical or photochemical change only at selected positions of the substrate. Furthermore, in some embodiments, controller 1630 can cause beam focusing assembly 1614 to scan the write beam over a region of the substrate, e.g., using signal 1644. As a result, controller 1630 directs the other components of the system to pattern the substrate. The patterning is typically based on an electronic design pattern stored in the controller. In some applications the write beam patterns a resist coated on the susbstrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

It is understood that while the invention has been described in conjunction with the detailed description thereof, the foregoing description is intended to illustrate and not limit the scope of the invention, which is defined by the scope of the appended claims.

For example, although embodiments described above use heterodyne detection to determine changes in the optical path length difference between the reference and measurement paths, the interferometry systems can also use homodyne detection, in which the frequencies of the reference and measurement beams are the same. In such cases, a nonpolarizing beam splitter splits the output beam formed by the overlapping exit reference and measurement beams into two components, one of which passes through a quarter wave plate. Thereafter, each of the two components passes through a polarizer to produce a pair of mixed optical signals, which are measured by a pair of detectors, respectively. The electronic signals measured by the detectors are in phase quadrature with one another and can be processed by a computer to determine the changes in the optical path length difference using well-known homodyne processing techniques.

Furthermore, in other embodiments in which the reference beam reflects from a reference object, the interferometry system can include one or more additional beam steering assemblies (and corresponding controllers and detectors) that redirect the reference beam in response to changes in the angular orientation or position of the reference object.

Finally, in other embodiments the beam steering assembly can be different from a mirror oriented by a positioning system. For example, the beam steering assembly can include one or more of the following elements: an electro-optic or acousto-optic beam deflector, a pair of rotating optical wedges (Risely prisms), a variable wedge element, and any other such element that can alter the direction of a light beam.

Other aspects, advantages, and modifications are within the scope of the following claims.

What is claimed is:

1. An interferometry system comprising:
   an interferometer which during operation directs a measurement beam along a measurement path contacting a measurement object and combines at least a portion of the measurement beam with another beam to form an overlapping pair of exit beams, the interferometer comprising an optical element positioned to receive and direct at least one of the measurement beam and the other beam, a beam steering assembly having a beam steering element positioned to recieve and direct the measurement beam and the other beam, and a positioning system to orient the beam steering element relative to the optical element steering element positioned to direct the measurement beam, the measurement beam contacting; and
   a control circuit which during operation causes the positioning system to reorient the beam steering element in response to a change in at least one of angular orientation and position of the measurement object.

2. The interferometry system of claim 1, wherein during operation the interferometer directs the measurement beam to contact the measurement object an even number of times.

3. The interferometry system of claim 1, wherein during operation the control circuit causes the positioning system to reorient the beam steering element in response to a change in angular orientation of the measurement object.

4. A lithography system for fabricating integrated circuits comprising:
   first and second components, the first and second components being movable relative to one another; and
   the interferometry system of claim 1 secured to the second component, wherein the measurement object is a mirror rigidly secured to the first component and during operation the interferometry system measures the position of the first component relative to the second component.

5. The lithography system of claim 4, wherein one of the first and second components is a movable stage which during operation supports a wafer.

6. The lithography system of claim 4, wherein during operation the beam steering element causes the measurement beam to contact the mirror at substantially normal incidence over a range of angular orientations of the measurement object.

7. The lithography system of claim 4, wherein one of the first and second components is a reticle for filtering radiation used to illuminate a wafer.

8. The interferometry system of claim 1, wherein the during operation the interferometer directs the measurement beam to contact the measurement object only once.

9. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the inteferometry system of claim 1 for measuring the position of the stage relative to the beam directing assembly.

10. An interferometry system comprising:
    an interferometer which during operation directs a measurement beam along a measurement path contacting a measurement object and combines at least a portion of the measurement beam with another beam to form an overlapping pair of exit beams, the interferometer comprising a beam steering assembly having a beam steering element and a positioning system to orient the beam steering element the beam steering element positioned to direct the measurement beam, the measurement beam contacting the beam steering element;
    a control circuit which during operation causes the positioning system to reorient the beam steering element in response to a change in angular orientation of the measurement object; and
    a signal processor,
       wherein during operation the interferometer directs a second measurement beam along a second measurement path contacting the measurement object and combines at least a portion of the second measurement beam with an additional beam to form a second overlapping pair of exit beams,
       the measurement beams contacting the measurement object at separate locations, and
       wherein during operation the signal processor determines the change in angular orientation of the measurement object based on signals derived from the overlapping pairs of exit beams.

11. The interferometry system of claim 10, wherein the beam steering element is positioned to direct both of the measurement beams, both of the measurement beams contacting the beam steering element.

12. A lithography system for fabricating integrated circuits comprising:
    first and second components, the first and second components being movable relative to one another; and
    the interferometry system of claim 10 secured to the second component, wherein the measurement object is a mirror rigidly secured to the first component and during operation the interferometry system measures the position of the first component relative to the second component.

13. The lithography system of claim 12, wherein one of the first and second components is a movable stage which during operation supports a wafer.

14. The lithography system of claim 12, wherein one of the first and second components is a reticle for filtering radiation used to illuminate a wafer.

15. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the inteferometry system of claim 10 for measuring the position of the stage relative to the beam directing assembly.

16. An interferometry system comprising:
   an interferometer which during operation directs a measurement beam along a measurement path contacting a measurement object and combines at least a portion of the measurement beam with another beam to form an overlapping pair of exit beams, the interferometer comprising a beam steering assembly having a beam steering element and a positioning system to orient the beam steering element the beam steering element positioned to direct the measurement beam, the measurement beam contacting the beam steering element;
   a control circuit which during operation causes the positioning system to reorient the beam steering element in response to a change in at least one of angular orientation and position of the measurement object; and
   a signal processor,
      wherein the measurement beam includes components at two wavelengths, and during operation the interferometer produces the first mentioned overlapping pair of exit beams and a second overlapping pair of exit beams, the first pair of exit beams indicative of changes in optical path length to the measurement object at a first of the two wavelengths and the second pair of exit beams indicative of changes in optical path length to the measurement object at a second of the two wavelengths,
      wherein during operation the signal processor processes signals derived from the overlapping pairs of exit beams.

17. The interferometry system of claim 16, wherein during operation the signal processor calculates dispersion along the measurement path based on the signals.

18. The interferometry system of claim 16, wherein during operation the signal processor calculates changes in geometric distance to the measurement object based on the signals.

19. The interferometry system of claim 16, wherein the two wavelengths are harmonically related.

20. The interferometry system of claim 16, wherein the two wavelengths are separated by more than 1 nm.

21. The interferometry system of claim 16, wherein the during operation the control circuit causes the positioning system to reorient the beam steering element in response to a change in angular orientation of the measurement object.

22. A lithography system for fabricating integrated circuits comprising:

first and second components, the first and second components being movable relative to one another; and
the interferometry system of claim 16 secured to the second component, wherein the measurement object is a mirror rigidly secured to the first component and during operation the interferometry system measures the position of the first component relative to the second component.

23. The lithography system of claim 22, wherein one of the first and second components is a movable stage which during operation supports a wafer.

24. The lithography system of claim 22, wherein one of the first and second components is a reticle for filtering radiation used to illuminate a wafer.

25. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the inteferometry system of claim 16 for measuring the position of the stage relative to the beam directing assembly.

26. An interferometry system comprising:
   an interferometer which during operation directs a measurement beam along a measurement path contacting a measurement object and combines at least a portion of the measurement beam with another beam to form an overlapping pair of exit beams, the interferometer comprising a beam steering assembly having a beam steering element and a positioning system to orient the beam steering element the beam steering element positioned to direct the measurement beam, the measurement beam contacting the beam steering element;
   a control circuit which during operation causes the positioning system to reorient the beam steering element in response to a change in at least one of angular orientation and position of the measurement object; and
   a signal processor,
      wherein the measurement beam, the other beam, and the overlapping pair of exit beams each include components at the two wavelengths, the overlapping exit beams indicative of changes in optical path length to the measurement object at each of the two wavelengths, and
      wherein the signal processor processes signals derived from the overlapping pair of exit beams.

27. The interferometry system of claim 26, wherein during operation the signal processor calculates dispersion along the measurement path based on the signals.

28. The interferometry system of claim 26, wherein during operation the signal processor calculates changes in geometric distance to the measurement object based on the signals.

29. The interferometry system of claim 26, wherein the two wavelengths are harmonically related.

30. The interferometry system of claim 26, wherein the two wavelengths are separated by more than 1 nm.

31. The interferometry system of claim 26, wherein the during operation the control circuit causes the positioning system to reorient the beam steering element in response to a change in angular orientation of the measurement object.

32. A lithography system for fabricating integrated circuits comprising:

first and second components, the first and second components being movable relative to one another; and the interferometry system of claim 26 secured to the second component, wherein the measurement object is a mirror rigidly secured to the first component and during operation the interferometry system measures the position of the first component relative to the second component.

33. The lithography system of claim 32, wherein one of the first and second components is a movable stage which during operation supports a wafer.

34. The lithography system of claim 32, wherein one of the first and second components is a reticle for filtering radiation used to illuminate a wafer.

35. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the inteferometry system of claim 11 for measuring the position of the stage relative to the beam directing assembly.

36. An interferometry system comprising:

an interferometer which during operation receives an input beam, splits the input beam into a measurement beam and at least one other beam, directs the measurement beam along a measurement path contacting a measurement object, and combines at least a portion of the measurement beam with the other beam to form an overlapping pair of exit beams, a beam steering assembly having a beam steering element and a positioning system to orient the beam steering element, the beam steering element positioned to direct the input beam and the overlapping pair of exit beams, the input beam and the overlapping pair of exit beams contacting the beam steering element;

a control circuit which during operation causes the positioning system to reorient the beam steering element in response to a change in at least one of angular orientation and position of the measurement object.

37. The interferometry system of claim 36, wherein during operation the interferometer directs the measurement beam to contact the measurement object an even number of times.

38. The interferometry system of claim 36, wherein during operation the control circuit causes the positioning system to reorient the beam steering element in response to a change in angular orientation of the measurement object.

39. The interferometry system of claim 38, further comprising a signal processor, wherein during operation the interferometer directs a second measurement beam along a second measurement path contacting the measurement object and combines at least a portion of the second measurement beam with an additional beam to form a second overlapping pair of exit beams, the measurement beams contacting the measurement object at separate locations, and wherein during operation the signal processor determines the change in angular orientation of the measurement object based on signals derived from the overlapping pairs of exit beams.

40. The interferometry system of claim 39, wherein the beam steering element is positioned to direct the input beam and first and second overlapping pairs of exit beams, all of which contact the beam steering element.

41. The interferometry system of claim 36, further comprising a signal processor, wherein the measurement beam includes components at two wavelengths, and during operation the interferometer produces the first mentioned overlapping pair of exit beams and a second overlapping pair of exit beams, the first pair of exit beams indicative of changes in optical path length to the measurement object at a first of the two wavelengths and the second pair of exit beams indicative of changes in optical path length to the measurement object at a second of the two wavelengths, wherein during operation the signal processor processes signals derived from the overlapping pairs of exit beams.

42. The interferometry system of claim 41, wherein during operation the signal processor calculates dispersion along the measurement path based on the signals.

43. The interferometry system of claim 41, wherein during operation the signal processor calculates changes in geometric distance to the measurement object based on the signals.

44. The interferometry system of claim 41, wherein the two wavelengths are harmonically related.

45. The interferometry system of claim 41, wherein the two wavelengths are separated by more than 1 nm.

46. The interferometry system of claim 36, further comprising a signal processor, wherein the measurement beam, the other beam, and the overlapping pair of exit beams each include components at two wavelengths, the overlapping exit beams indicative of changes in optical path length to the measurement object at each of the two wavelengths, and wherein the signal processor processes signals derived from the overlapping pair of exit beams.

47. The interferometry system of claim 46, wherein during operation the signal processor calculates dispersion along the measurement path based on the signals.

48. The interferometry system of claim 46, wherein during operation the signal processor calculates changes in geometric distance to the measurement object based on the signals.

49. The interferometry system of claim 46, wherein the two wavelengths are harmonically related.

50. The interferometry system of claim 46, wherein the two wavelengths are separated by more than 1 nm.

51. A lithography system for fabricating integrated circuits comprising:

first and second components, the first and second components being movable relative to one another; and the interferometry system of claim 36 secured to the second component, wherein the measurement object is a mirror rigidly secured to the first component and during operation the interferometry system measures the position of the first component relative to the second component.

52. The lithography system of claim 51, wherein one of the first and second components is a movable stage which during operation supports a wafer.

53. The lithography system of claim 51, wherein during operation the beam steering element causes the measurement beam to contact the mirror at substantially normal incidence over a range of angular orientations of the measurement object.

54. The lithography system of claim 51, wherein one of the first and second components is a reticle for filtering radiation used to illuminate a wafer.

55. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the inteferometry system of claim 36 for measuring the position of the stage relative to the beam directing assembly.

56. An interferometry method comprising:
   directing a measurement beam along a measurement path contacting a measurement object;
   combining at least a portion of the measurement beam with another beam to form an overlapping pair of exit beams; and
   using an electronic control system to redirect the measurement beam in response to a change in angular orientation of the measurement object.

57. The method of claim 56 wherein the measurement path contacts the measurement object an even number of times.

58. A lithography method comprising:
   positioning a first component of a lithography system relative to a second component of a lithography system to expose a wafer to spatially patterned radiation; and
   measuring the position of the first component relative to the second component using the method of claim 56 wherein the first component includes the measurement object.

59. The lithography method of claim 58, wherein one of the first and second components is a movable stage which during operation supports a wafer.

60. The lithography method of claim 58, wherein one of the first and second components is a reticle for filtering radiation used to illuminate a wafer.

61. The interferometry system of claim 56, wherein the measurement path contacts the measurement object only once.

62. A beam writing method for use in fabricating a lithography mask, the method comprising:
   directing a write beam to a substrate to pattern the susbtrate;
   positioning the substrate relative to the write beam; and
   measuring the position of the substrate relative to the write beam using the interferometry method of claim 56.

63. An interferometry method comprising:
   directing a measurement beam along a measurement path contacting a measurement object;
   combining at least a portion of the measurement beam with another beam to form an overlapping pair of exit beams,
   using an electronic control system to redirect the measurement beam in response to a change in at least one of the angular orientation and position of the measurement object;
   directing a second measurement beam along a second measurement path contacting the measurement object;
   combining at least a portion of the second measurement beam with an additional beam to form a second overlapping pair of exit beams, the first and second pairs of exit beams indicative of changes in optical path length to two separate locations on the measurement object; and
   calculating the change in angular orientation of the measurement object based on signals derived from the overlapping pairs of exit beams.

64. A lithography method comprising:
   positioning a first component of a lithography system relative to a second component of a lithography system to expose a wafer to spatially patterned radiation; and
   measuring the position of the first component relative to the second component using the method of claim 63 wherein the first component includes the measurement object.

65. The lithography method of claim 64, wherein one of the first and second components is a movable stage which during operation supports a wafer.

66. The lithography method of claim 64, wherein one of the first and second components is a reticle for filtering radiation used to illuminate a wafer.

67. A beam writing method for use in fabricating a lithography mask, the method comprising:
   directing a write beam to a substrate to pattern the susbtrate;
   positioning the substrate relative to the write beam; and
   measuring the position of the substrate relative to the write beam using the interferometry method of claim 63.

68. An interferometry method comprising:
   directing a measurement beam having components at two wavelengths along a measurement path contacting a measurement object;
   calculating changes in geometric distance to the measurement object based on interferometric signals derived from the measurement beam; and
   using an electronic control system to redirect the measurement beam in response to a change in at least one of the angular orientation and position of the measurement object.

69. The method of claim 68, wherein the two wavelengths are harmonically related.

70. The method of claim 68, wherein the electronic control system redirects the measurement beam in response to a change in the angular orientation of the measurement object.

71. The method of claim 70, wherein the electronic control system redirects the measurement beam to contact the measurement object at substantially normal incidence over a range of angular orientations of the measurement object.

72. A lithography method comprising:
   positioning a first component of a lithography system relative to a second component of a lithography system to expose a wafer to spatially patterned radiation; and
   measuring the portion of the first component relative to the second component using the method of claim 68 wherein the first component includes the measurement object.

73. The lithography method of claim 72, wherein one of the first and second components is a movable stage which during operation supports a wafer.

74. The lithography method of claim 72, wherein one of the first and second components is a reticle for filtering radiation used to illuminate a wafer.

75. A beam writing method for use in fabricating a lithography mask, the method comprising:
   directing a write beam to a substrate to pattern the susbtrate;
   positioning the substrate relative to the write beam; and
   measuring the position of the substrate relative to the write beam using the interferometry method of claim 68.

76. An interferometry method comprising:
   directing a measurement beam having components at two wavelengths along a measurement path contacting a measurement object;
   calculating dispersion along the measurement path based on interferometric signals derived from the measurement beam; and
   using an electronic control system to redirect the measurement beam in response to a change in at least one of the angular orientation and position of the measurement object.

77. A lithography method comprising:
   positioning a first component of a lithography system relative to a second component of a lithography system to expose a wafer to spatially patterned radiation; and
   measuring the position of the first component relative to the second component using the method of claim 76 wherein the first component includes the measurement object.

78. The lithography method of claim 77, wherein one of the first and second components is a movable stage which during operation supports a wafer.

79. The lithography method of claim 77, wherein one of the first and second components is a reticle for filtering radiation used to illuminate a wafer.

80. A beam writing method for use in fabricating a lithography mask, the method comprising:
   directing a write beam to a substrate to pattern the susbtrate;
   positioning the substrate relative to the write beam; and
   measuring the position of the substrate relative to the write beam using the interferometry method of claim 76.

81. An interferometry system comprising:
   an interferometer which during operation directs a measurement beam along a measurement path contacting a measurement object and combines at least a portion of the measurement beam with another beam to form an overlapping pair of exit beams, the interferometer comprising a beam steering assembly having a beam steering element and a positioning system to orient the beam steering element, the beam steering element having opposite sides and a mirror on each of the opposite sides, the beam steering element positioned to receive and redirect the measurement beam; and
   a control circuit which during operation causes the positioning system to reorient the beam steering element in response to a change in at least one of angular orientation and position of the measurement object,
      wherein during operation the interferometer directs the measurement beam to contact one of the sides of the beam steering element before contacting the measurement object and the other of the sides after contacting the measurement object.

82. The interferometry system of claim 81, wherein during operation the control circuit causes the positioning system to reorient the beam steering element in response to a change in angular orientation of the measurement object.

83. A lithography system for fabricating integrated circuits comprising:
   first and second components, the first and second components being movable relative to one another; and
   the interferometry system of claim 81 secured to the second component, wherein the measurement object is a mirror rigidly secured to the first component and during operation the interferometry system measures the position of the first component relative to the second component.

84. The lithography system of claim 83, wherein one of the first and second components is a movable stage which during operation supports a wafer.

85. The lithography system of claim 83, wherein one of the first and second components is a reticle for filtering radiation used to illuminate a wafer.

86. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the inteferometry system of claim 81 for measuring the position of the stage relative to the beam directing assembly.

87. An interferometry system comprising:
   an interferometer which during operation directs a measurement beam along a measurement path contacting a measurement object and combines at least a portion of the measurement beam with another beam to form an overlapping pair of exit beams, the interferometer comprising a beam steering assembly having a beam steering element and a positioning system to orient the beam steering element, the beam steering element having opposite sides and a mirror on each of the opposite sides, the beam steering element positioned to receive and redirect the measurement beam; and
   a control circuit which during operation causes the positioning system to reorient the beam steering element in response to a change in at least one of angular orientation and position of the measurement object,
      wherein during operation the interferometer directs the measurement beam to contact one of the sides of the beam steering before contacting the measurement object and directs the at least a portion of the measurement beam to contact the other of the sides of the beam steering element.

88. The interferometry system of claim 87, wherein during operation the control circuit causes the positioning system to reorient the beam steering element in response to a change in angular orientation of the measurement object.

89. A lithography system for fabricating integrated circuits comprising:
   first and second components, the first and second components being movable relative to one another; and
   the interferometry system of claim 87 secured to the second component, wherein the measurement object is a mirror rigidly secured to the first component and during operation the interferometry system measures the position of the first component relative to the second component.

90. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the inteferometry system of claim 87 for measuring the position of the stage relative to the beam directing assembly.

91. A lithography method comprising:

positioning a first component of a lithography system relative to a second component of a lithography system to expose a wafer to spatially patterned radiation; and measuring the position of the first component relative to the second component using an interferometry method wherein the first component includes the measurement object, and wherein the interferometry method comprises (i) directing a measurement beam along a measurement path contacting a retroreflector on a measurement object, (ii) combining at least a portion of the measurement beam with another beam to form an overlapping pair of exit beams, and (iii) using an electronic control system to redirect the measurement beam in response to a change in position of the measurement object that causes a transverse displacement between the overlapping pair of exit beams.

92. The lithography method of claim 91, wherein one of the first and second components is a movable stage which during operation supports a wafer.

93. The lithography method of claim 91, wherein one of the first and second components is a reticle for filtering radiation used to illuminate a wafer.

94. A beam writing method for use in fabricating a lithography mask, the method comprising:

directing a write beam to a substrate to pattern the susbtrate;

positioning the substrate relative to the write beam; and measuring the position of the substrate relative to the write beam using an interferometry method comprising (i) directing a measurement beam along a measurement path contacting a retroreflector on a measurement object, (ii) combining at least a portion of the measurement beam with another beam to form an overlapping pair of exit beams, and (iii) using an electronic control system to redirect the measurement beam in response to a change in position of the measurement object that causes a transverse displacement between the overlapping pair of exit beams.

* * * * *

UNITED STATES PATENT AND TRADEMARK OFFICE
CERTIFICATE OF CORRECTION

PATENT NO.    : 6,313,918 B1
DATED         : November 6, 2001
INVENTOR(S)   : Henry A. Hill and Peter J. De Groot It is certified that error appears in the above-identified patent and that said Letters Patent is hereby corrected as shown below:

Column 75,
Lines 47-49, delete "steering element positioned to direct the measurement beam, the measurement beam contacting --.

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,313,918 B1
DATED        : November 6, 2001
INVENTOR(S)  : Henry A. Hill and Peter J. De Groot It is certified that error appears in the above-identified patent and that said Letters Patent is hereby corrected as shown below:

<u>Column 21,</u>
Line 3, replace "A" with -- $A$ --.

<u>Column 38,</u>
Line 54, replace "time." with -- time --.

<u>Column 41,</u>
Line 28, replace "6533" with -- 653B --.

<u>Column 47,</u>
Line 20, after "$y_2$" insert -- , --.
Line 46, replace "η" with -- $\gamma$ --.

<u>Column 58,</u>
Line 53, replace "beam" with -- Beam --.

<u>Column 67,</u>
Lines 24, 26, 31, 38 and 59, replace "ϕ" with -- φ --.
Line 42, replace "Ω" with -- φ --.

<u>Column 68,</u>
Lines 3 and 17, replace "ϕ" with -- φ --. (both occurrrences).
Lines 4, 6, 20 and 34, replace "ϕ" with -- φ --.
Lines 25 and 34, replace "θ" with -- ϑ --.
Lines 57 and 60, replace "Q" with -- $Q$ --.

<u>Column 69,</u>
Line 8, replace "λ" with -- $\lambda_1$ --
Line 11, replace "ϕ" with -- φ --.
Lines 11 and 32, replace "θ" with -- ϑ --.
Line 38, replace "$\epsilon$" with -- ε --.

UNITED STATES PATENT AND TRADEMARK OFFICE
CERTIFICATE OF CORRECTION

PATENT NO.    : 6,313,918 B1
DATED         : November 6, 2001
INVENTOR(S)   : Henry A. Hill and Peter J. De Groot It is certified that error appears in the above-identified patent and that said Letters Patent is hereby corrected as shown below:

<u>Column 75,</u>
Line 44, replace "recieve" with -- receive --.

<u>Column 82,</u>
Line 61, replace "portion" with -- position --.

Signed and Sealed this

Twentieth Day of May, 2003

JAMES E. ROGAN
*Director of the United States Patent and Trademark Office*